US011374178B2

(12) United States Patent
Sagara et al.

(10) Patent No.: US 11,374,178 B2
(45) Date of Patent: Jun. 28, 2022

(54) ORGANIC ELECTROLUMINESCENT ELEMENT

(71) Applicant: NIPPON STEEL CHEMICAL & MATERIAL CO., LTD., Tokyo (JP)

(72) Inventors: Yuta Sagara, Tokyo (JP); Masashi Tada, Tokyo (JP); Kazuaki Yoshimura, Tokyo (JP); Junya Ogawa, Tokyo (JP); Katsuhide Noguchi, Tokyo (JP)

(73) Assignee: NIPPON STEEL CHEMICAL & MATERIAL CO., LTD., Tokyo (JP)

( * ) Notice: Subject to any disclaimer, the term of this patent is extended or adjusted under 35 U.S.C. 154(b) by 405 days.

(21) Appl. No.: 16/490,725

(22) PCT Filed: Feb. 20, 2018

(86) PCT No.: PCT/JP2018/005922
§ 371 (c)(1),
(2) Date: Sep. 3, 2019

(87) PCT Pub. No.: WO2018/173593
PCT Pub. Date: Sep. 27, 2018

(65) Prior Publication Data
US 2020/0006672 A1 Jan. 2, 2020

(30) Foreign Application Priority Data
Mar. 23, 2017 (JP) .............................. JP2017-057487

(51) Int. Cl.
H01L 51/00 (2006.01)
H01L 51/52 (2006.01)
H01L 51/50 (2006.01)

(52) U.S. Cl.
CPC ...... *H01L 51/0072* (2013.01); *H01L 51/0054* (2013.01); *H01L 51/0067* (2013.01);
(Continued)

(58) Field of Classification Search
None
See application file for complete search history.

(56) References Cited

U.S. PATENT DOCUMENTS 10,297,764 B2 * 5/2019 Ihn ...................... H01L 51/0055
2009/0134784 A1   5/2009 Lin et al.
(Continued)

FOREIGN PATENT DOCUMENTS

EP   2 821 459 A2   1/2015
EP   2 933 851 A1   10/2015
(Continued)

OTHER PUBLICATIONS

Extended European Search Report for European Application No. 18772062.8, dated Dec. 22. 2020.
(Continued)

*Primary Examiner* — Robert S Loewe
(74) *Attorney, Agent, or Firm* — Birch, Stewart, Kolasch & Birch, LLP

(57) ABSTRACT

Provided is a thermally activated delayed fluorescence-emitting organic EL element having a low driving voltage, high luminous efficiency, and a prolonged lifespan. The organic EL element contains one or more light-emitting layers between an anode and a cathode that face each other, and at least one light-emitting layer contains a host material composed of a carbazole compound represented by formula (1) and a thermally activated delayed fluorescence material composed of an indolocarbazole compound containing an indolocarbazole ring in its molecule. Here, $L^1$ represents an aromatic group, and at least one $R^1$ represents a carbazolyl group, and n is 1 or 2.

(Continued)

[C1]

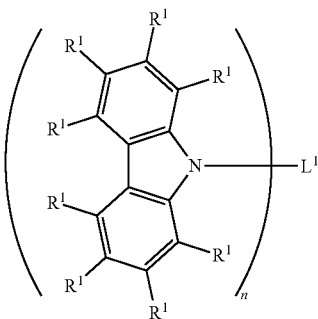

(1)

8 Claims, 1 Drawing Sheet

(52) U.S. Cl.
CPC ...... *H01L 51/5016* (2013.01); *H01L 51/5206* (2013.01); *H01L 51/5221* (2013.01)

(56) References Cited

U.S. PATENT DOCUMENTS

| 2010/0295444 | A1 | 11/2010 | Kuma et al. | |
|---|---|---|---|---|
| 2012/0205636 | A1* | 8/2012 | Kim | C09K 11/06 257/40 |
| 2013/0248845 | A1 | 9/2013 | Ogawa et al. | |
| 2014/0151647 | A1 | 6/2014 | Mizuki et al. | |
| 2014/0158992 | A1* | 6/2014 | Xia | C07D 403/10 257/40 |
| 2014/0299865 | A1 | 10/2014 | Nishimura et al. | |
| 2015/0166886 | A1 | 6/2015 | Endo et al. | |
| 2016/0087224 | A1* | 3/2016 | Kim | H01L 51/0072 257/40 |
| 2016/0087227 | A1* | 3/2016 | Kim | H01L 51/0073 257/40 |
| 2016/0111663 | A1* | 4/2016 | Kim | H01L 51/0058 257/40 |
| 2016/0190451 | A1* | 6/2016 | Ogawa | H01L 51/008 257/40 |
| 2016/0260905 | A1 | 9/2016 | Lee et al. | |
| 2016/0268516 | A1 | 9/2016 | Tanaka et al. | |
| 2016/0315262 | A1* | 10/2016 | Ogawa | C07D 409/04 |
| 2017/0098778 | A1* | 4/2017 | Oh | C07D 487/04 |
| 2017/0263869 | A1* | 9/2017 | Tada | C09K 11/06 |
| 2017/0352816 | A1* | 12/2017 | Jeon | H01L 51/0067 |
| 2018/0138420 | A1 | 5/2018 | Tada et al. | |
| 2018/0277766 | A1* | 9/2018 | Mukhopadhyay | H01L 51/5028 |
| 2018/0351109 | A1 | 12/2018 | Tada et al. | |
| 2018/0366656 | A1 | 12/2018 | Tada et al. | |

FOREIGN PATENT DOCUMENTS

| EP | 3 522 246 A1 | 8/2019 |
|---|---|---|
| JP | 2011-509247 A | 3/2011 |
| WO | WO 2010/134350 A1 | 11/2010 |
| WO | WO 2011/070963 A1 | 6/2011 |
| WO | WO 2012/077520 A1 | 6/2012 |
| WO | WO 2015/022987 A1 | 2/2015 |
| WO | WO 2015/156587 A1 | 10/2015 |
| WO | WO 2016/194604 A1 | 12/2016 |
| WO | WO 2017/115589 A1 | 7/2017 |
| WO | WO 2017/115596 A1 | 7/2017 |

OTHER PUBLICATIONS

English translation of the International Search Report, dated May 22, 2018, for International Application No. PCT/JP2018/005922.
International Preliminary Report on Patentability and English translation of the Written Opinion of the International Searching Authority, dated Oct. 2019, for International Application No. PCT/JP2018/005922.
Sato et al. "Organic Luminescent Molecule with Energetically Equivalent Singlet and Triplet Excited States for Organic Light-Emitting Diodes," Physical Review Letters, vol. 110, Jun. 14, 2013, pp. 247401-1 to 247401-5.

* cited by examiner

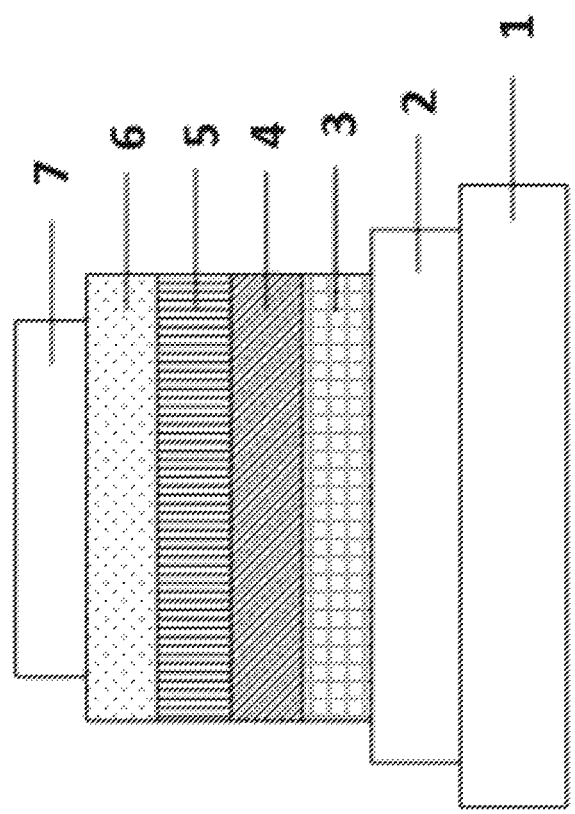

ORGANIC ELECTROLUMINESCENT ELEMENT

TECHNICAL FIELD

The present invention relates to a delayed fluorescence-emitting organic electroluminescent element (referred to as an organic EL element).

When a voltage is applied to an organic EL element, holes are injected from an anode and electrons are injected from a cathode to a light-emitting layer. Thus, in the light-emitting layer, injected holes and electrons recombine to generate excitons. In this case, according to statistical rules of electron spins, singlet excitons and triplet excitons are generated at a ratio of 1:3. It is said that the internal quantum efficiency of a fluorescence-emitting organic EL element using light emission from singlet excitons is limited to 25%. Meanwhile, it has been known that, in a phosphorescent organic EL element using light emission from triplet excitons, when intersystem crossing is efficiently performed from singlet excitons, the internal quantum efficiency is raised to 100%.

In recent years, the technology for prolonging the lifespan of phosphorescent organic EL elements has been developed and is being applied to displays of mobile phones, and the like. However, regarding blue organic EL elements, practical phosphorescent organic EL elements have not been developed, and the development of blue organic EL elements having high efficiency and a prolonged lifespan is required.

In addition, recently, delayed fluorescence-emitting organic EL elements using delayed fluorescence and having high efficiency have been developed. For example, PTL 1 discloses an organic EL element using a triplet-triplet fusion (TTF) mechanism which is one of delayed fluorescence mechanisms. The TTF mechanism utilizes a phenomenon in which singlet excitons are generated due to collision of two triplet excitons, and it is thought that the internal quantum efficiency can theoretically be raised to 40%. However, since the efficiency is lower compared to phosphorescent organic EL elements, further improvement in efficiency is required.

PTL 2 discloses a delayed fluorescence-emitting organic EL element using a thermally activated delayed fluorescence (TADF) mechanism. The TADF mechanism utilizes a phenomenon in which reverse intersystem crossing from triplet excitons to singlet excitons is generated in a material having a small energy difference between a singlet level and a triplet level, and it is thought that the internal quantum efficiency can theoretically be raised to 100%. However, further improvement in lifespan characteristics is required as in the case of phosphorescent elements.

CITATION LIST

Patent Literature

[PTL 1] WO 2010/134350 A1
[PTL 2] WO 2011/070963 A1
[PTL 3] WO 2015/022987 A1

Non Patent Literature

[NPL 1] Phys. Rev. Lett. 2013, 110, 247401

PTL 2 and NPL 1 disclose the use of indolocarbazole compounds as a TADF material.

PTL 3 discloses a delayed fluorescence-emitting organic EL element using a compound in which the following carbazole is linked as a host and using a cyanobenzene compound as a light-emitting material.

[C1]

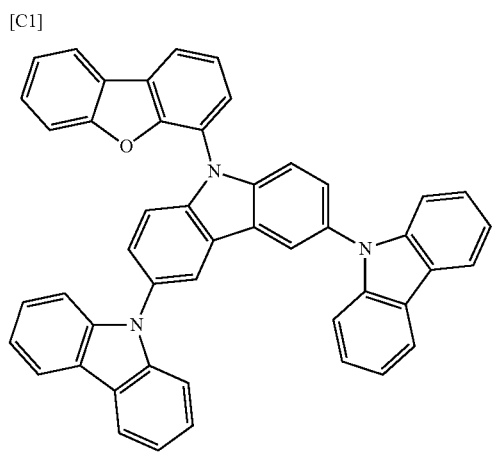

However, none of these can be said to be sufficient, and further improvement in characteristics is required.

SUMMARY OF INVENTION

In order to apply an organic EL element to a display element such as a flat panel display or a light source, it is necessary to improve the luminous efficiency of the element and to sufficiently secure stability during driving at the same time. The present invention has been made in view of the above circumstances, and an object of the present invention is to provide an organic EL element having high efficiency and high driving stability despite having a low driving voltage.

The present invention provides an organic EL element, including an anode, a cathode, the anode and the cathode facing each other, and one or more light-emitting layers disposed between the anode and the cathode, wherein at least one light-emitting layer contains a host material represented by formula (1) and a thermally activated delayed fluorescence material represented by formula (2).

[C2]

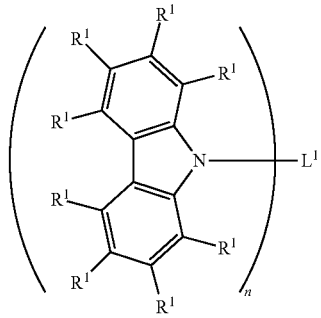

(1)

In the formula, $L^1$ represents an n-valent group. $L^1$ represents a substituted or unsubstituted aromatic hydrocarbon group having 6 to 30 carbon atoms, a substituted or unsubstituted aromatic heterocyclic group having 3 to 36 carbon atoms, a substituted or unsubstituted carborane group, or a linked ring group formed by linking any 2 to 6 rings selected from among rings of such an aromatic hydrocarbon group, aromatic heterocyclic group, and carborane group. In the case where $L^1$ represents the linked ring group, rings to be linked may be the same as or different from each other. R¹'s each independently represent a hydrogen atom, an aliphatic hydrocarbon group having 1 to 8 carbon atoms, a substituted or unsubstituted aromatic hydrocarbon group having 6 to 30 carbon atoms, a substituted or unsubstituted aromatic heterocyclic group having 3 to 36 carbon atoms, a substituted or unsubstituted carborane group, or a linked ring group formed by linking any 2 or 3 rings selected from among rings of such an aromatic hydrocarbon group, aromatic heterocyclic group, and carborane group, and at least one R¹ is a substituted or unsubstituted carbazolyl group. n is an integer of 1 to 2.

[C3]

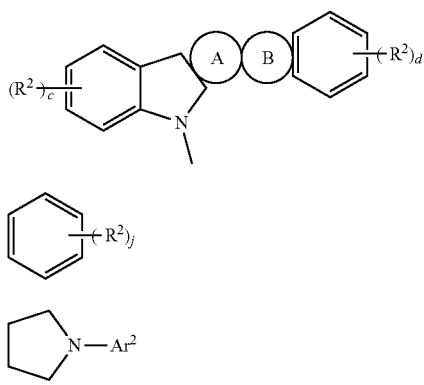

Here, Z is a group represented by formula (2a), and in formula (2a), the ring A is an aromatic hydrocarbon ring represented by formula (2b), the ring B is a heterocycle represented by formula (2c), and the ring A and the ring B are each fused to an adjacent ring at any position. L² represents an aromatic hydrocarbon group having 6 to 30 carbon atoms, or an aromatic heterocyclic group having 3 to 18 carbon atoms. Ar¹ and Ar² each independently represent a substituted or unsubstituted aromatic hydrocarbon group having 6 to 30 carbon atoms, a substituted or unsubstituted aromatic heterocyclic group having 3 to 18 carbon atoms, or a linked aromatic group formed by linking 2 to 6 aromatic rings of aromatic groups selected from among aromatic hydrocarbon groups and aromatic heterocyclic groups, and in the case of the linked aromatic group, aromatic rings which are linked may be the same as or different from each other. R²'s independently represent an aliphatic hydrocarbon group having 1 to 10 carbon atoms, a substituted or unsubstituted aromatic hydrocarbon group having 6 to 18 carbon atoms, a substituted or unsubstituted aromatic heterocyclic group having 3 to 18 carbon atoms, or a linked aromatic group formed by linking 2 or 3 aromatic rings from aromatic groups selected from among the aromatic hydrocarbon group and the aromatic heterocyclic group. a represents an integer of 1 to 3, b represents an integer of 0 to 3, c and d independently represent an integer of 0 to 4, and j represents an integer of 0 to 2. When a+b is 2, L² may be a single bond.

Preferable embodiments of the above formula (1) and formula (2) are shown below.

1) In formula (1), n=1.2) In formula (1), L¹ represents substituted or unsubstituted benzene, triazine, carbazole, dibenzofuran, dibenzothiophene, carborane, or an aromatic hydrocarbon group, an aromatic heterocyclic group, a carborane group, or a linked ring group generated from a linked ring compound in which 2 or 3 of these are linked. 3) formula (1) is the following formula (3a) or (3b).

[C4]

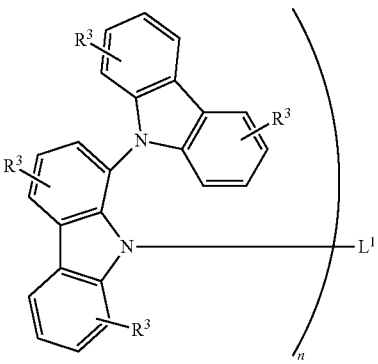

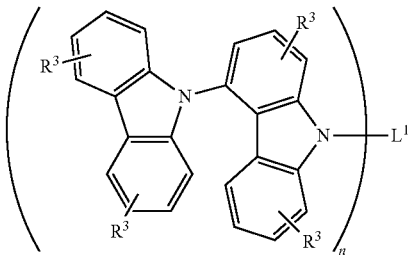

in the formulae, L¹ and n are the same as L¹ and n in formula (1), R³ represents a hydrogen atom, a substituted or unsubstituted aromatic hydrocarbon group having 6 to 18 carbon atoms, or a substituted or unsubstituted aromatic heterocyclic group having 3 to 18 carbon atoms.

4) In L² in formula (2), an (a+b)-valent L² is an aromatic hydrocarbon group having 6 carbon atoms.

Among the light-emitting layers, two or more kinds of host materials each represented by formula (1) can be contained.

In addition, it is desirable that a difference between an excited singlet energy (S1) and an excited triplet energy (T1) of the thermally activated delayed fluorescence material is 0.2 eV or less, and the excited triplet energy (T1) of the host material be larger than the excited singlet energy (S1) and the excited triplet energy (T1) of the thermally activated delayed fluorescence material.

Since the organic EL element of the present invention contains a specific thermally activated delayed fluorescence material and a specific host material in a light-emitting layer, the organic EL element can have high luminous efficiency and a prolonged lifespan with a low driving voltage.

BRIEF DESCRIPTION OF DRAWINGS

FIG. 1 is a cross-sectional view schematically showing an example of an organic EL element.

DESCRIPTION OF EMBODIMENTS

An organic EL element of the present invention has one or more light-emitting layers between an anode and a cathode that face each other, and at least one layer among the light-emitting layers contains a host material represented by the above formula (1) and a thermally activated delayed fluorescence material (referred to as a TADF material) represented by the above formula (2).

The above formula (1) will be described.

Since the compound represented by formula (1) has two or more carbazole rings, it can be called a carbazole compound. $L^1$ represents an n-valent group.

$L^1$ represents a substituted or unsubstituted aromatic hydrocarbon group having 6 to 30 carbon atoms, a substituted or unsubstituted aromatic heterocyclic group having 3 to 36 carbon atoms, a substituted or unsubstituted carborane group, or a linked ring group in which 2 to 6 of these rings are linked. Preferable examples thereof include a substituted or unsubstituted monocyclic aromatic hydrocarbon group, a substituted or unsubstituted aromatic heterocyclic group having 3 to 12 carbon atoms, a substituted or unsubstituted carborane group, and a linked ring group in which 2 or 3 of these rings are linked. More preferable examples thereof include a substituted or unsubstituted monocyclic aromatic hydrocarbon group, a substituted or unsubstituted aromatic heterocyclic group having 3 to 12 carbon atoms, a substituted or unsubstituted carborane group, and a linked ring group formed by linking 2 of these rings.

The linked ring group herein refers to a group formed by linking a plurality of rings (an aromatic hydrocarbon ring, an aromatic heterocycle or a carborane ring) serving as a framework of a group selected from among an aromatic hydrocarbon group, an aromatic heterocyclic group, and a carborane group by direct bonding. Here, the rings to be linked may be the same as or different from each other, and the structure thereof may be a linear structure shown in formula (d) or a branched structure shown in formula (e).

$$A1-A2-A3-A4 \quad (d)$$

$$A1(A2)-A3(A4) \quad (e)$$

The formulae (d) and (e) are linked ring compounds in which 4 rings are linked, and in the case of an n-valent group, they are understood as groups obtained by removing n hydrogen atoms therefrom. A ring in which a hydrogen atom is removed may be any of A1, A2, A3, and A4. In addition, A1, A2, A3, and A4 independently represent an aromatic hydrocarbon ring, an aromatic heterocycle, or a carborane ring, and may be composed of only one, or two or more thereof. The linked ring group can have a substituent, which is understood as a substituent that a corresponding aromatic hydrocarbon group, aromatic heterocyclic group, and carborane group may have.

The unsubstituted carborane group is a divalent group selected from the following formulae (4a), (4b), and (4c) of $C_2B_{10}H_{10}$.

[C5]

(4a)

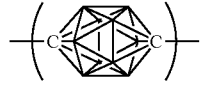
(4b)

(4c)

Specific examples of $L^1$ include benzene, naphthalene, azulene, anthracene, phenanthrene, pyrene, chrysene, naphthacene, triphenylene, acenaphthene, coronene, indene, fluorene, fluoranthene, tetracene, pentacene, furan, dibenzofuran, thiophene, dibenzothiophene, oxazole, pyrrole, pyridine, pyridazine, pyrimidine, pyrazine, triazine, benzimidazole, oxadiazole, triazole, imidazole, pyrazole, thiazole, indole, indazole, benzimidazole, benzothiazole, benzoxazole, quinoxaline, quinazoline, cinnoline, quinoline, isoquinoline, phthalazine, naphthyridine, carbazole, carboline, diazacarbazole, carborane, and a group obtained by removing n hydrogen atoms from a linked ring compound in which 2 or 3 of these are linked. Preferable examples thereof include benzene, dibenzofuran, dibenzothiophene, pyridine, pyrimidine, triazine, carbazole, carborane, and a group obtained by removing n hydrogen atoms from a linked ring compound in which 2 or 3 of these are linked. More preferable examples thereof include benzene, triazine, dibenzofuran, dibenzothiophene, carbazole, carborane, and a group obtained by removing n hydrogen atoms from a linked ring compound in which 2 of these are linked.

The aromatic hydrocarbon group, aromatic heterocyclic group, carborane group, and linked ring group may have a substituent. Specific examples for the substituents for $L^1$ include an aliphatic hydrocarbon group having 1 to 8 carbon atoms and an alkoxy group having 1 to 8 carbon atoms.

Specific examples of the aliphatic hydrocarbon group having 1 to 8 carbon atoms include a methyl group, an ethyl group, a propyl group, a butyl group, a pentyl group, a hexyl group, a heptyl group, and an octyl group.

The alkoxy group having 1 to 8 carbon atoms is represented as —OY, and examples of Y include the above alkyl groups. Specific examples thereof include a methoxy group and an ethoxy group.

$R^1$'s independently represent a hydrogen atom, an aliphatic hydrocarbon group having 1 to 8 carbon atoms, a substituted or unsubstituted aromatic hydrocarbon group having 6 to 30 carbon atoms, a substituted or unsubstituted aromatic heterocyclic group having 3 to 36 carbon atoms, a substituted or unsubstituted carborane group, and a linked ring group formed by linking 2 or 3 of these rings. Preferable examples thereof include a hydrogen atom, a substituted or unsubstituted aromatic hydrocarbon group having 6 to 20 carbon atoms, a substituted or unsubstituted aromatic heterocyclic group having 3 to 20 carbon atoms, a substituted or unsubstituted carborane group, and a linked ring group formed by linking 2 of these. More preferable examples thereof include a hydrogen atom, a substituted or unsubstituted aromatic hydrocarbon group having 6 to 10 carbon atoms, a substituted or unsubstituted aromatic heterocyclic group having 3 to 12 carbon atoms, a substituted or unsubstituted carborane group, and a linked ring group formed by linking 2 of these rings. At least one of $R^1$'s, preferably 1 to 4 of $R^1$'s, and more preferably, 1 to 2 of $R^1$'s each represent a substituted or unsubstituted carbazolyl group. In the case where $R^1$ is the substituted carbazolyl group, the substituent may be the same substituents when $R^1$ has a substituent, which will be described below, and may be an aromatic hydrocarbon group or an aromatic heterocyclic group in addition to an alkyl group and the like.

Specific examples of the aliphatic hydrocarbon group having 1 to 8 carbon atoms include a methyl group, an ethyl group, a propyl group, a butyl group, a pentyl group, a hexyl group, a heptyl group, and an octyl group.

Specific examples of the aromatic hydrocarbon group having 6 to 30 carbon atoms, the aromatic heterocyclic group having 3 to 36 carbon atoms and the linked ring group include benzene, naphthalene, azulene, anthracene, phenanthrene, pyrene, chrysene, naphthacene, triphenylene, acenaphthene, coronene, indene, fluorene, fluoranthene, tetracene, pentacene, furan, dibenzofuran, thiophene, dibenzothiophene, oxazole, pyrrole, pyridine, pyridazine, pyrimidine, pyrazine, triazine, benzimidazole, oxadiazole, triazole, imidazole, pyrazole, thiazole, indole, indazole, benzimidazole, benzothiazole, benzoxazole, quinoxaline, quinazoline, cinnoline, quinoline, isoquinoline, phthalazine, naphthyridine, carbazole, carboline, diazacarbazole, carborane, and a group obtained by removing one hydrogen atom from a linked ring compound in which 2 or 3 of these are linked. Preferable examples thereof include benzene, naphthalene, phenanthrene, triphenylene, fluorene, dibenzofuran, dibenzothiophene, pyridine, pyridazine, pyrimidine, pyrazine, triazine, quinazoline, quinoline, carbazole, diazacarbazole, carborane, and a group obtained by removing one hydrogen atom from a linked ring compound in which 2 of these are linked. More preferable examples thereof include benzene, pyridine, pyrimidine, triazine, carborane, carbazole, and a group obtained by removing one hydrogen atom from a linked ring compound in which 2 of these are linked.

When $R^1$ is an aromatic hydrocarbon group, an aromatic heterocyclic group, or a linked ring group, it can have a substituent.

When $R^1$ has a substituent, examples of the substituent include an aliphatic hydrocarbon group having 1 to 8 carbon atoms, an alkoxy group having 1 to 8 carbon atoms, an aromatic hydrocarbon group having 6 to 18 carbon atoms, and an aromatic heterocyclic group having 3 to 18 carbon atoms. Preferable examples thereof include an aromatic hydrocarbon group having 6 to 12 carbon atoms, and an aromatic heterocyclic group having 3 to 12 carbon atoms.

Specific examples of the aliphatic hydrocarbon group having 1 to 8 carbon atoms and the alkoxy group having 1 to 8 carbon atoms are the same as specific examples for the substituents for $L^1$.

Specific examples of the aromatic hydrocarbon group having 6 to 18 carbon atoms and the aromatic heterocyclic group having 3 to 18 carbon atoms include those obtained by removing one hydrogen atom from benzene, naphthalene, anthracene, phenanthrene, pyrene, chrysene, triphenylene, fluorene, fluoranthene, dibenzofuran, thiophene, dibenzothiophene, oxazole, pyrrole, pyridine, pyridazine, pyrimidine, pyrazine, triazine, indole, quinoline, carbazole, diazacarbazole, or the like. Preferable examples thereof include groups obtained by removing one hydrogen atom from benzene, dibenzofuran, dibenzothiophene, carbazole, or the like. More preferable examples thereof include a phenyl group and a carbazolyl group.

Specific examples of the carborane group are the same as specific examples in the above $L^1$.

In formula (1), n is an integer of 1 to 2, and preferably n=1.

Some or all of hydrogen atoms in the compound represented by formula (1) may be substituted with deuterium.

Preferable embodiments of formula (1) include the above formulae (3a) and (3b). In formulae (3a) and (3b), symbols the same as those in formula (1) have the same meanings as in formula (1). $R^3$'s independently represent a hydrogen atom, a substituted or unsubstituted aromatic hydrocarbon group having 6 to 30 carbon atoms, or a substituted or unsubstituted aromatic heterocyclic group having 3 to 18 carbon atoms.

Specific examples of the compound represented by formula (1) are shown below. However, the present invention is not limited to these exemplified compounds.

[6]

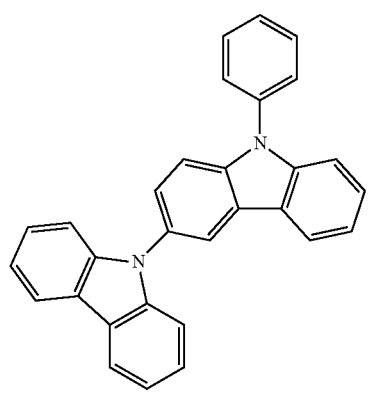

1-1

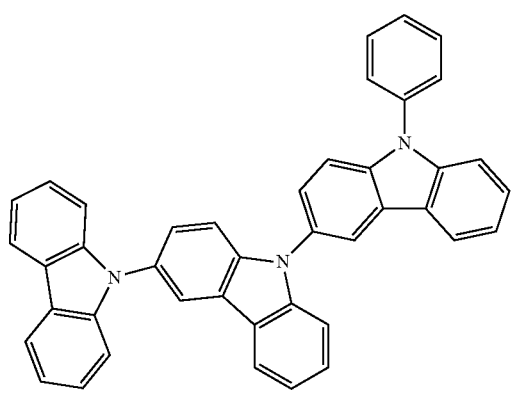

1-2

-continued
1-3
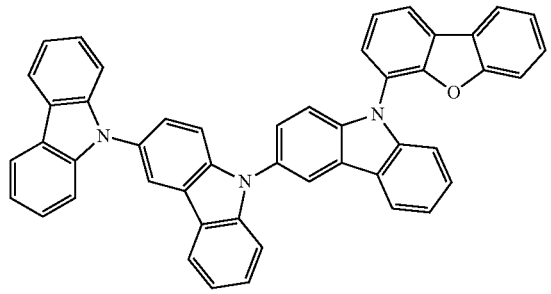
1-4
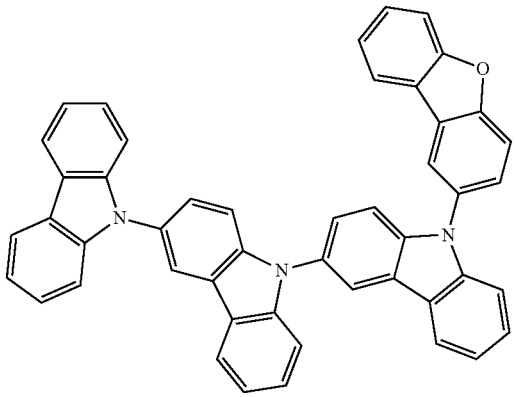
1-5
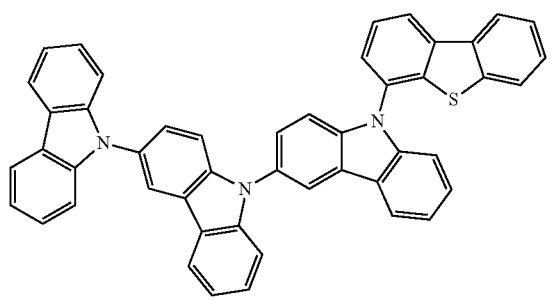
1-6
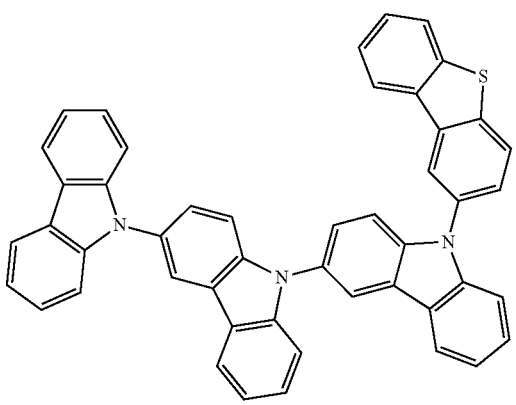
1-7
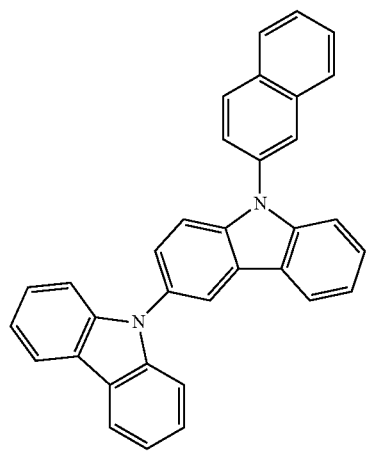
1-8
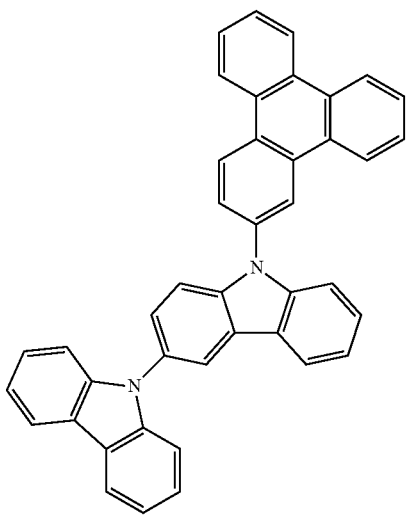

[C7]
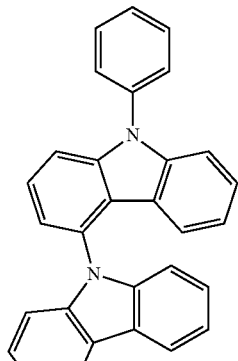
1-9
1-10
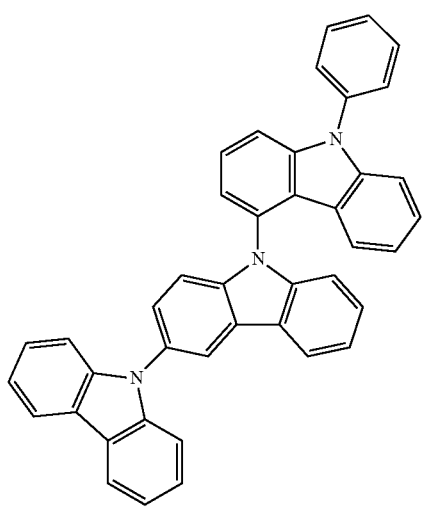
1-11
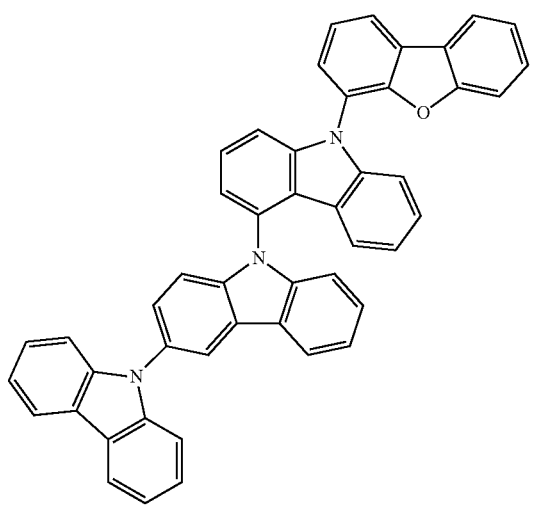
1-12
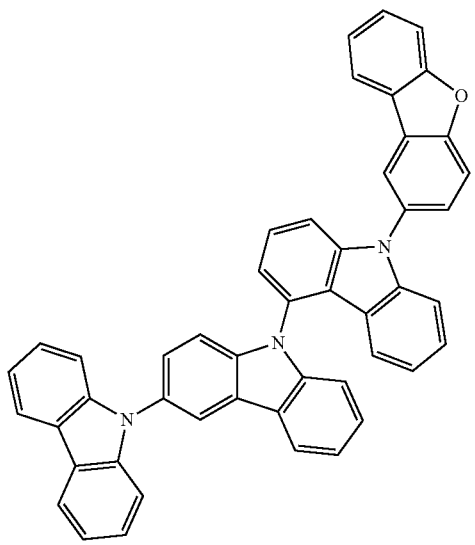
1-13
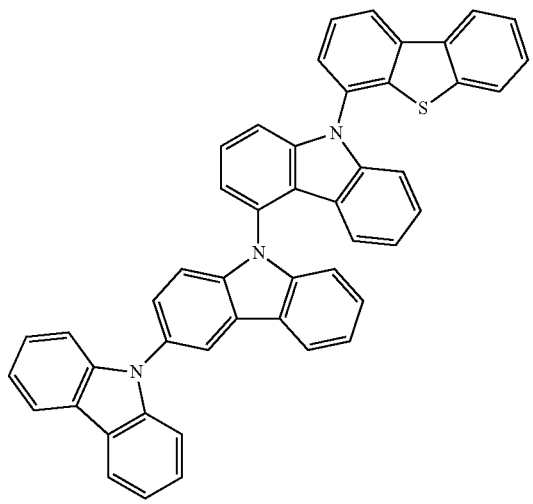

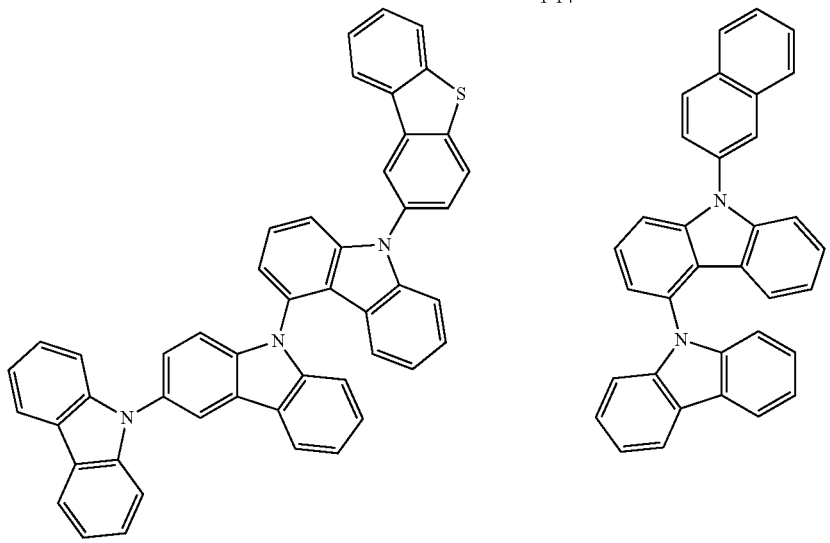
1-14
1-15
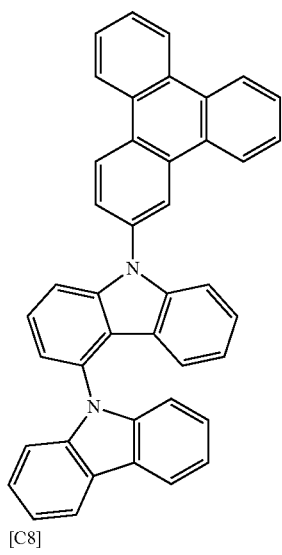
1-16
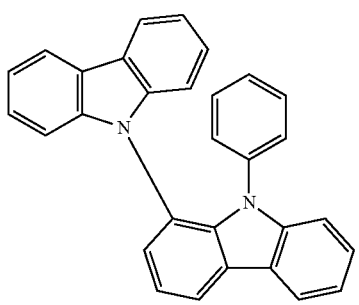
1-17
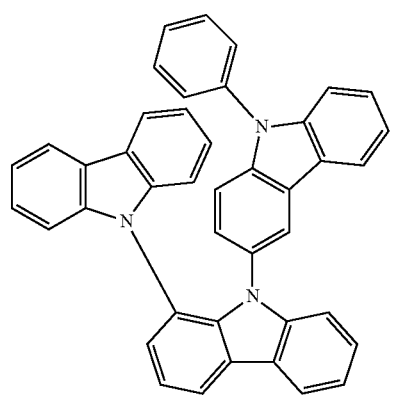
1-18

-continued
1-19
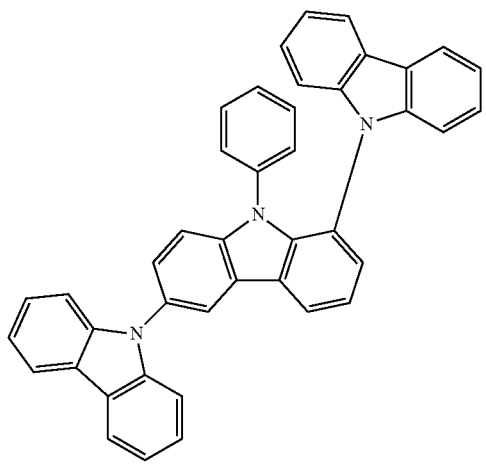
1-20
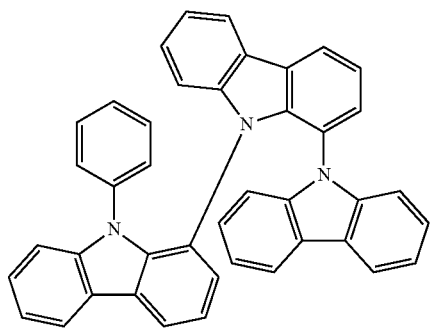
1-21
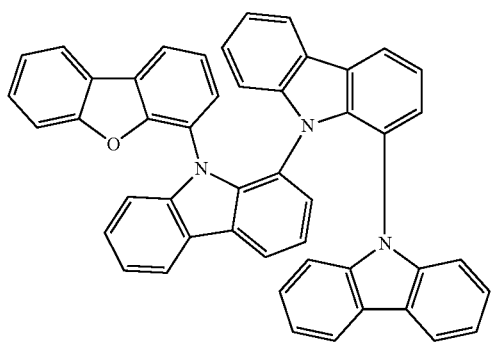
1-22
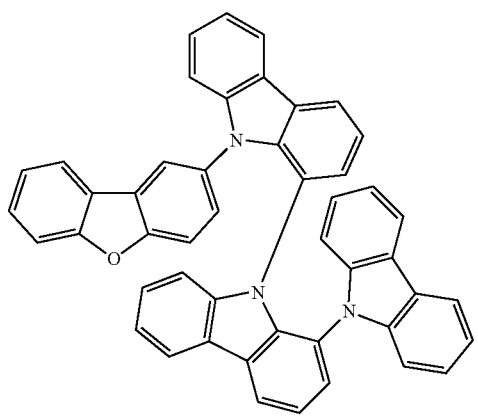
1-23
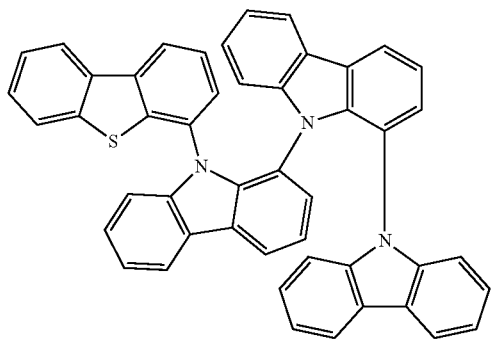
1-24
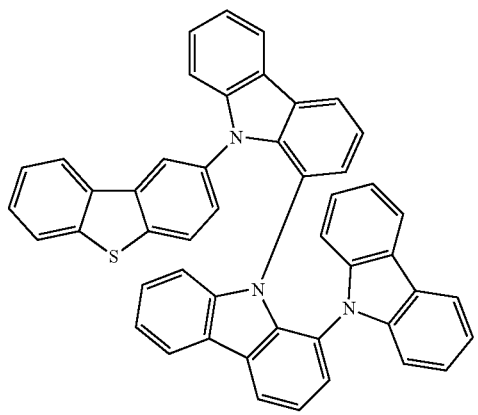
1-25
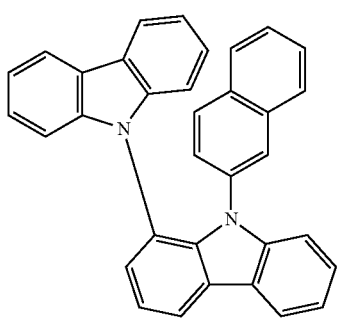
1-26
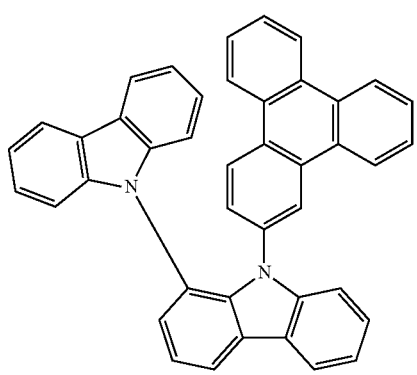

[C9]
1-27
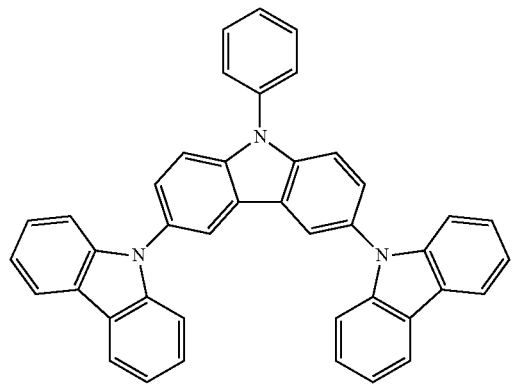
1-28
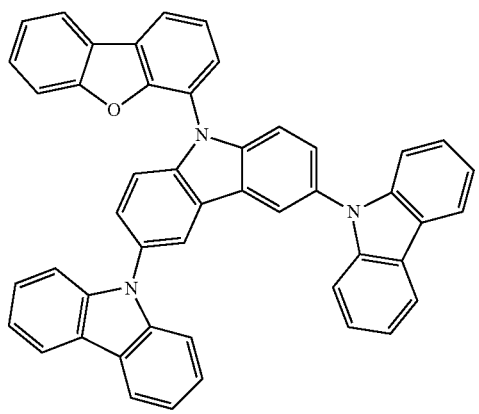
1-29
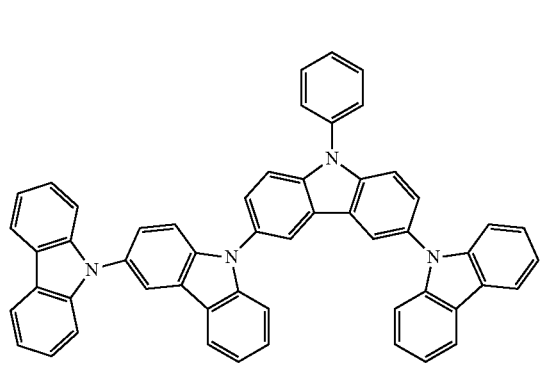
1-30
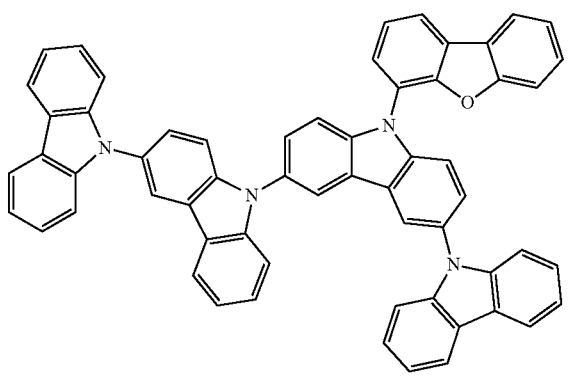
1-31
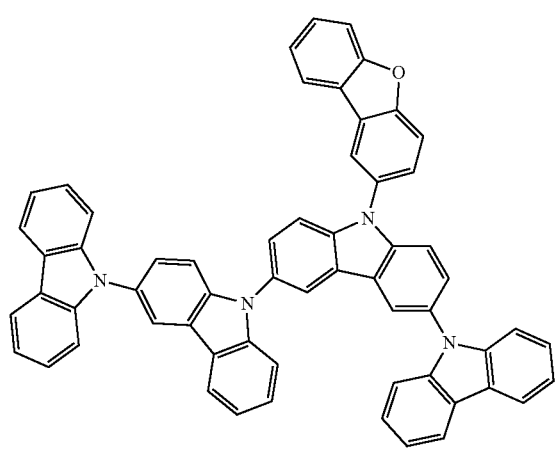
1-32
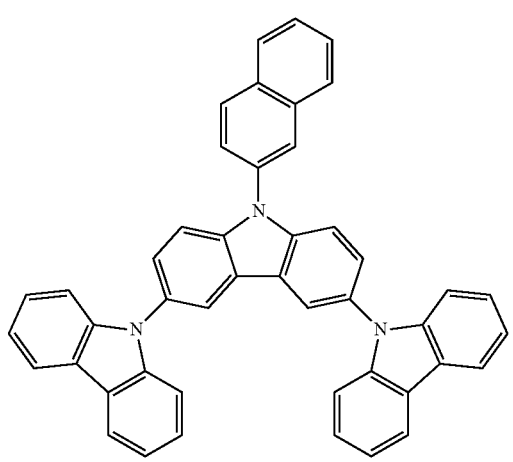

1-33
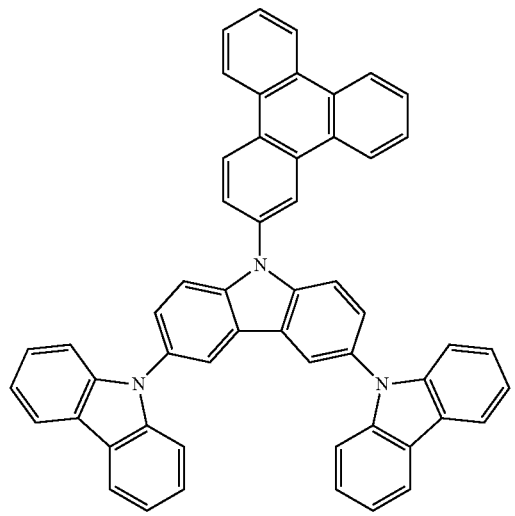
[C10]
1-34
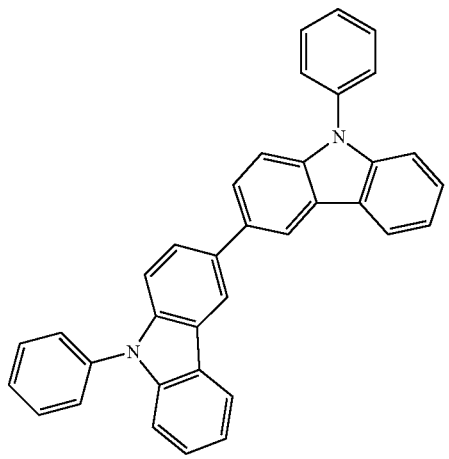
1-35
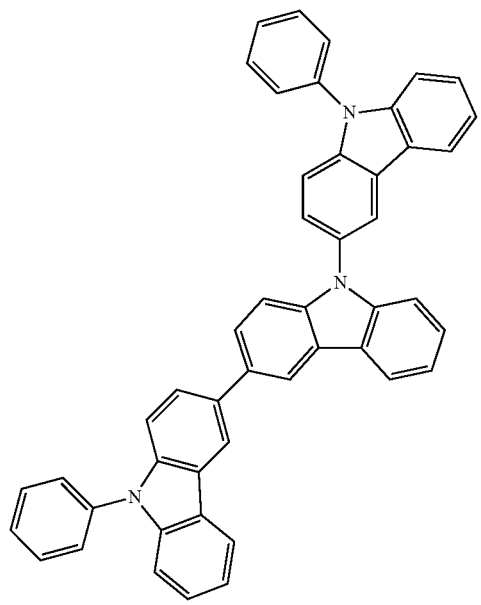
1-36
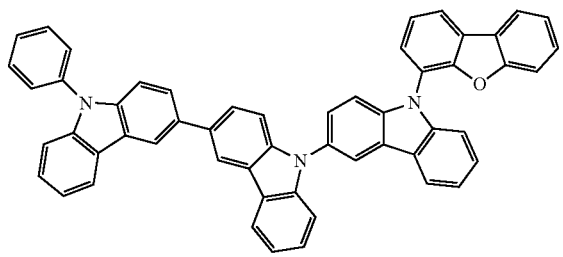
1-37
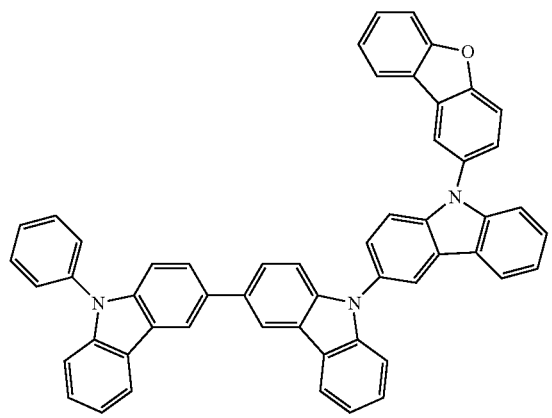
1-38
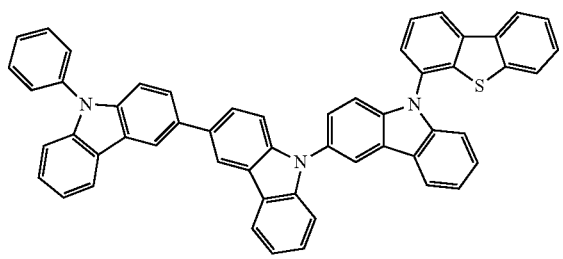

1-39
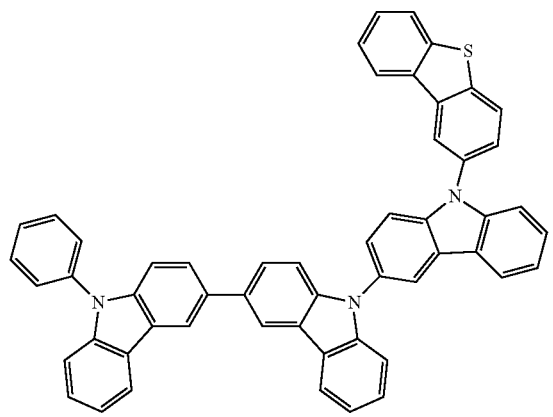
1-40
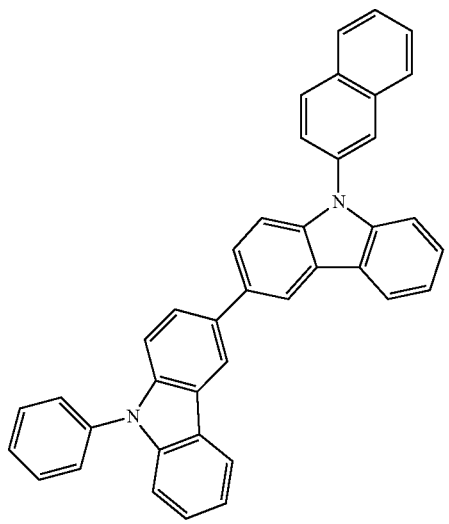
[C11]
1-41
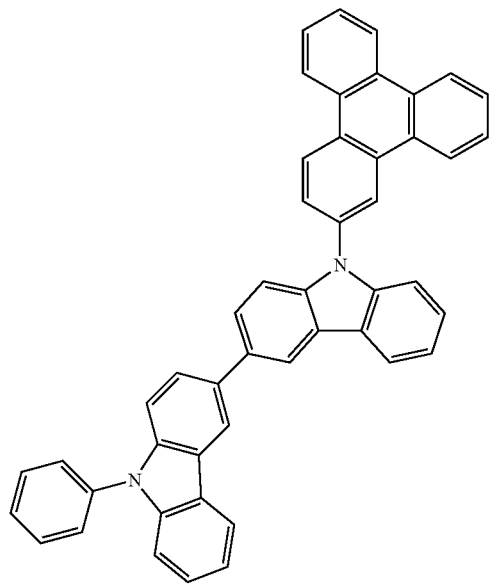
1-42
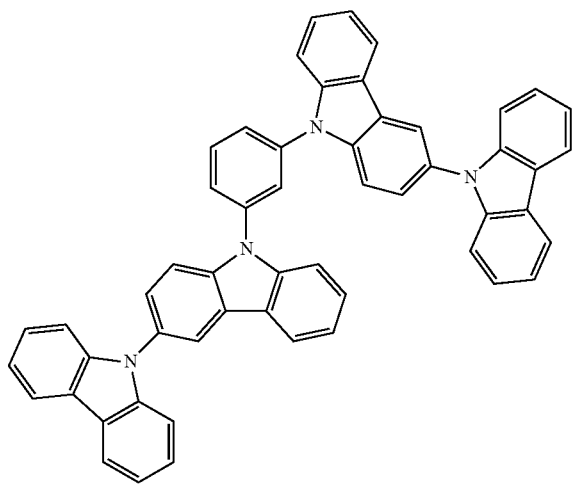

-continued
1-43
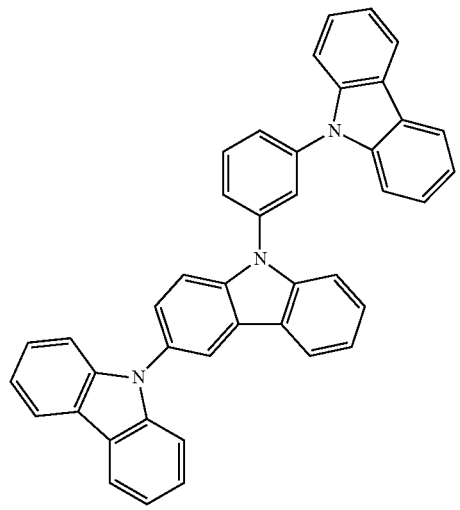
1-44
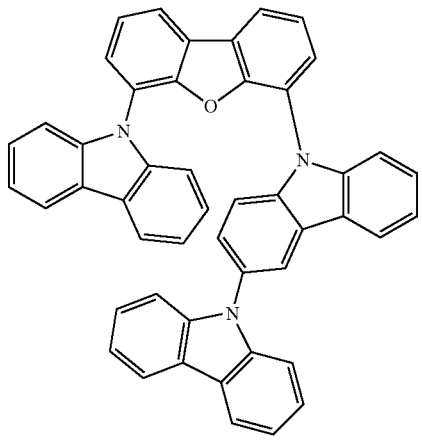
1-45
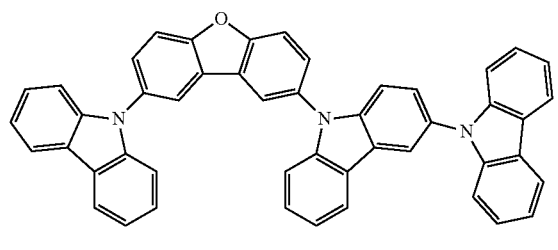
1-46
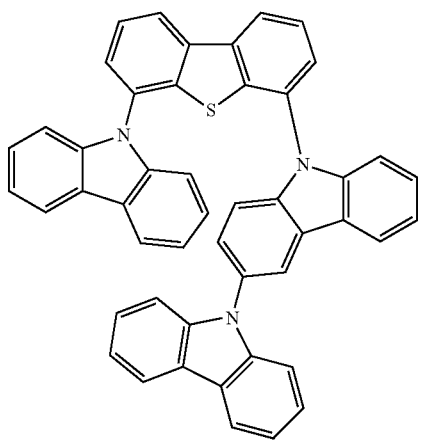
[C12]
1-47
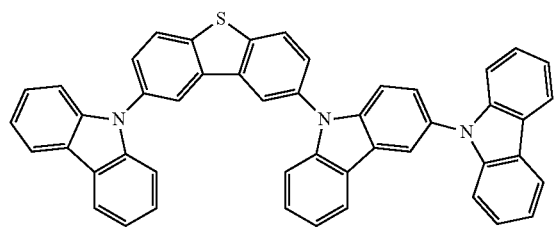
1-48
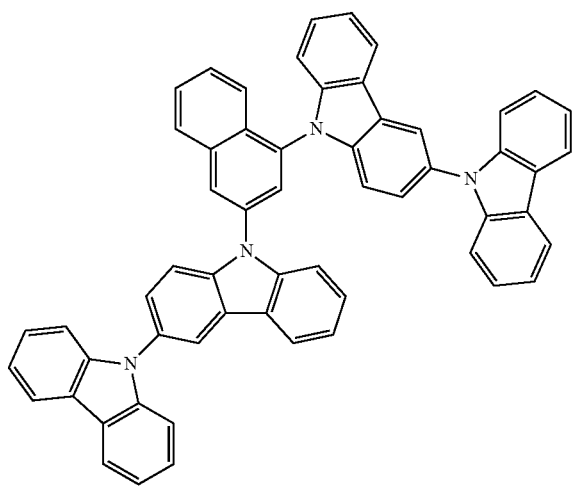

1-49
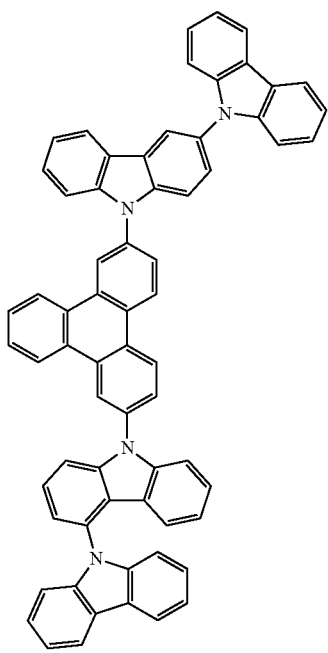
1-50
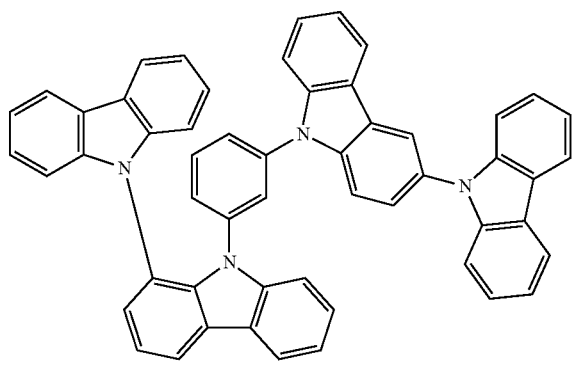
1-51
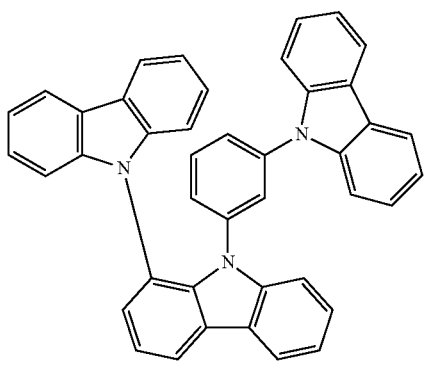
1-52
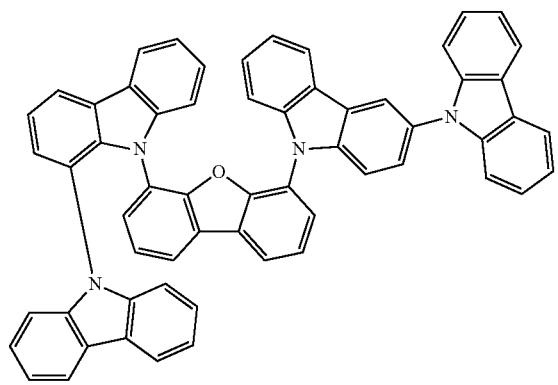
[C13]
1-53
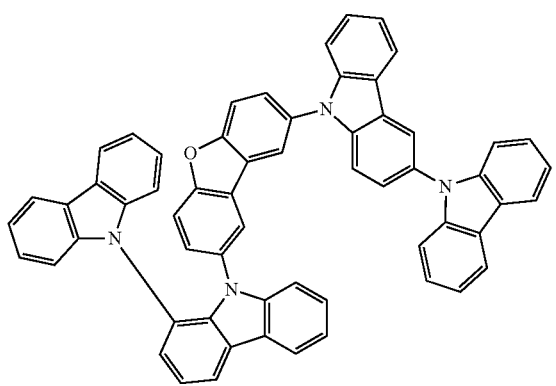
1-54
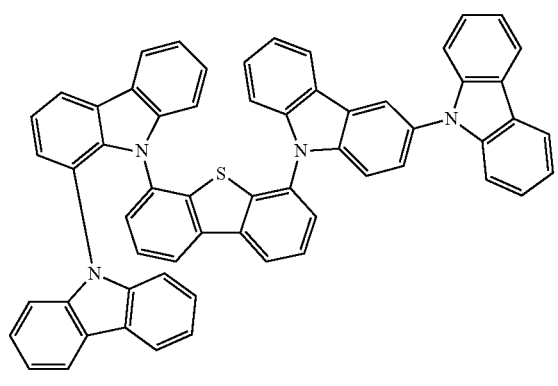

1-55
1-56
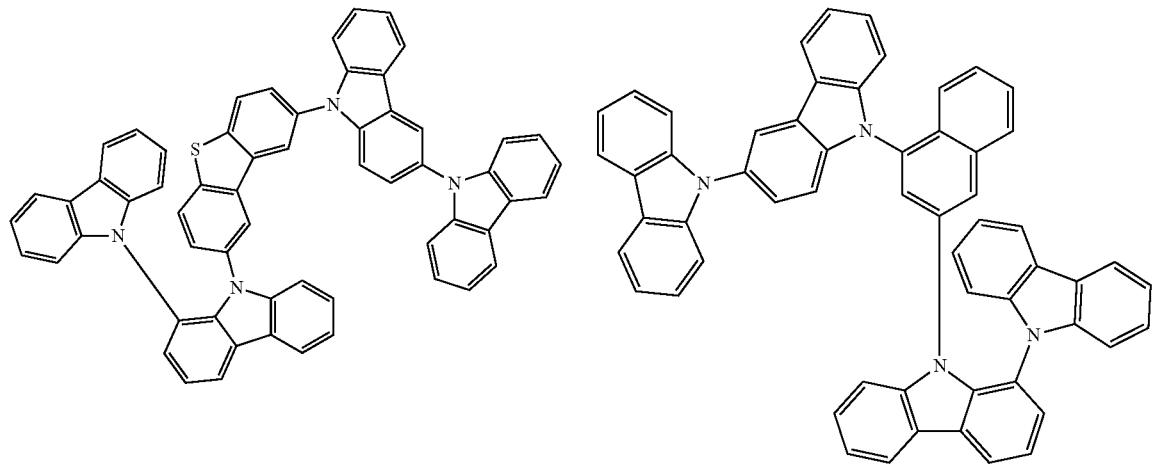
1-57
1-58
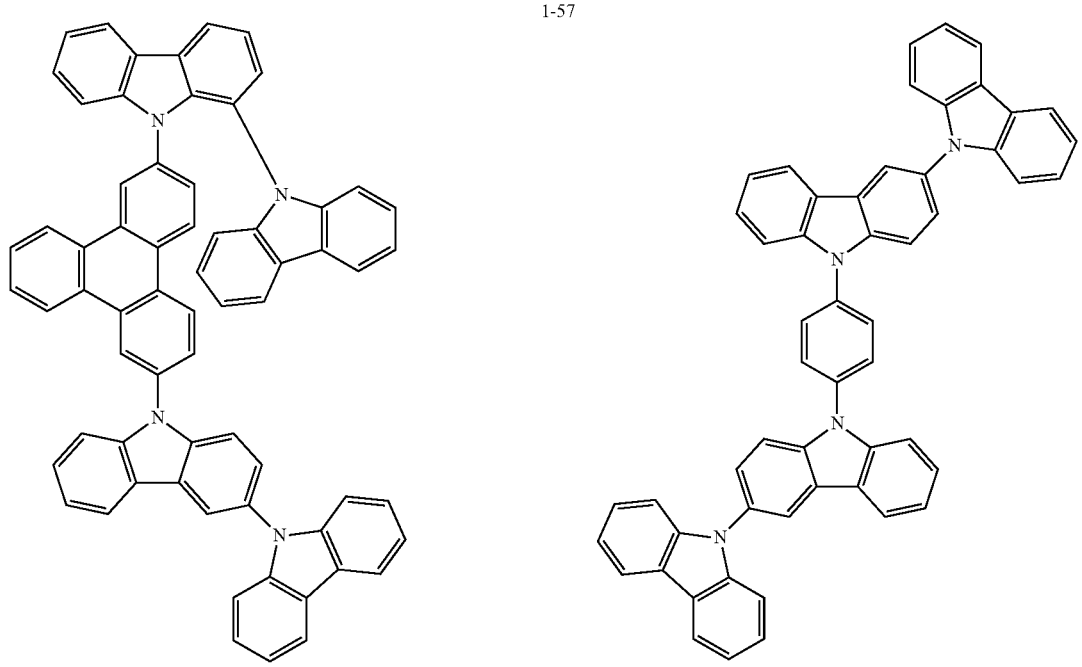

[C14]
1-59
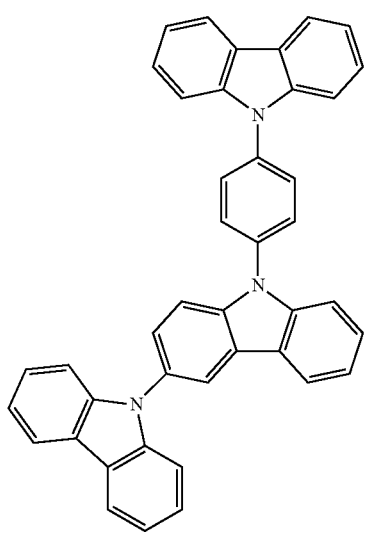
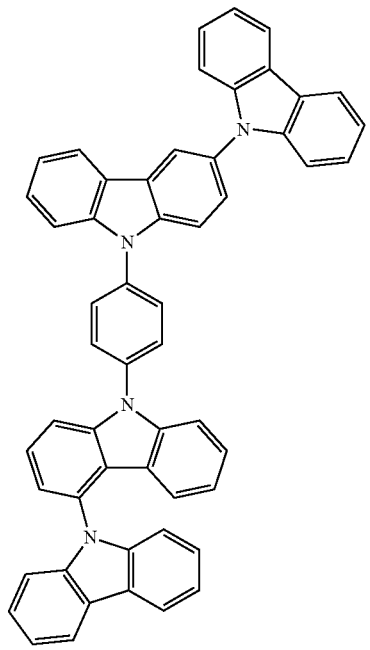
1-60
1-61
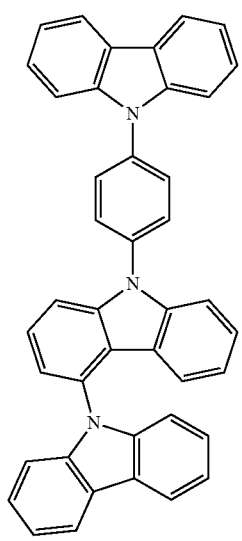
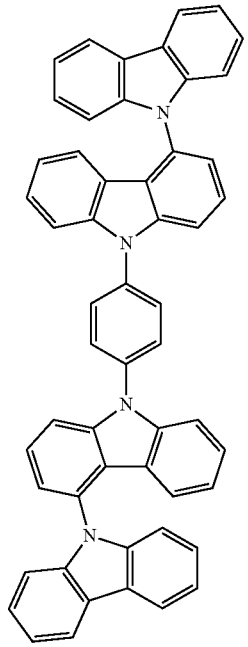
1-62

-continued
1-63
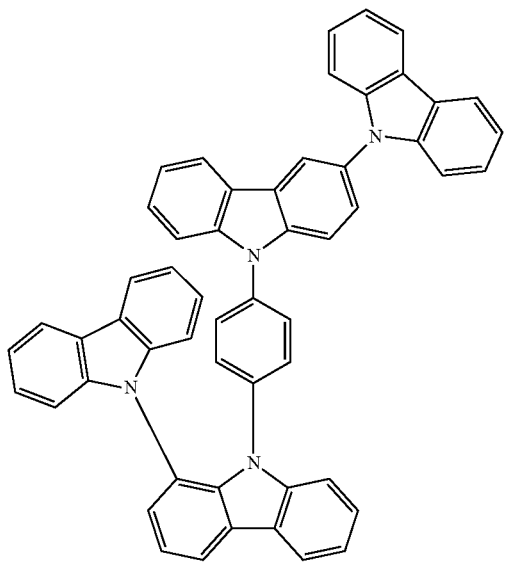
1-64
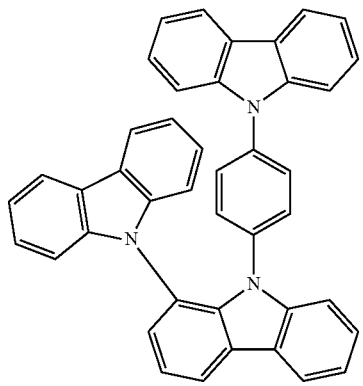
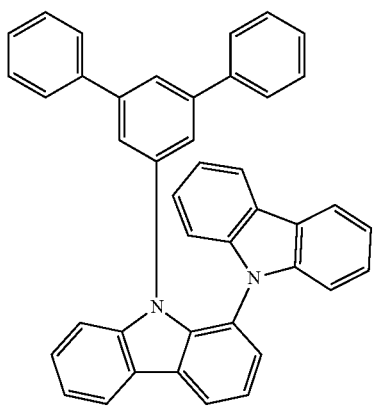
1-65
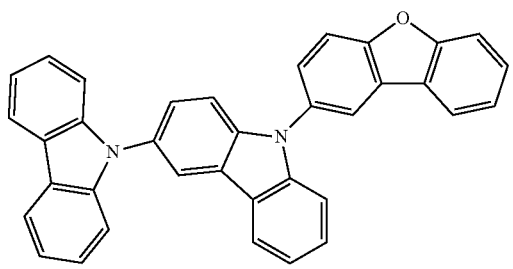
1-66
[C15]
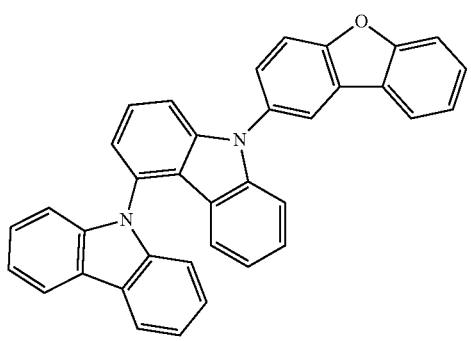
1-67
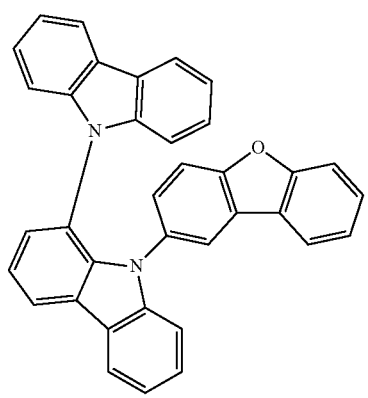
1-68

-continued
1-69
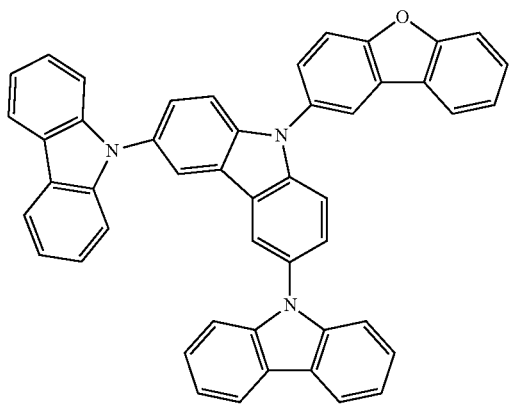
1-70
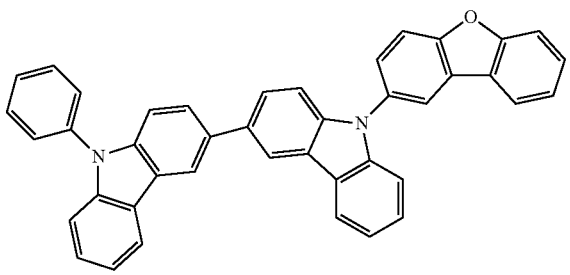
1-71
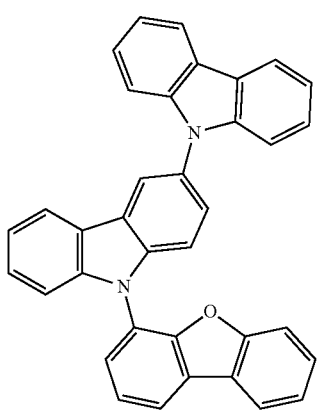
1-72
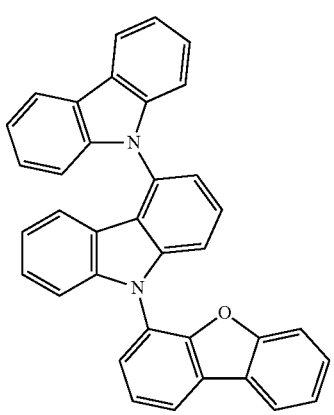
I-73
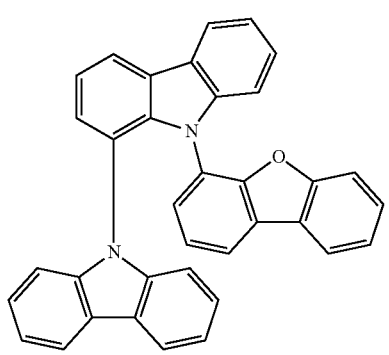
I-74
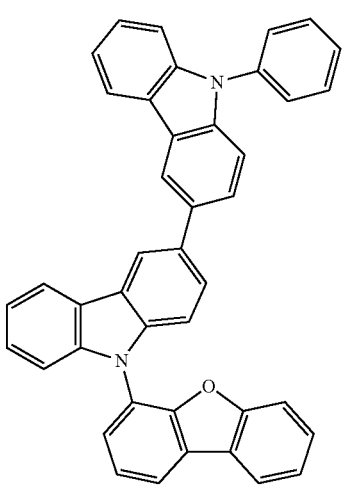

-continued
I-75
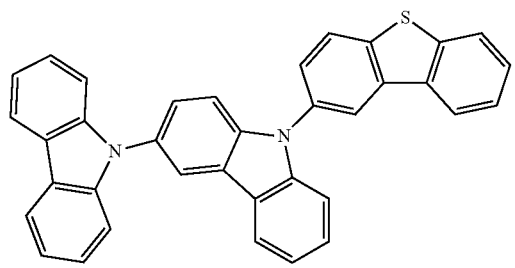
I-76
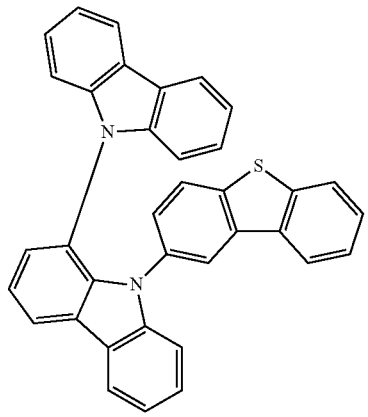
[C16]
I-77
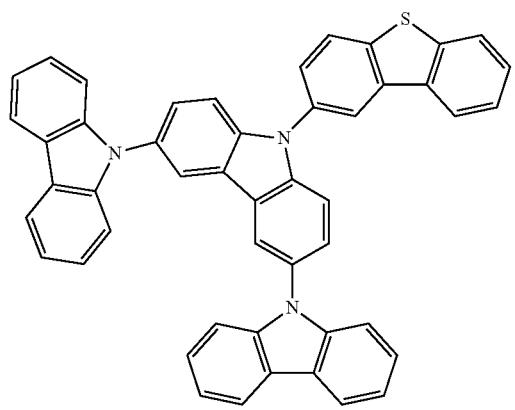
I-78
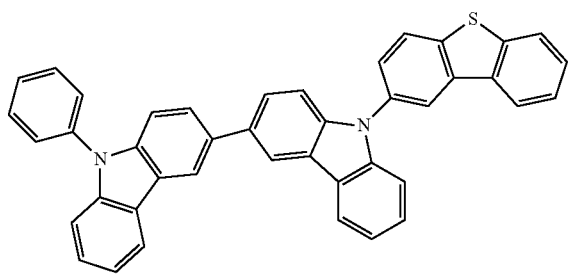
I-79
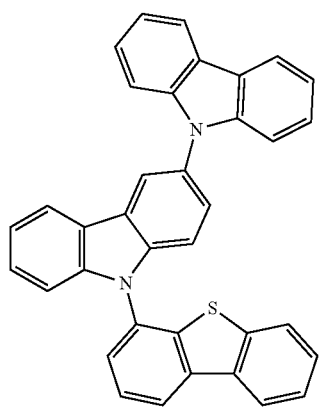
I-80
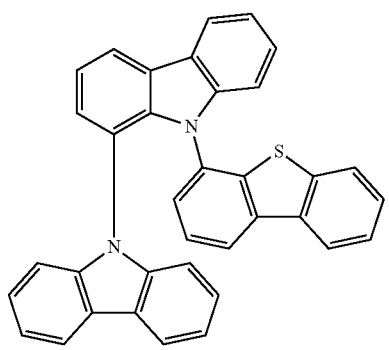

-continued
1-81
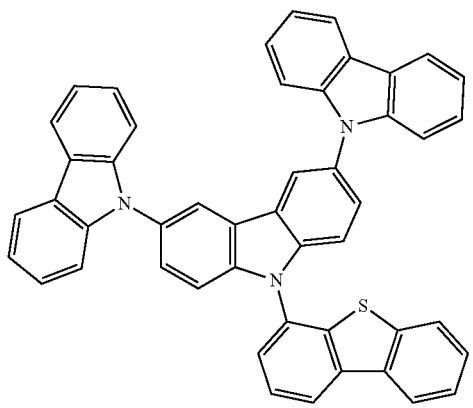
1-82
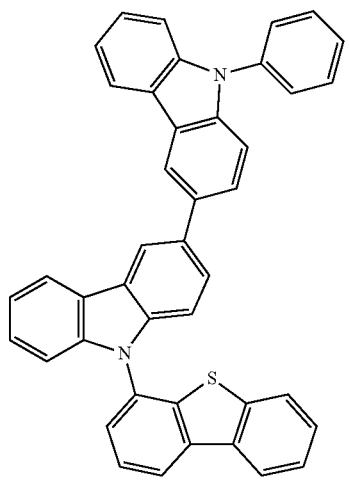
1-83
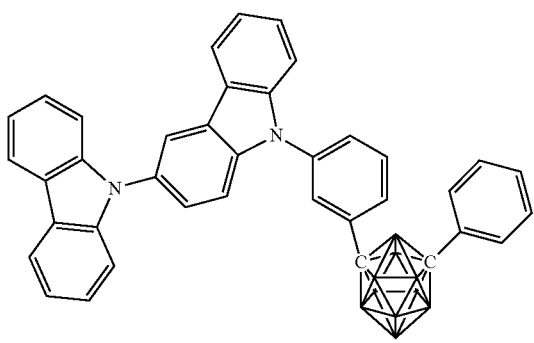
1-84
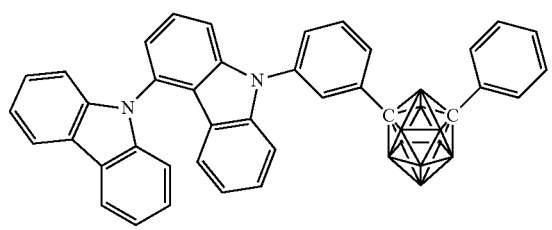
1-85
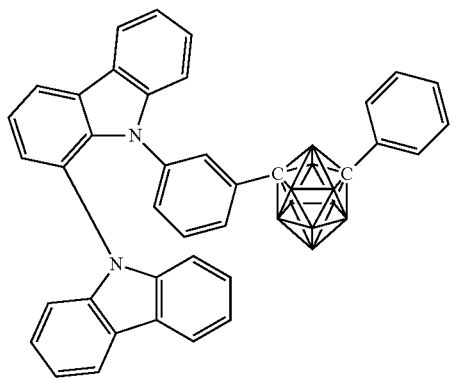
[C17]
1-86
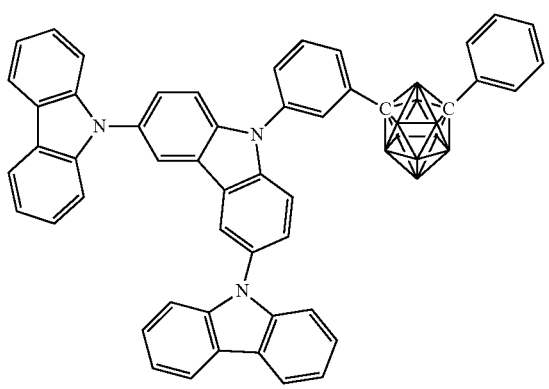
1-87
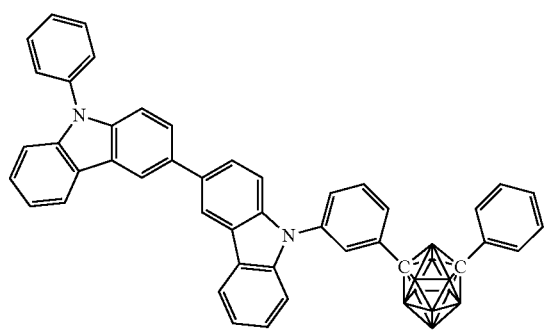

-continued
1-88
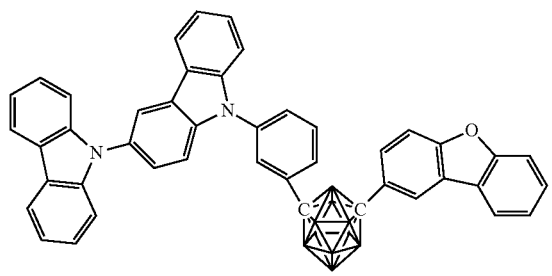
1-89
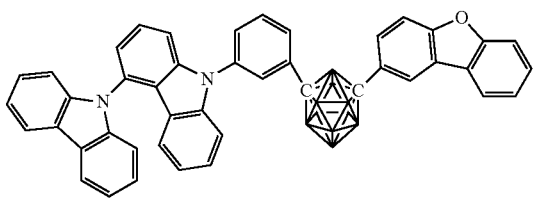
1-90
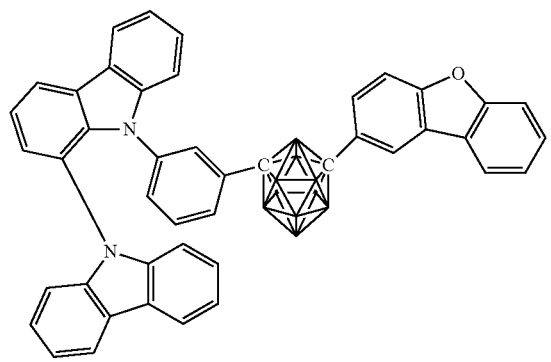
1-91
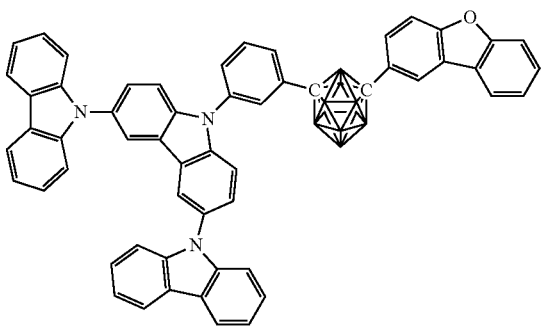
1-92
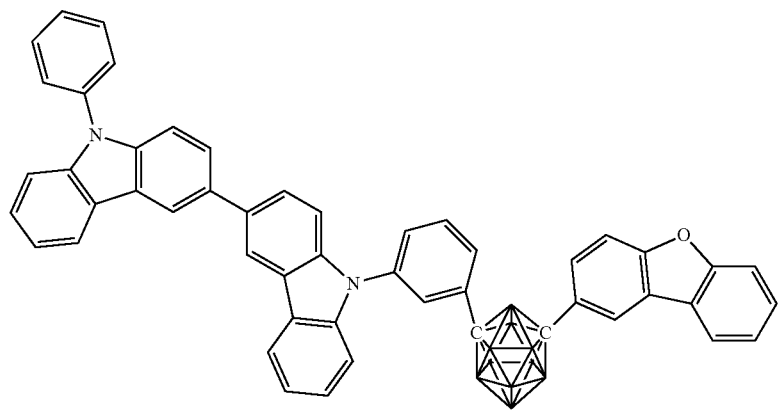
1-93
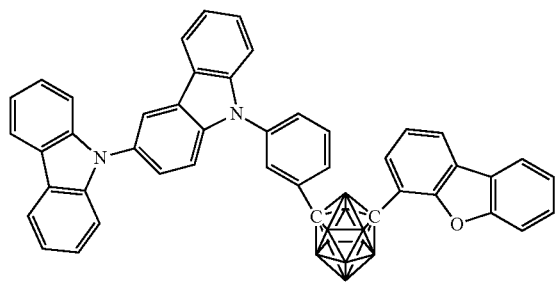
1-94
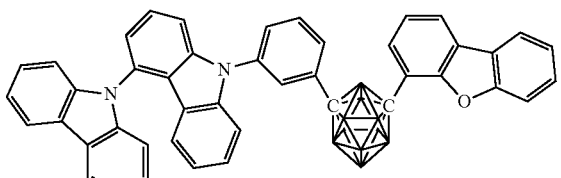

-continued
1-95
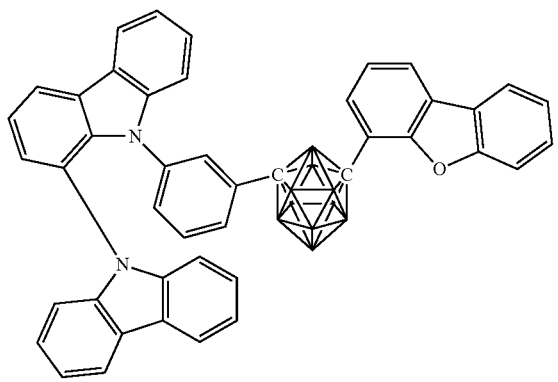
[C18]
1-96
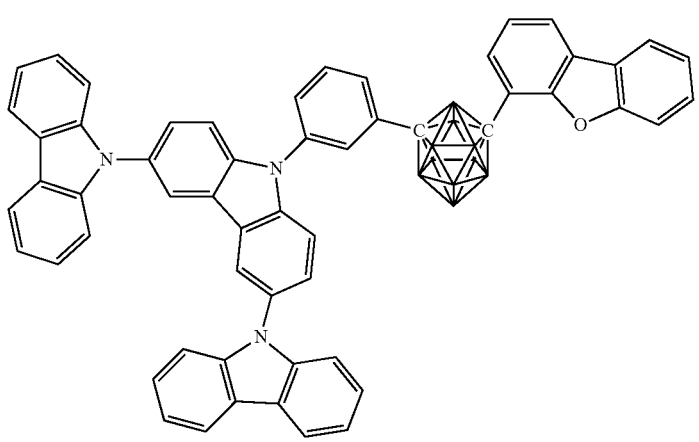
1-97
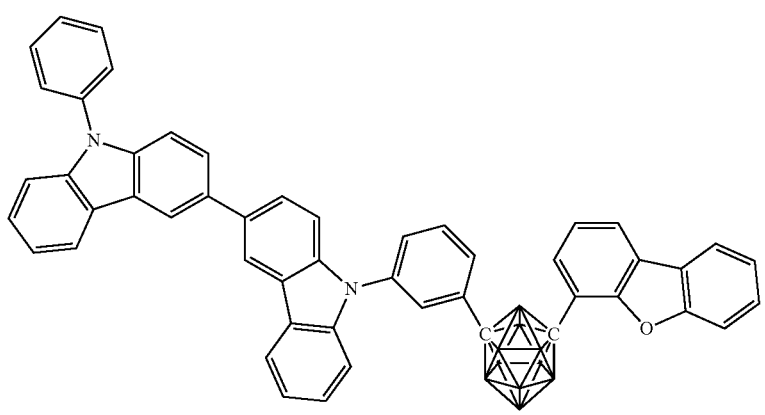
1-98 1-99
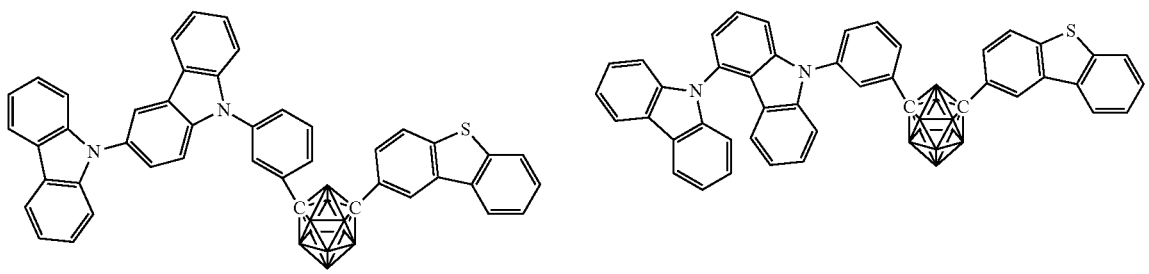

-continued
1-100
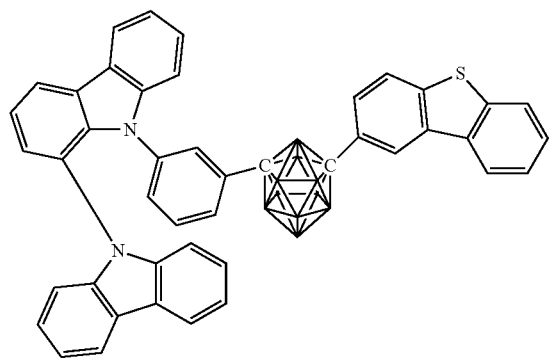
1-101
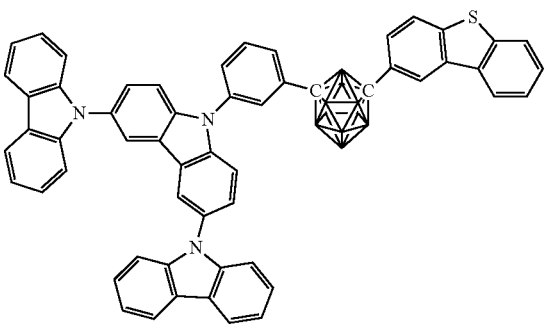
1-102
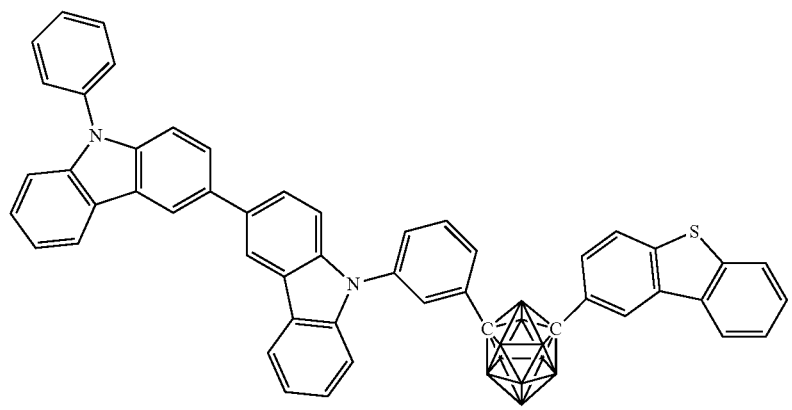
1-103
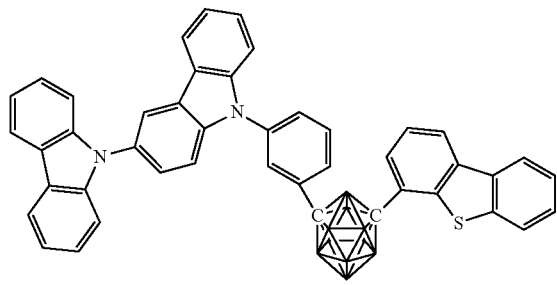
1-104
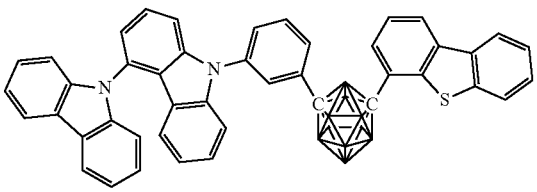
1-105
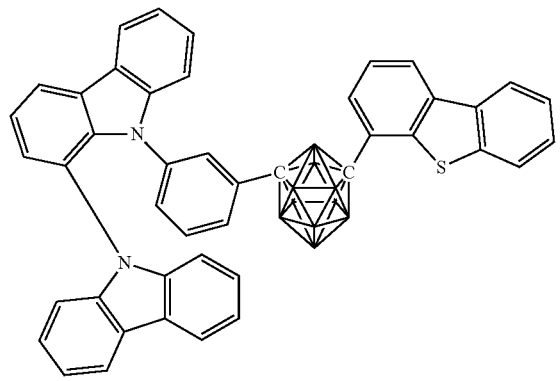

-continued
[C-19]
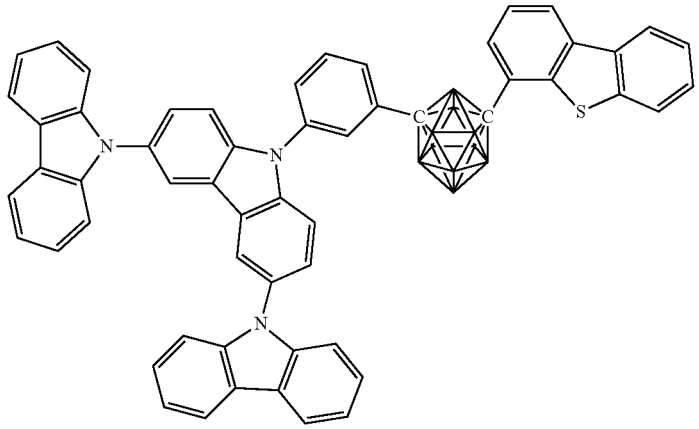
1-106
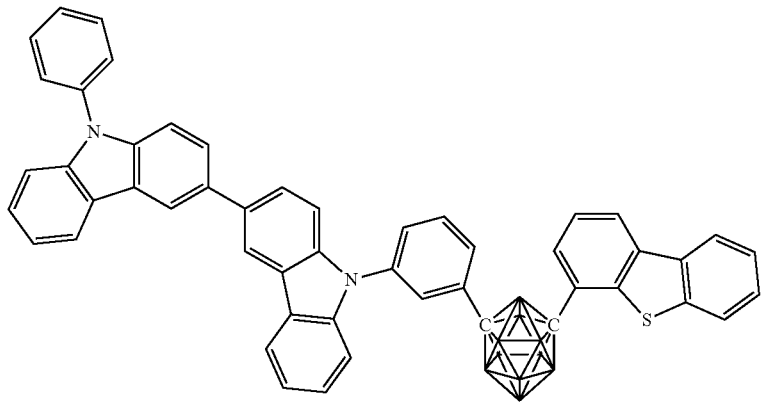
1-107
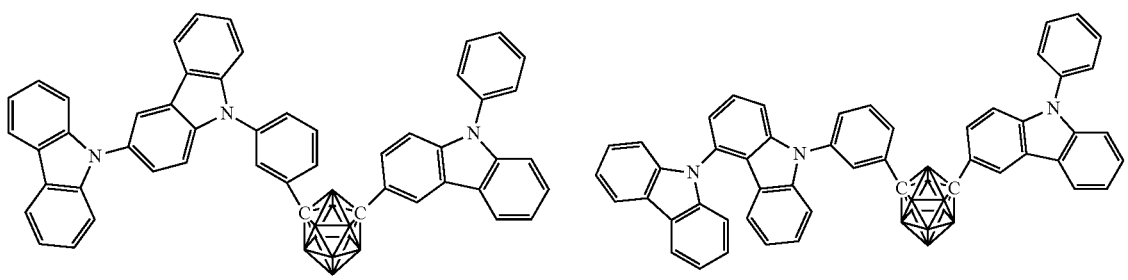
1-108 1-109
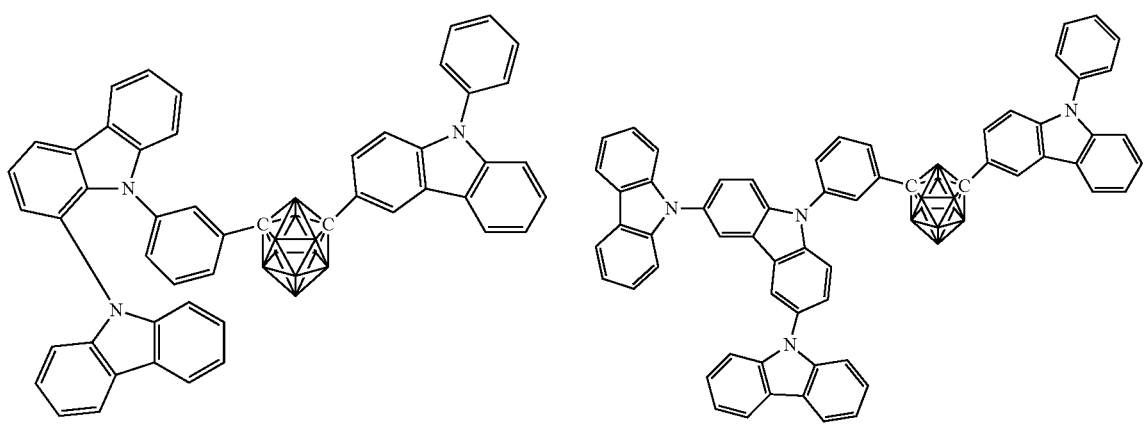
1-110 1-111

1-112
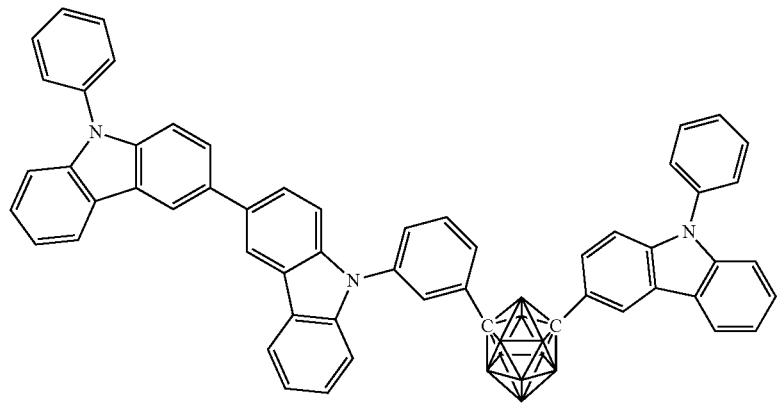
1-113
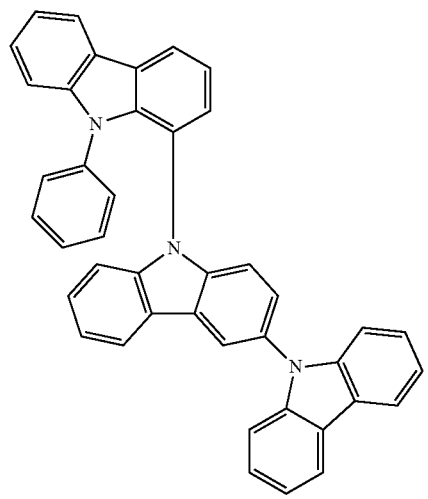
[C20]
1-114    1-115
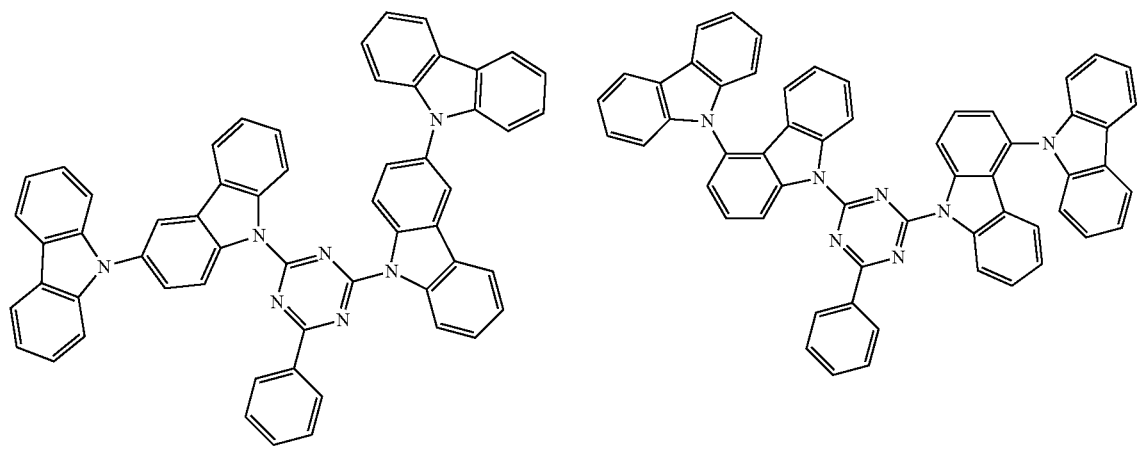

-continued 1-116
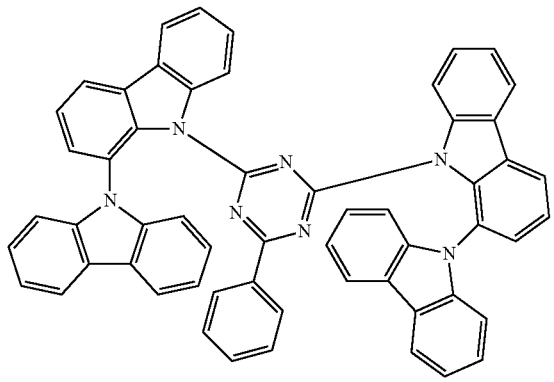

1-117
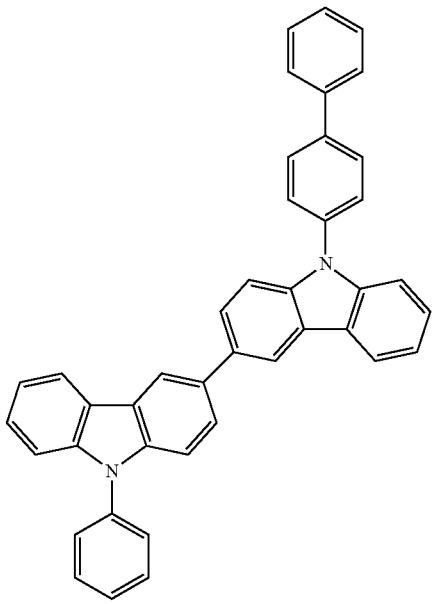

1-118
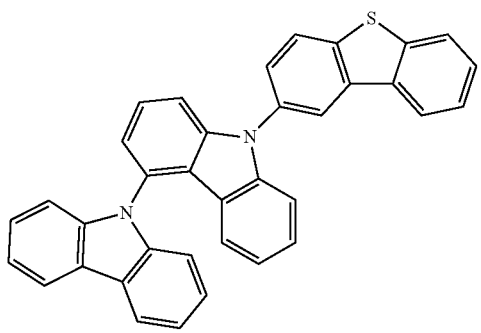

Next, the above formula (2) will be described.

In formula (2), Z is a group represented by formula (2a), and in formula (2a), the ring A is an aromatic hydrocarbon ring represented by formula (2b), the ring B is a heterocycle represented by formula (2c), and the ring A and the ring B are each fused to an adjacent ring at any position. Since a framework of Z is an indolocarbazole ring, the compound represented by formula (2) can be an indolocarbazole compound.

a represents an integer of 1 to 3, preferably an integer of 1 to 2, and more preferably an integer of 1. b represents an integer of 0 to 3, and preferably an integer of 0 to 2. a+b is in a range of 1 to 6, and preferably 1 to 4.

c and d independently represent an integer of 0 to 4, and j is an integer of 0 to 2.

$L^2$ represents an (a+b)-valent group.

$L^2$ represents an aromatic hydrocarbon group having 6 to 30 carbon atoms or an aromatic heterocyclic group having 3 to 18 carbon atoms. Preferable examples thereof include an aromatic hydrocarbon having 3 to 18 carbon atoms, and more preferable examples thereof include an aromatic hydrocarbon group having 6 carbon atoms. Here, an aromatic hydrocarbon group having 6 carbon atoms is a group obtained by removing H from benzene, and includes cases in which it is a divalent or higher valent group. In addition, when a+b is 2, $L^2$ can be a single bond.

Specific examples of $L^2$ include groups obtained by removing (a+b) hydrogen atoms from benzene, naphthalene, azulene, anthracene, phenanthrene, pyrene, chrysene, naphthacene, triphenylene, acenaphthene, coronene, indene, fluorene, fluoranthene, tetracene, pentacene, furan, dibenzofuran, thiophene, dibenzothiophene, oxazole, pyrrole, pyridine, pyridazine, pyrimidine, pyrazine, triazine, benzimidazole, oxadiazole, triazole, imidazole, pyrazole, thiazole, indole, indazole, benzimidazole, benzothiazole, benzoxazole, quinoxaline, quinazoline, cinnoline, quinoline, isoquinoline, phthalazine, naphthyridine, carbazole, carboline, diazacarbazole, or the like. Preferable examples thereof include groups obtained by removing (a+b) hydrogen atoms from benzene, naphthalene, anthracene, phenanthrene, triphenylene fluorene, or the like. A phenylene group is more preferable.

$Ar^1$ and $Ar^2$ independently represent a substituted or unsubstituted aromatic hydrocarbon group having 6 to 30 carbon atoms, a substituted or unsubstituted aromatic heterocyclic group having 3 to 18 carbon atoms, or a linked aromatic group formed by linking 2 to 6 aromatic rings of aromatic groups selected from among aromatic hydrocarbon groups and aromatic heterocyclic groups. Preferable examples thereof include a substituted or unsubstituted aromatic hydrocarbon group having 6 to 18 carbon atoms, a substituted or unsubstituted aromatic heterocyclic group having 3 to 15 carbon atoms, or a linked aromatic group formed by linking 2 to 4 aromatic rings of aromatic groups selected from among aromatic hydrocarbon groups and aromatic heterocyclic groups. More preferable examples thereof include a substituted or unsubstituted aromatic hydrocarbon group having 6 to 12 carbon atoms, a substituted or unsubstituted aromatic heterocyclic group having 3 to 12 carbon atoms, and a linked aromatic group formed by linking 2 to 4 aromatic rings of aromatic groups selected from among aromatic hydrocarbon groups and aromatic heterocyclic groups. When $Ar^1$ and $Ar^2$ are linked aromatic groups, aromatic rings to be linked may be the same as or different from each other and may be linear or branched. For description of the linked aromatic groups, the description of the linked ring group may be referred to except that the ring cannot be a carborane ring and such a carborane ring is excluded from examples of the rings such as an aromatic ring to be linked.

Specific examples of $Ar^1$ and $Ar^2$ include benzene, naphthalene, azulene, anthracene, phenanthrene, pyrene, chrysene, naphthacene, triphenylene, acenaphthene, coronene, indene, fluorene, fluoranthene, tetracene, pentacene, furan, dibenzofuran, thiophene, dibenzothiophene, oxazole, pyrrole, pyridine, pyridazine, pyrimidine, pyrazine, triazine, benzimidazole, oxadiazole, triazole, imidazole, pyrazole, thiazole, indole, indazole, benzimidazole, benzothiazole, benzoxazole, quinoxaline, quinazoline, cinnoline, quinoline, isoquinoline, phthalazine, naphthyridine, carbazole, carboline, diazacarbazole, and a group obtained by removing one hydrogen atom from a linked aromatic compound in which 2 to 4 of these rings are linked. Preferable examples thereof include benzene, naphthalene, anthracene, phenanthrene, fluorene, furan, dibenzofuran, thiophene, dibenzothiophene, pyridine, pyridazine, pyrimidine, pyrazine, triazine, benzimidazole, oxadiazole, triazole, imidazole, pyrazole, thiazole, indole, indazole, benzimidazole, benzothiazole, benzoxazole, quinoxaline, quinazoline, cinnoline, quinoline, isoquinoline, phthalazine, naphthyridine, carbazole, carboline, diazacarbazole, and a group obtained by removing one hydrogen atom from a linked aromatic compound in which 2 to 4 of these rings are linked. More preferable examples thereof include benzene, naphthalene, dibenzofuran, dibenzothiophene, pyridine, pyridazine, pyrimidine, pyrazine, triazine, quinoline, isoquinoline, carbazole, and a group obtained by removing one hydrogen atom from a linked aromatic compound in which 2 to 4 of these rings are linked.

When $Ar^1$ and $Ar^2$ are an aromatic hydrocarbon group or an aromatic heterocyclic group, they can have a substituent. When $Ar^1$ and $Ar^2$ have a substituent, it is an aliphatic hydrocarbon group having 1 to 8 carbon atoms or an alkoxy group having 1 to 8 carbon atoms. In the case of the linked aromatic group, it can have a substituent in the same manner.

Specific examples of the aliphatic hydrocarbon group having 1 to 8 carbon atoms and the alkoxy group having 1 to 8 carbon atoms are the same as the specific examples for the substituents for $L^1$.

$R^2$ represents an aliphatic hydrocarbon group having 1 to 10 carbon atoms, a substituted or unsubstituted aromatic hydrocarbon group having 6 to 18 carbon atoms, a substituted or unsubstituted aromatic heterocyclic group having 3 to 18 carbon atoms, or a linked aromatic group formed by linking 2 or 3 aromatic rings of aromatic groups selected from among aromatic hydrocarbon groups and aromatic heterocyclic groups. Preferable examples thereof include a substituted or unsubstituted aromatic hydrocarbon group having 6 to 12 carbon atoms, a substituted or unsubstituted aromatic heterocyclic group having 3 to 15 carbon atoms, and a linked aromatic group formed by linking 2 aromatic rings of aromatic groups selected from among aromatic hydrocarbon groups and aromatic heterocyclic groups.

Specific examples of the aliphatic hydrocarbon group having 1 to 10 carbon atoms include a methyl group, an ethyl group, a propyl group, a butyl group, a pentyl group, a hexyl group, a heptyl group, an octyl group, a nonane group, and a decane group.

Specific examples of the aromatic hydrocarbon group having 6 to 18 carbon atoms or the aromatic heterocyclic group having 3 to 18 carbon atoms include groups obtained by removing one hydrogen atom from benzene, naphthalene, azulene, anthracene, phenanthrene, fluorene, dibenzofuran, dibenzothiophene, pyridine, pyridazine, pyrimidine, pyrazine, triazine, benzimidazole, oxadiazole, triazole, imidazole, pyrazole, thiazole, indole, indazole, benzimidazole, benzothiazole, benzoxazole, quinoxaline, quinazoline, cinnoline, quinoline, isoquinoline, phthalazine, naphthyridine, carbazole, carboline, diazacarbazole, or the like. Preferable examples thereof include groups obtained by removing one hydrogen atom from benzene, naphthalene, dibenzofuran, thiophene, dibenzothiophene, pyridine, pyridazine, pyrimidine, pyrazine, triazine, benzimidazole, oxadiazole, triazole, imidazole, pyrazole, thiazole, indole, indazole, benzimidazole, benzothiazole, benzoxazole, quinoxaline, quinazoline, cinnoline, quinoline, isoquinoline, phthalazine, naphthyridine, carbazole, carboline, diazacarbazole, or the like. More preferable examples thereof include groups obtained by removing one hydrogen atom from benzene, naphthalene, dibenzofuran, dibenzothiophene, pyridine, pyridazine, pyrimidine, pyrazine, triazine, quinoline, isoquinoline, carbazole, or the like.

When $R^2$ is an aromatic hydrocarbon group, an aromatic heterocyclic group, or a linked aromatic group, it can have a substituent. When $R^2$ has a substituent, it is an aliphatic hydrocarbon group having 1 to 8 carbon atoms or an alkoxy group having 1 to 8 carbon atoms.

Specific examples of the aliphatic hydrocarbon group having 1 to 8 carbon atoms and the alkoxy group having 1 to 8 carbon atoms are the same as the specific examples for the substituents for $L^1$.

Specific examples of the compound represented by formula (2) are shown below. However, the present invention is not limited to these exemplified compounds.

[C21]

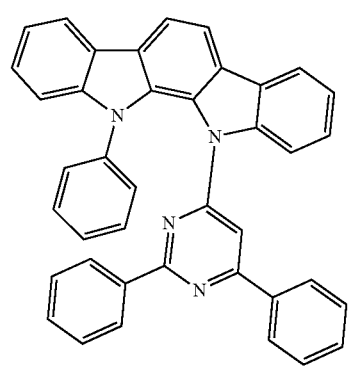

2-1

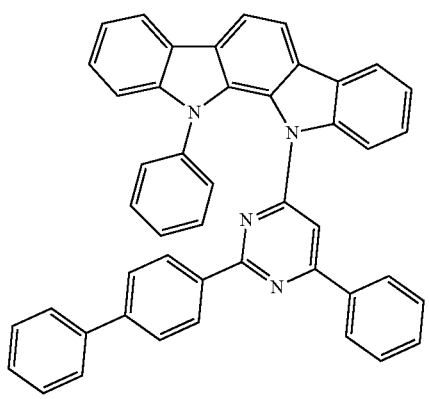
2-2
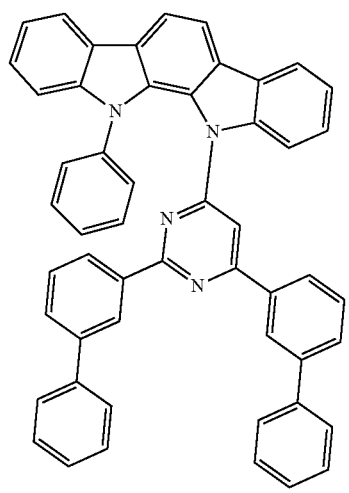
2-5
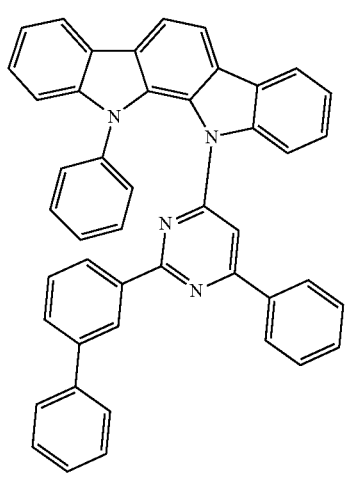
2-3
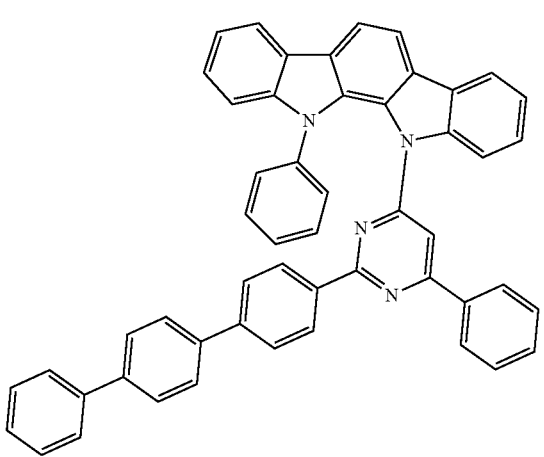
2-6
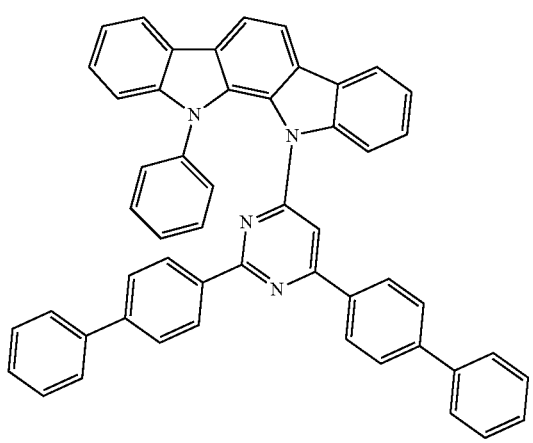
2-4
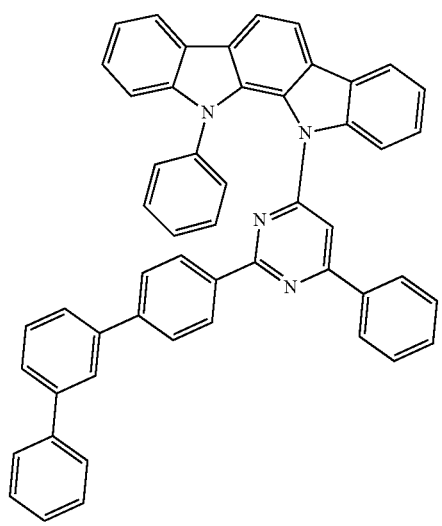
2-7

[C22]
2-8 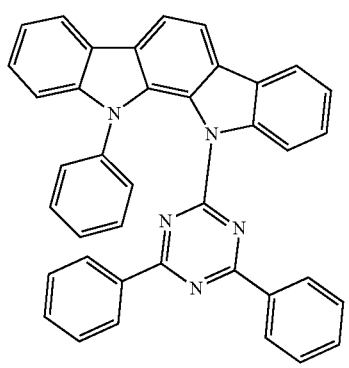
2-9 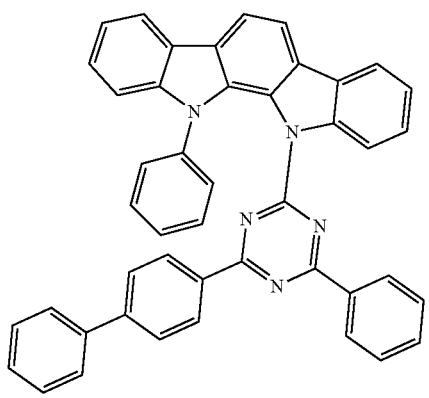
2-10 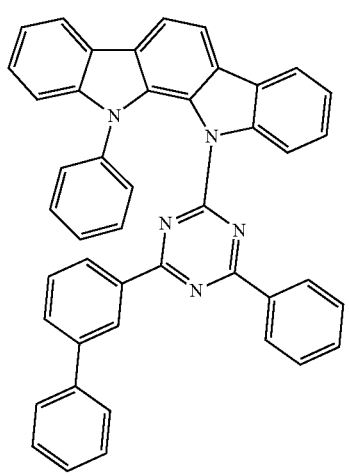
2-11 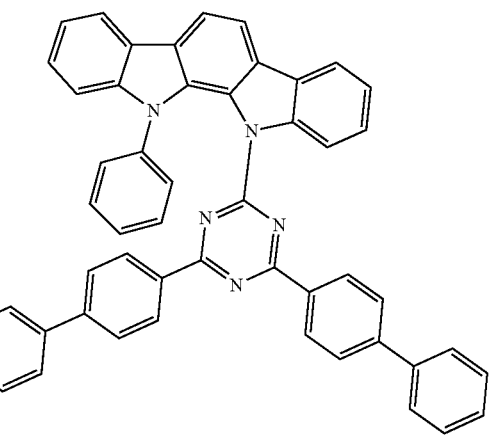
2-12 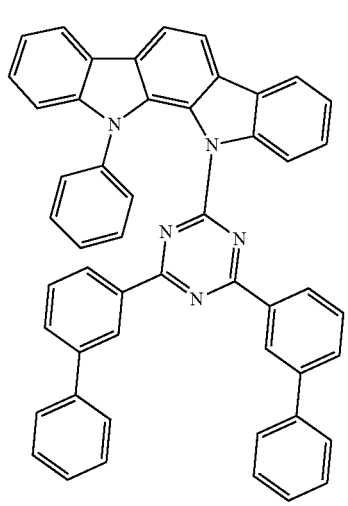
2-13 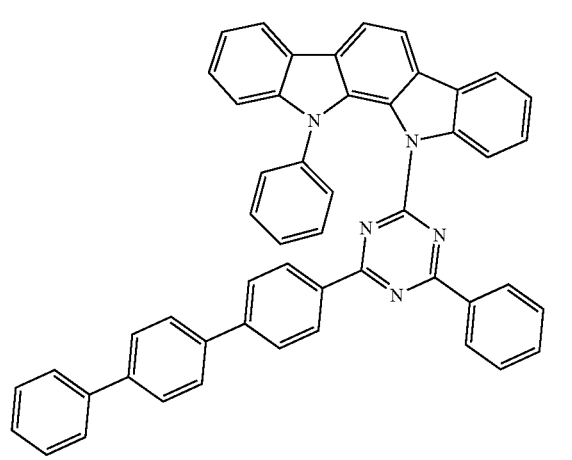

2-14
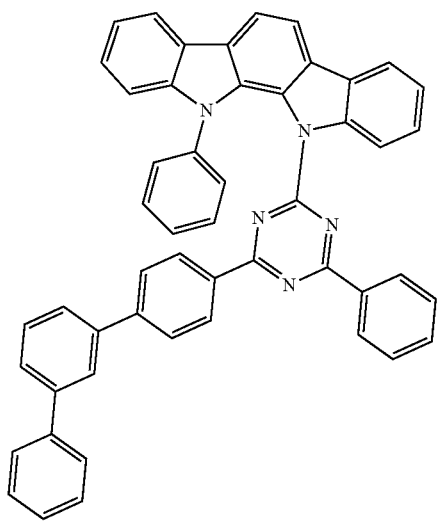
2-15
2-16
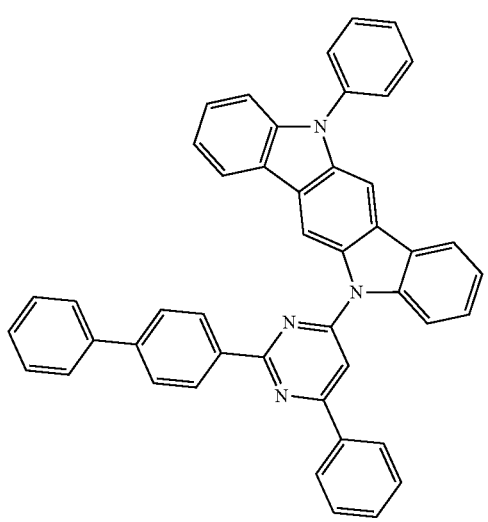
2-17
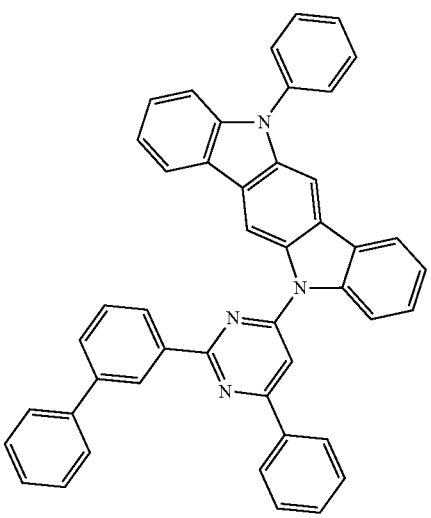
2-18
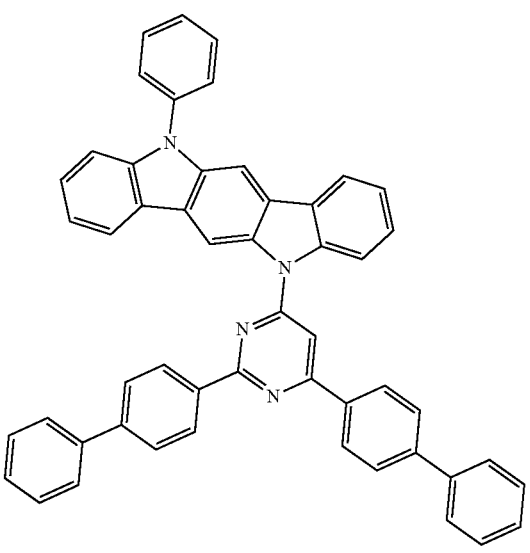
2-19

-continued
2-20
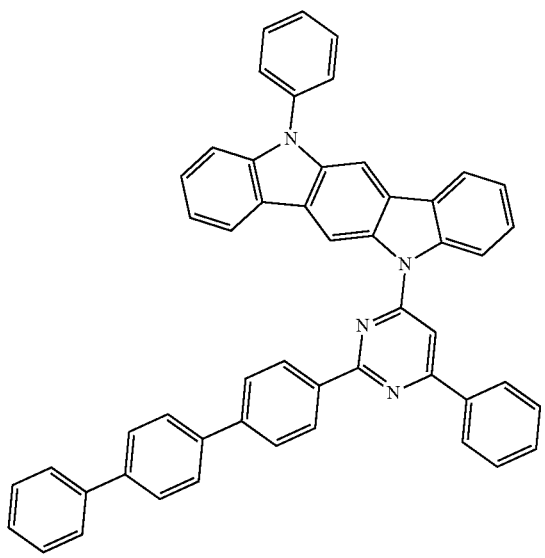
[C24]
2-21
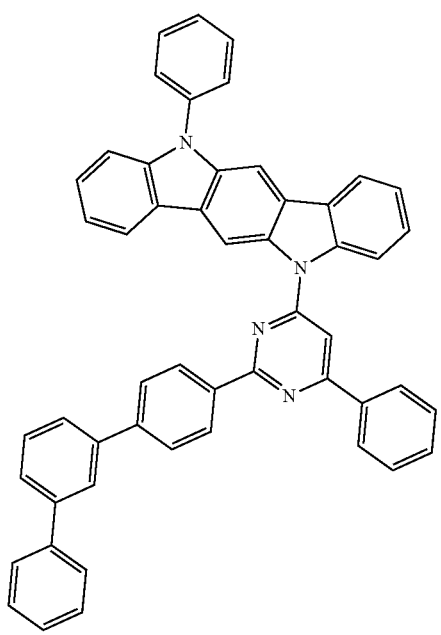
-continued
2-22
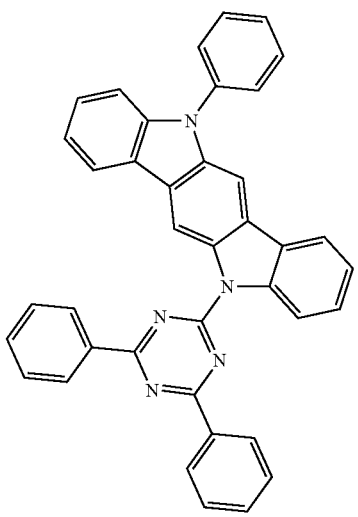
2-23
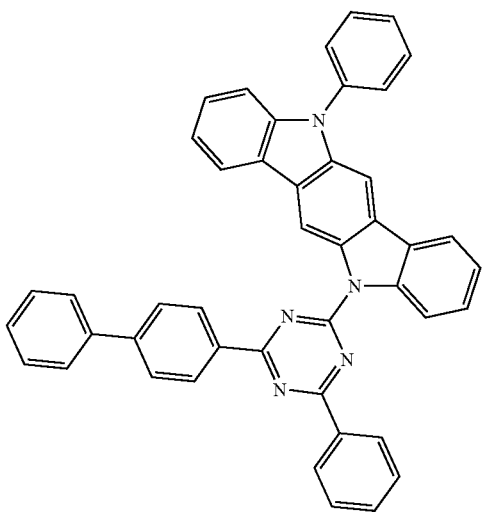
2-24
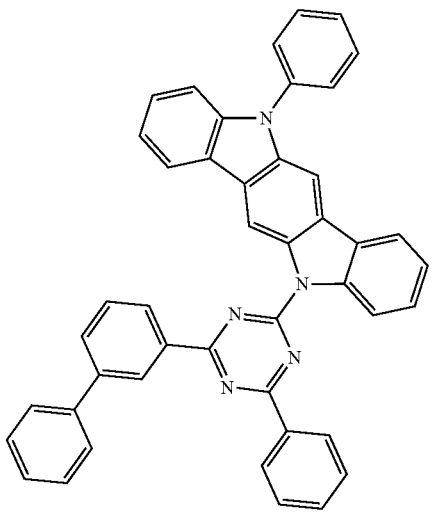

2-25
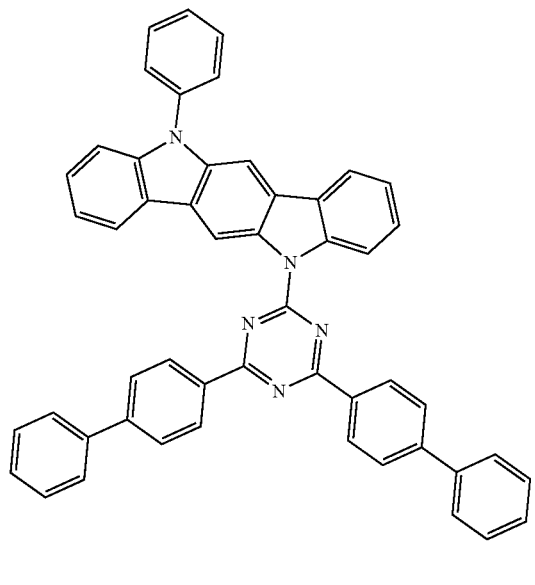
2-26
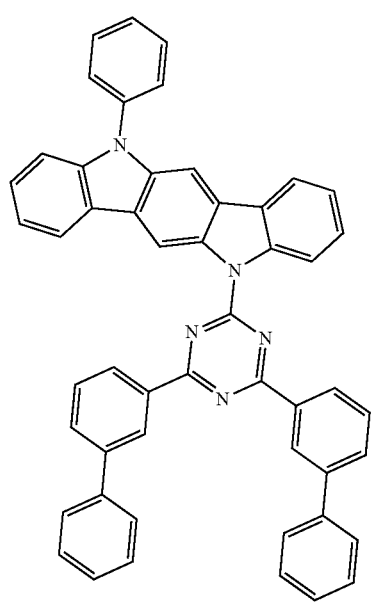
2-27
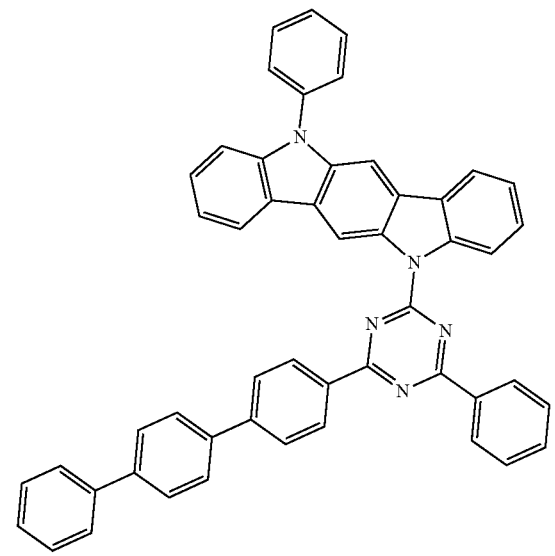
2-28
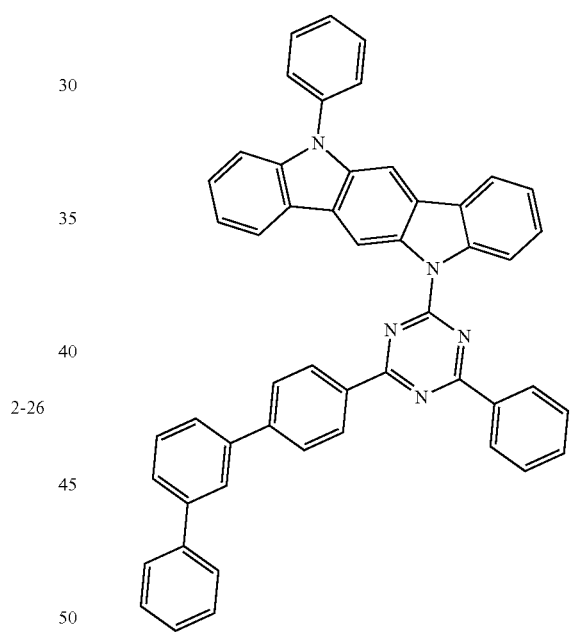
2-29
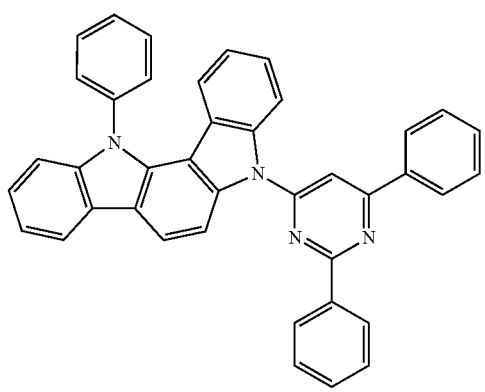

2-30
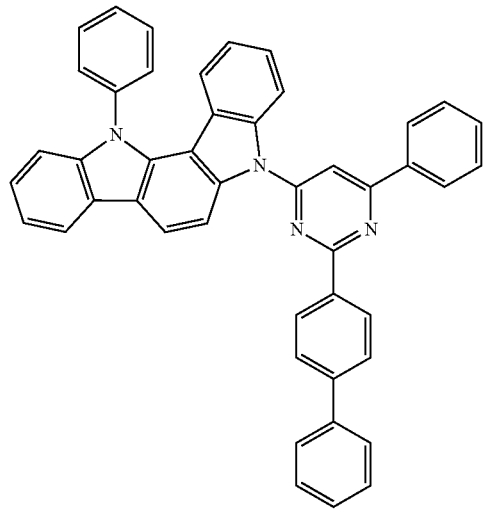
2-31
2-32
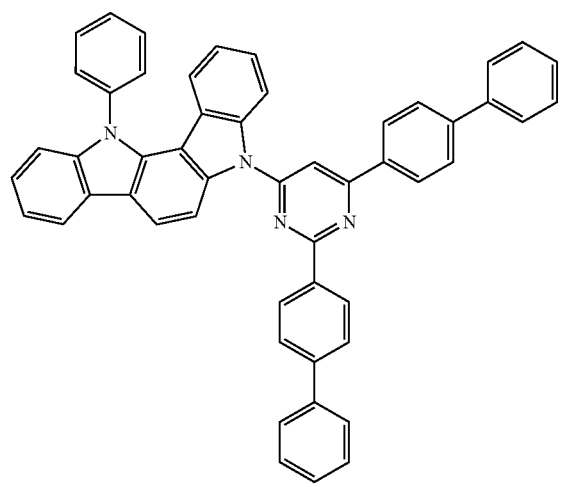
[C26]
2-33
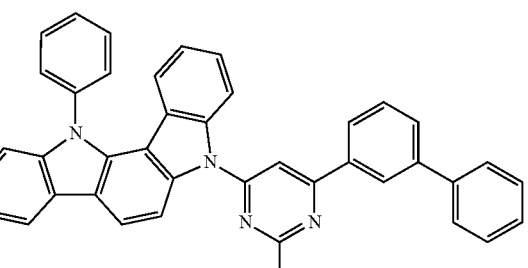
2-34
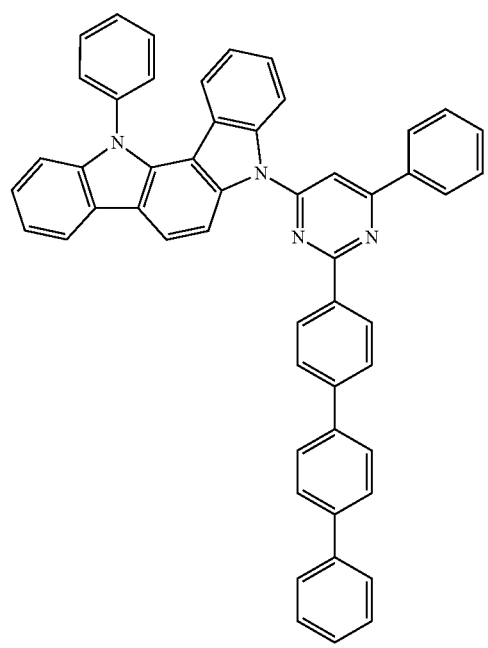
2-35
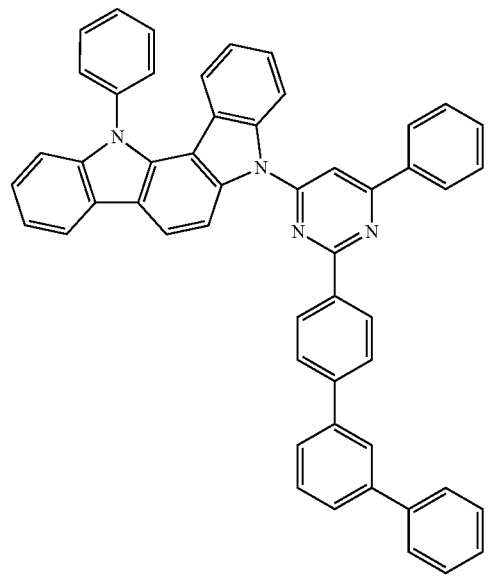

2-36
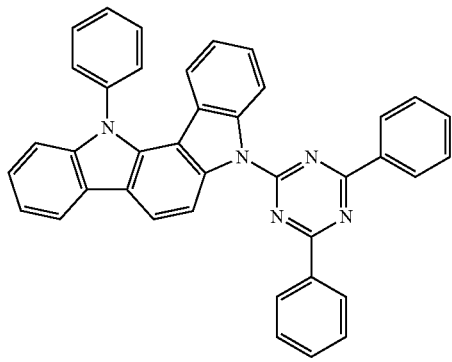
2-37
2-38
2-39
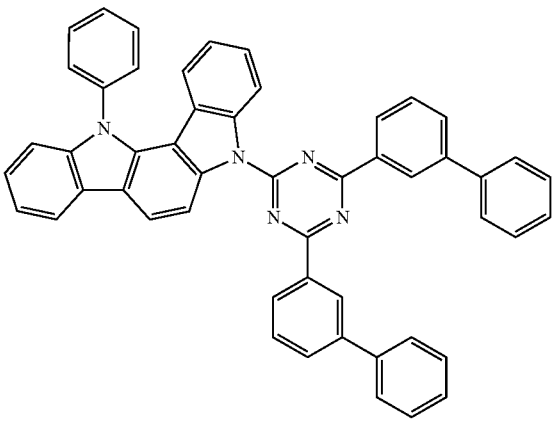
2-40
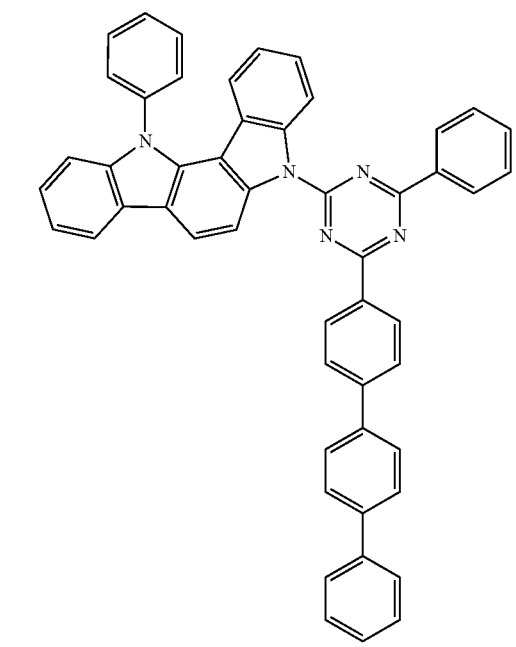

2-41
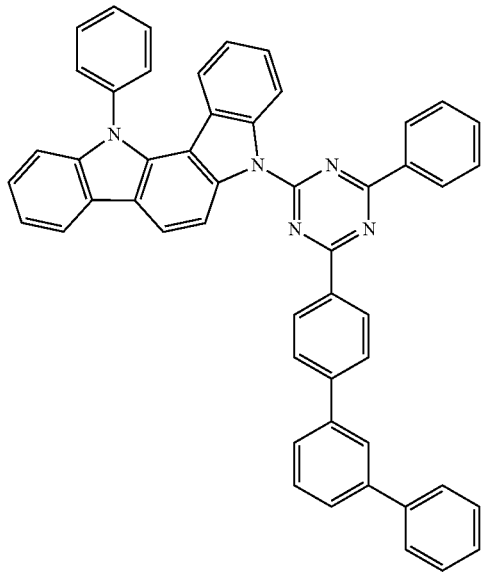
2-42
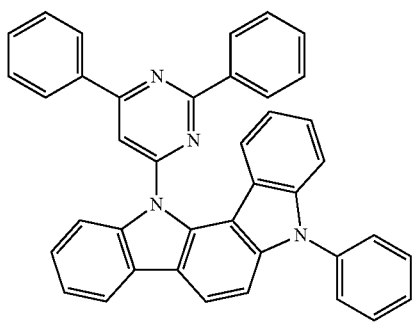
2-43
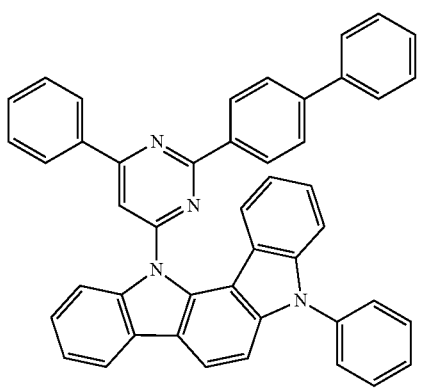
2-44
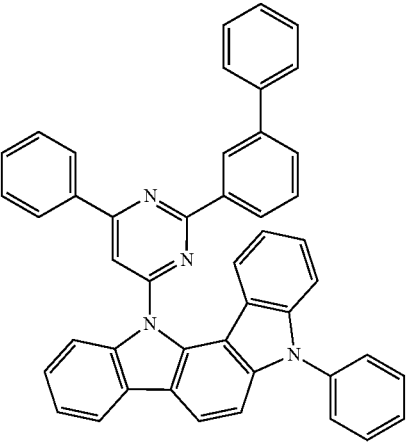
[C28]
2-45
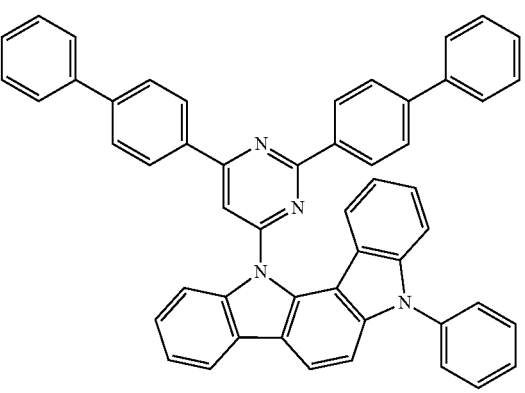
2-46
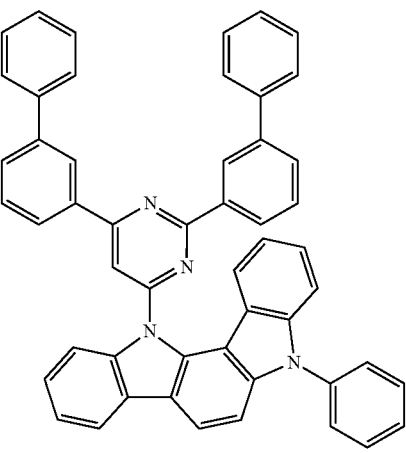

-continued
2-47
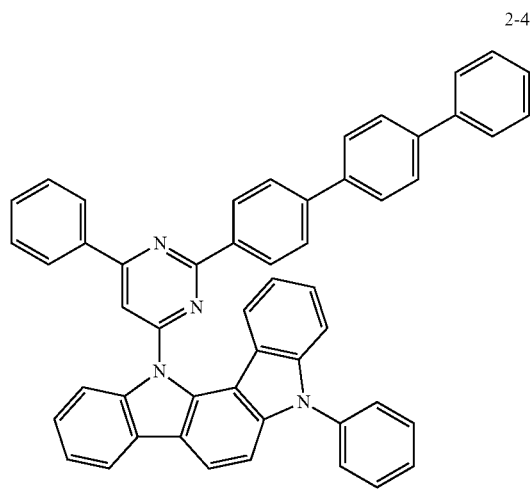
2-48
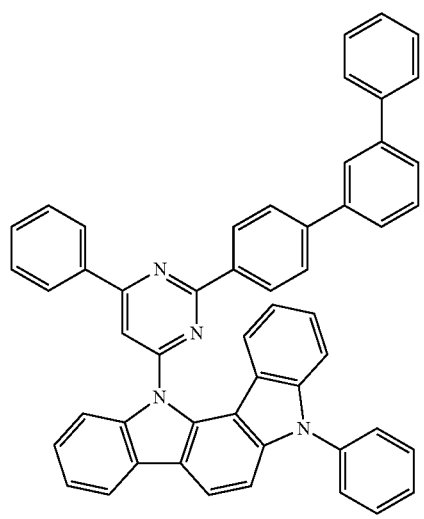
2-49
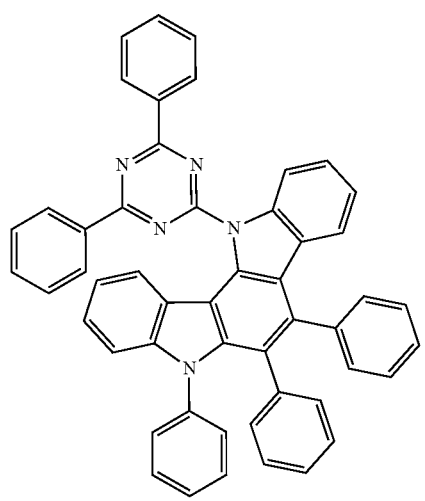
-continued
2-50
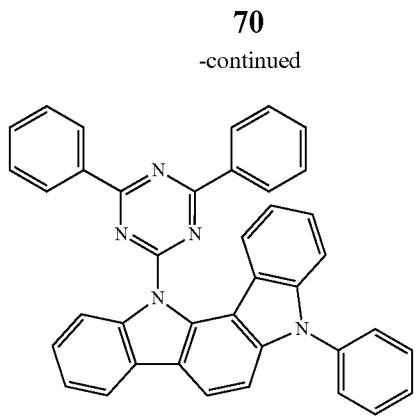
2-51
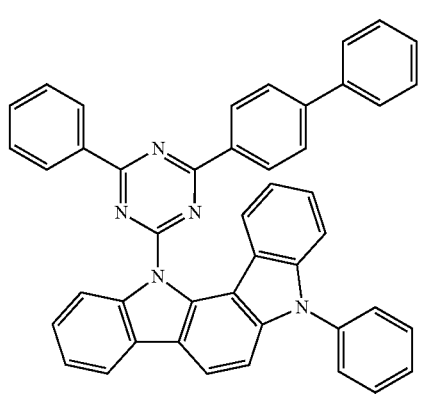
2-52
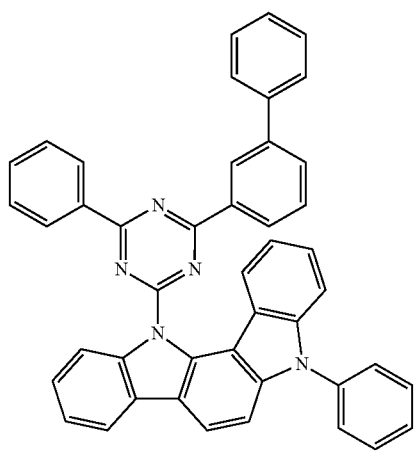
[C29]
2-53
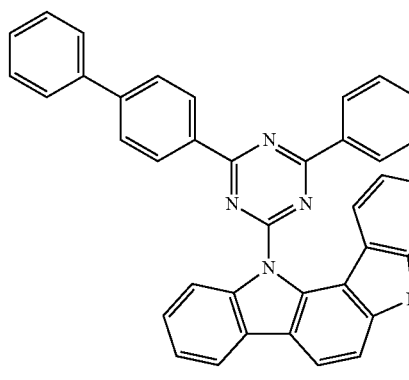

2-54
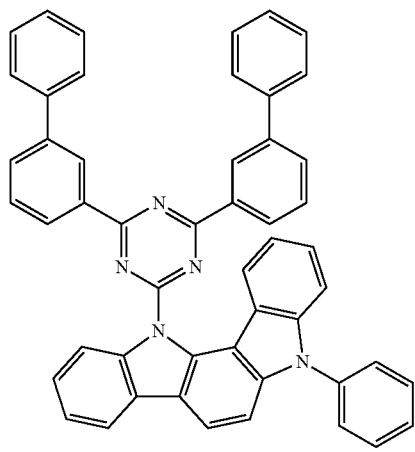
2-57
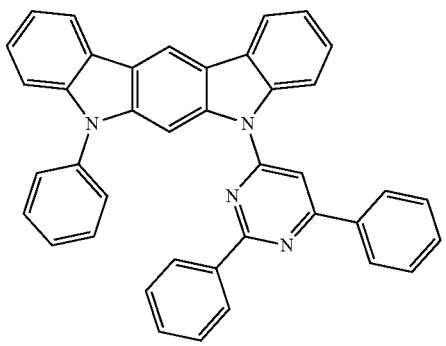
2-55
2-58
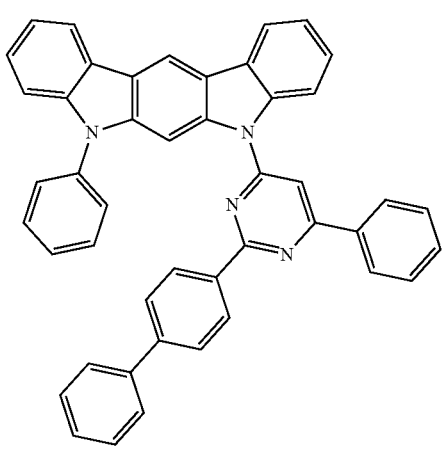
2-56
2-59
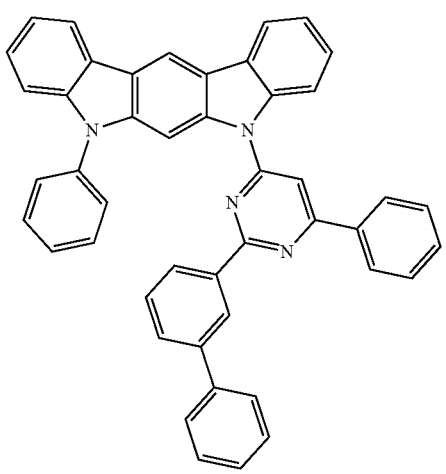

2-60
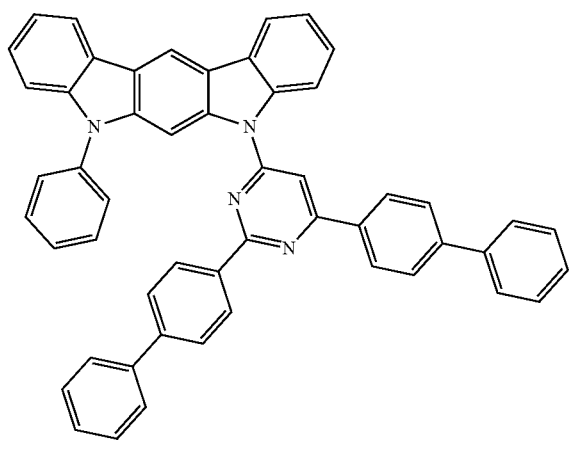
[C30]
2-61
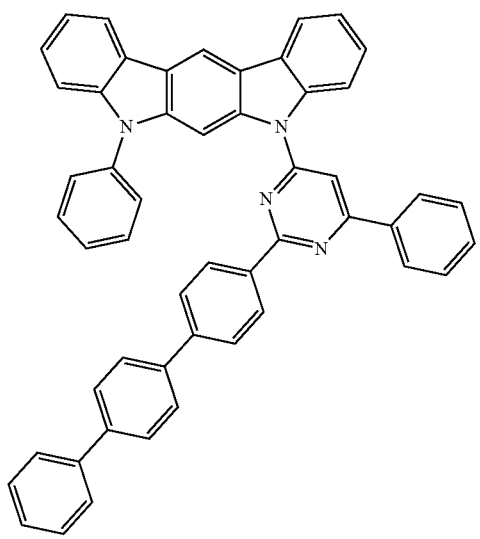
2-62
2-63
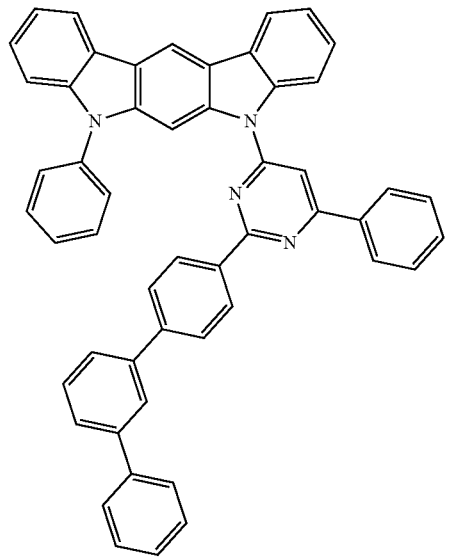
2-64
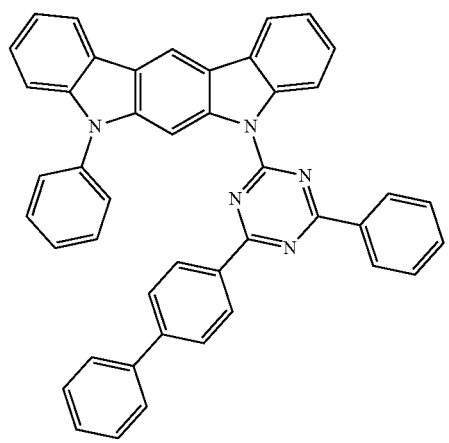
2-65
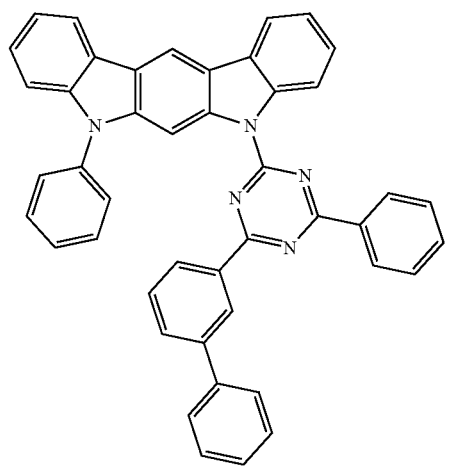

2-66
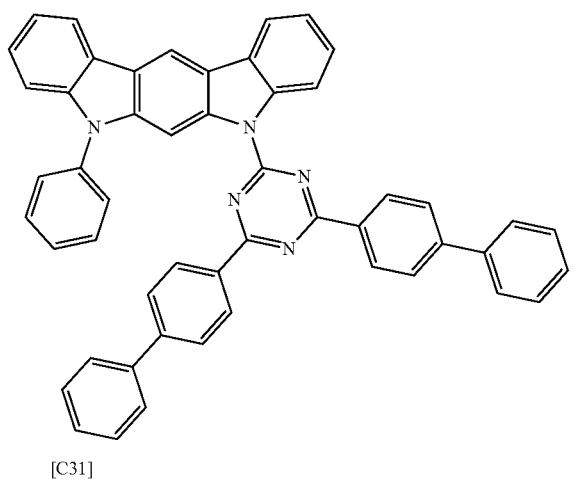
[C31]
2-67
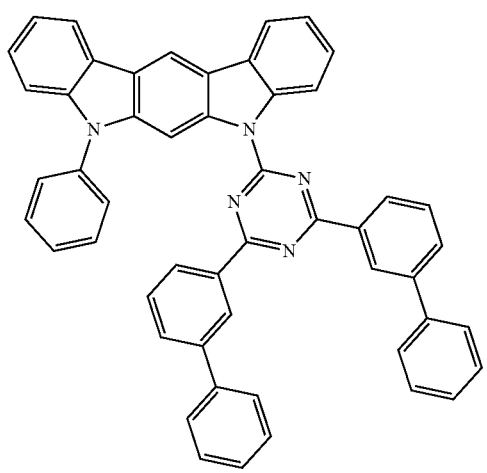
2-68
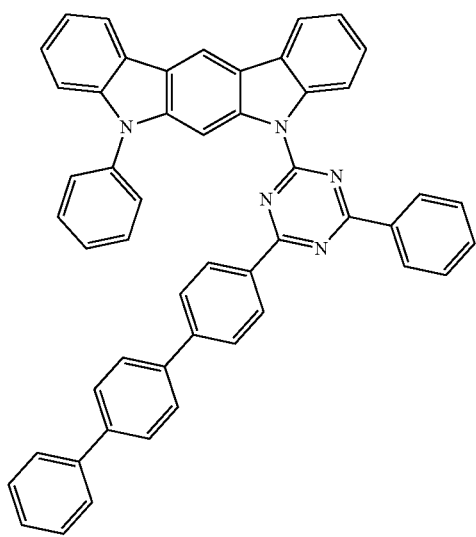
2-69
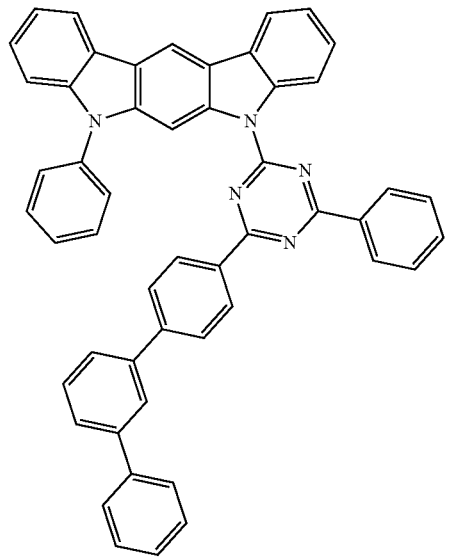
2-70
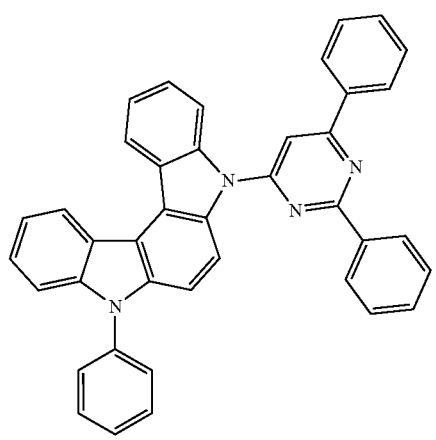
2-71
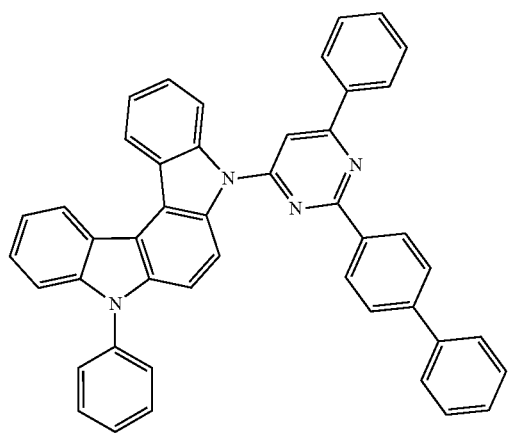

2-72
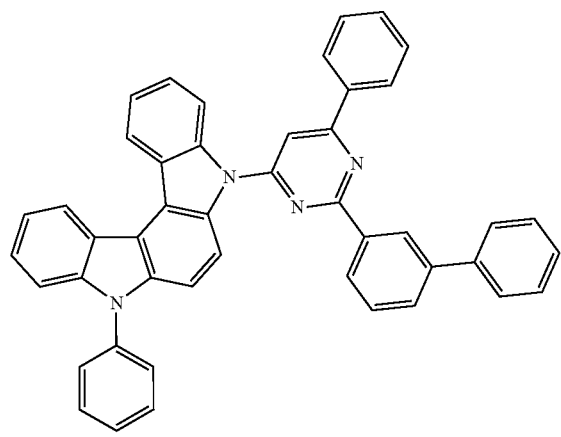
[C32]
2-73
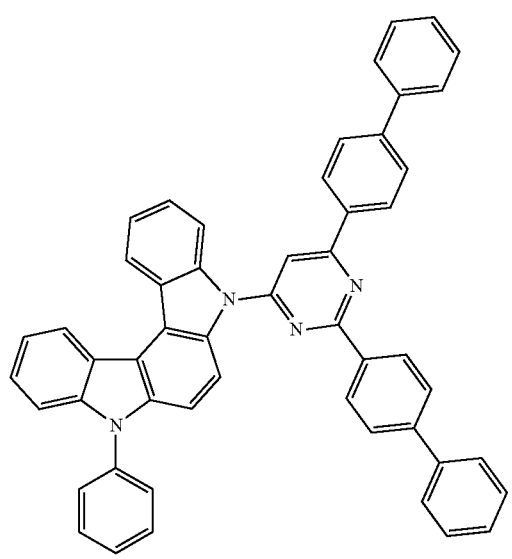
2-74
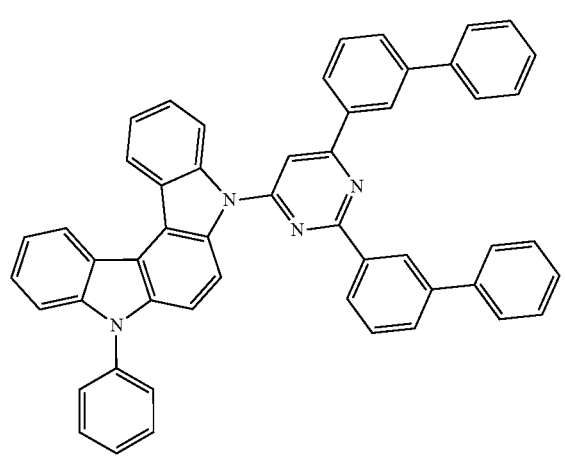
2-75
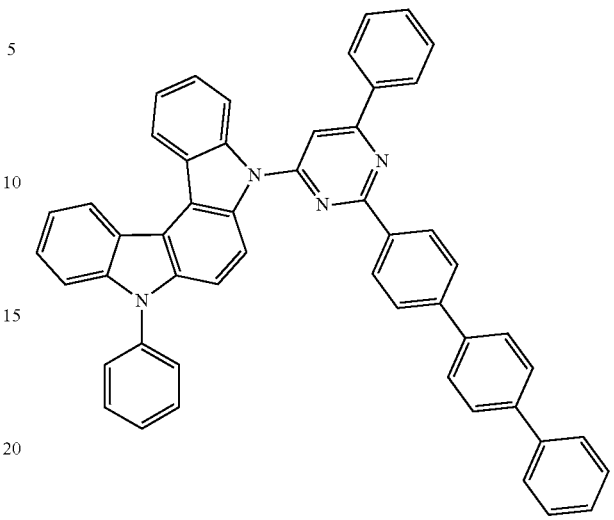
2-76
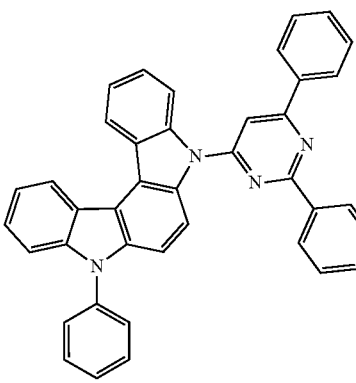
2-77
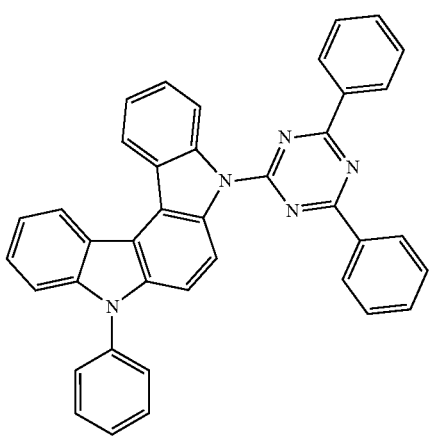

2-78
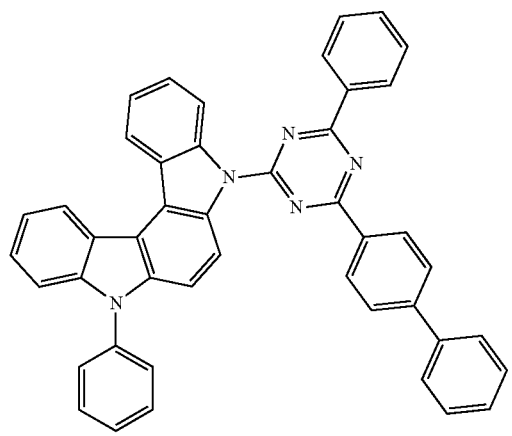
[C33]
2-79
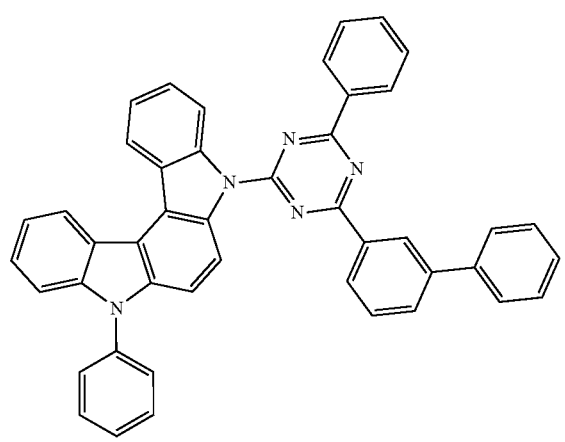
2-80
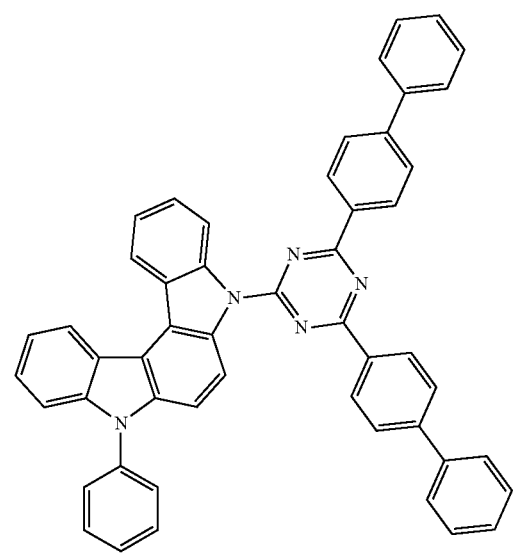
2-81
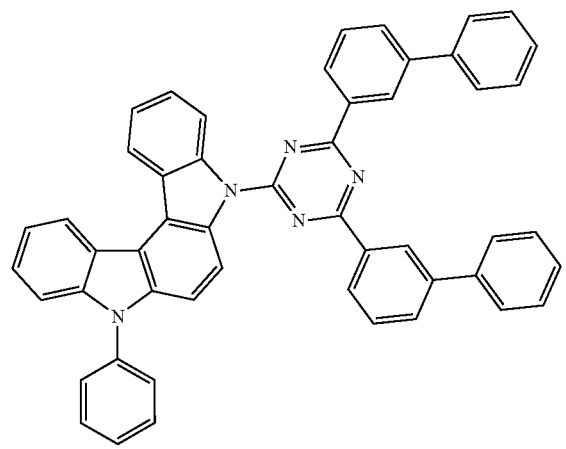
2-82
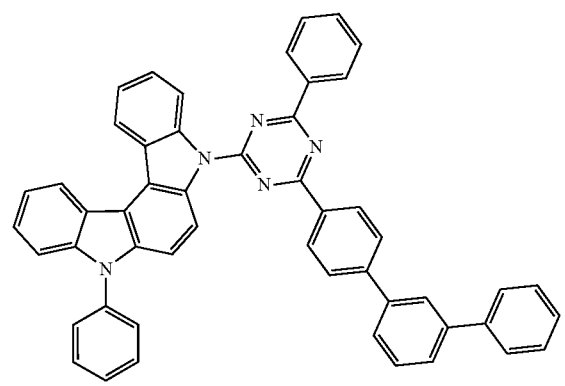
2-83

2-84
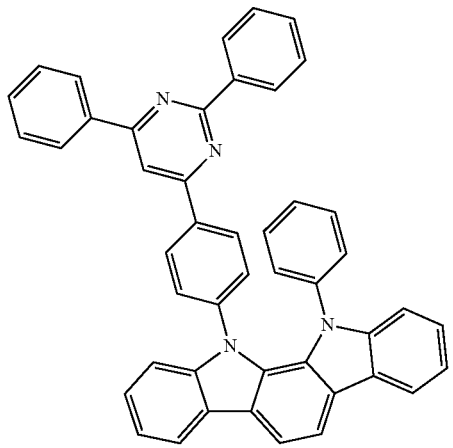
[C34]
2-85
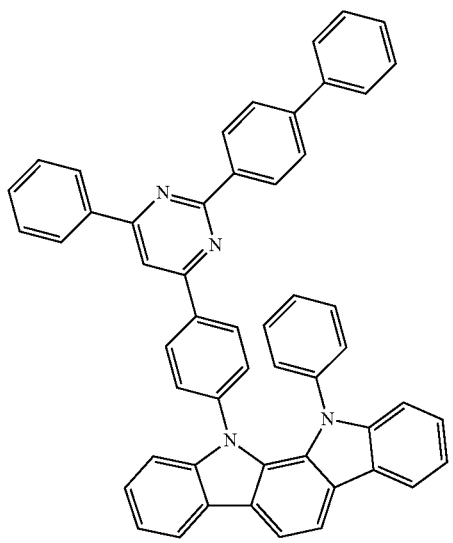
2-86
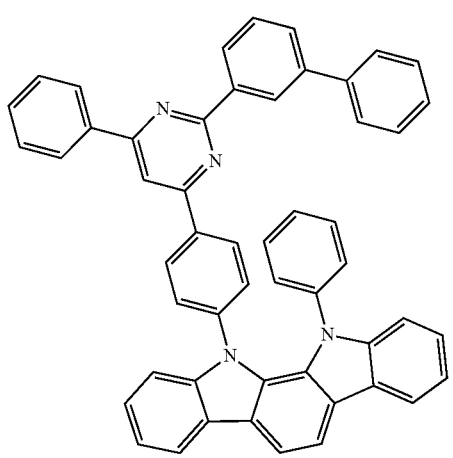
2-87
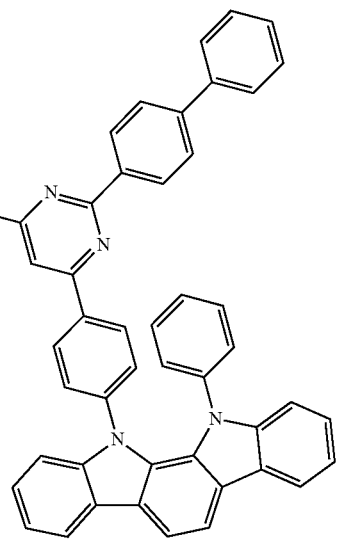
2-88
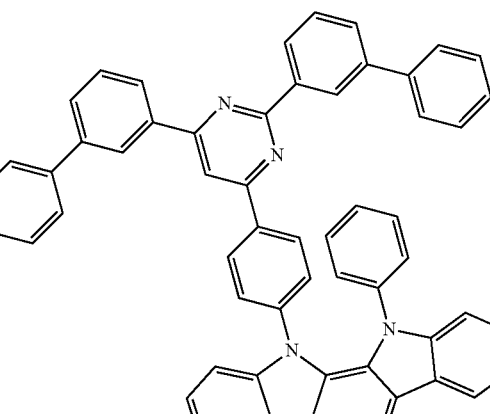
2-89
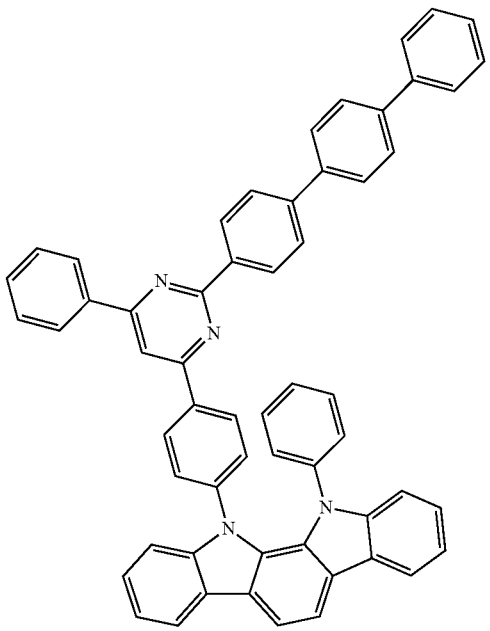

2-90
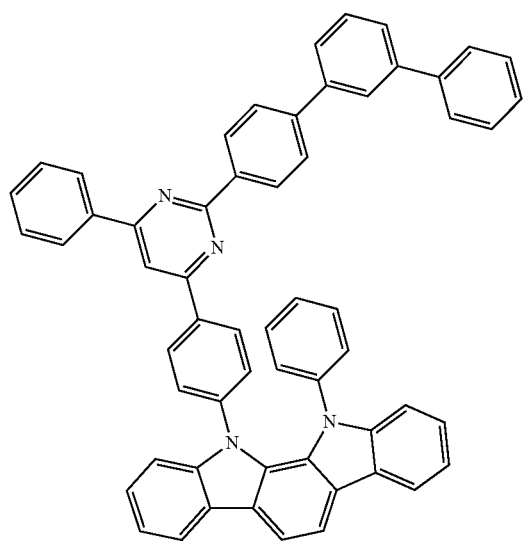
[C35]
2-91
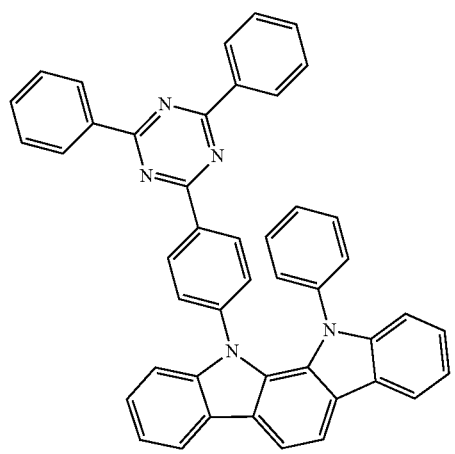
2-92
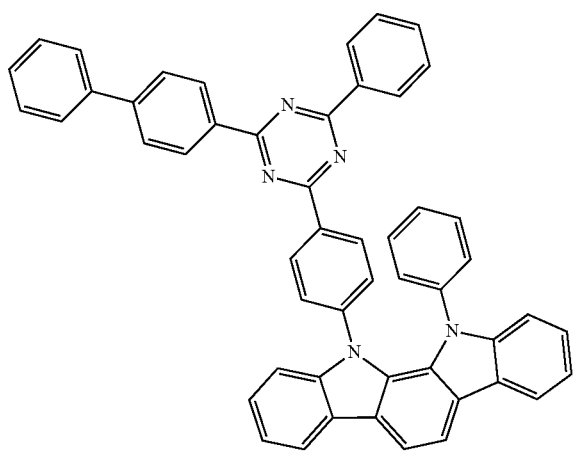
2-93
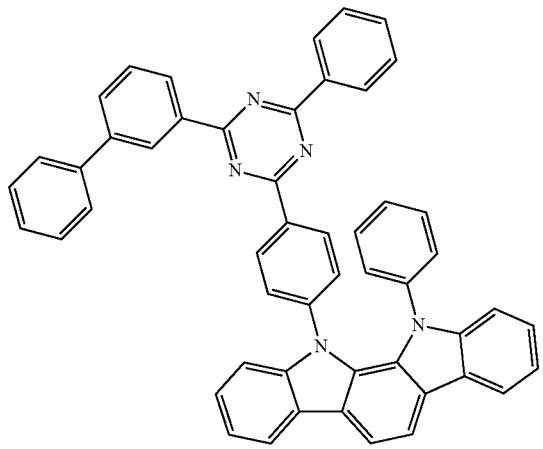
2-94
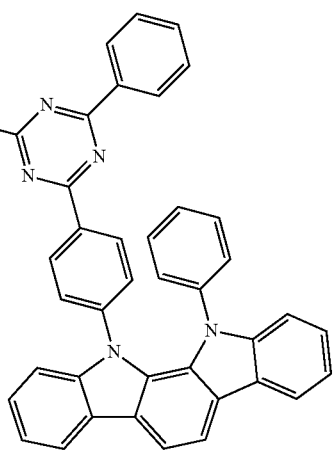
2-95
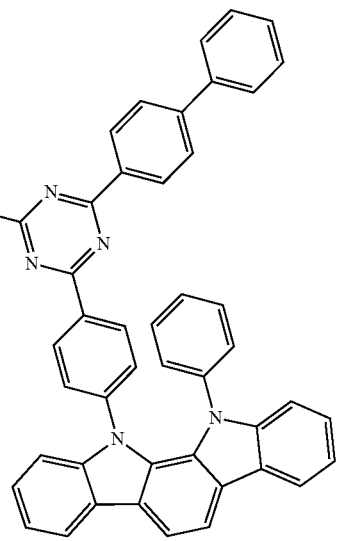

2-96
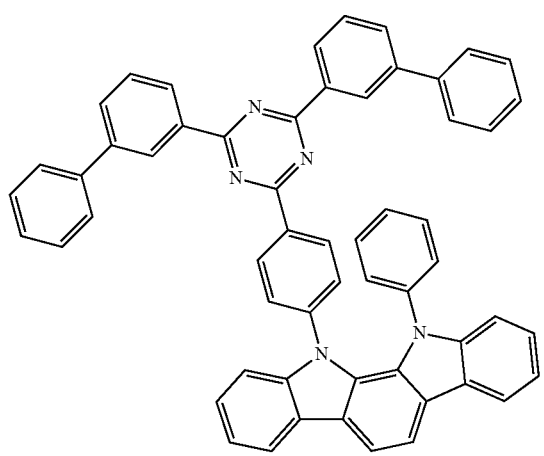
2-98
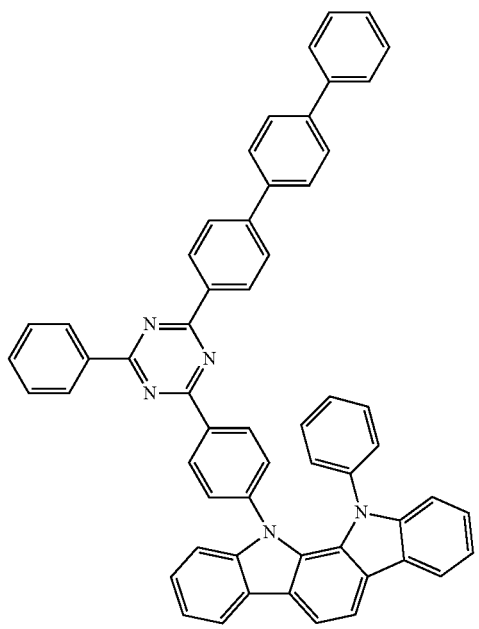
[C36]
2-97
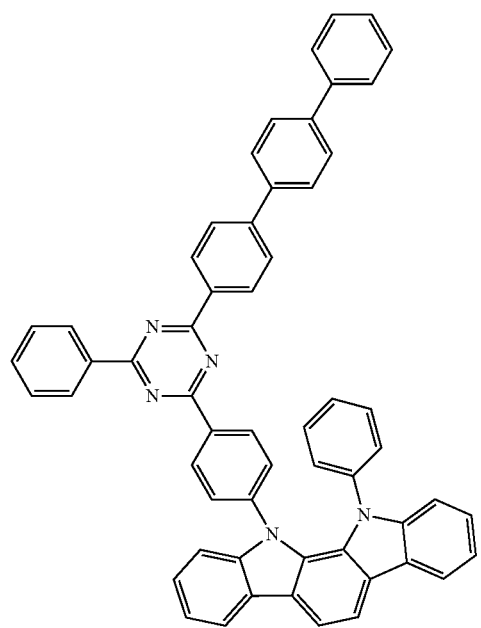
2-99
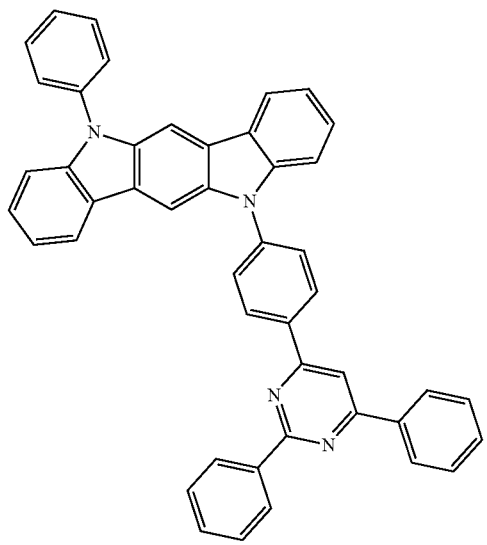

2-100
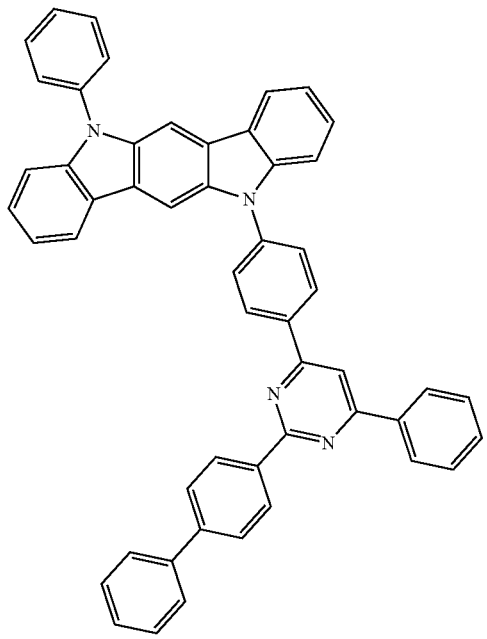
2-102
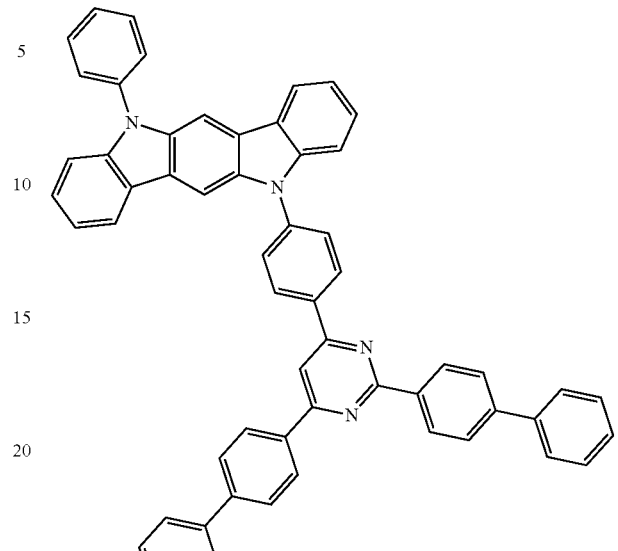
[C37]
2-101
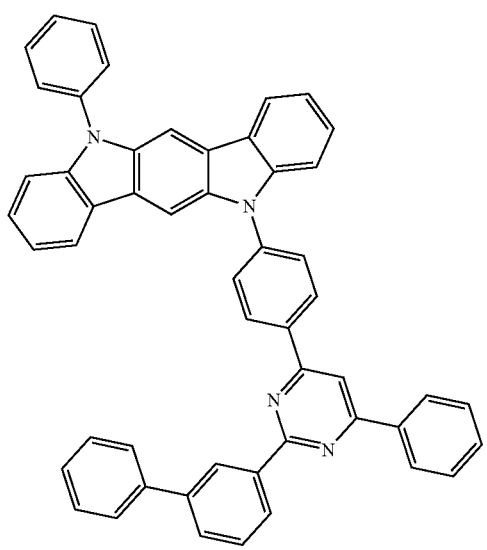
2-103
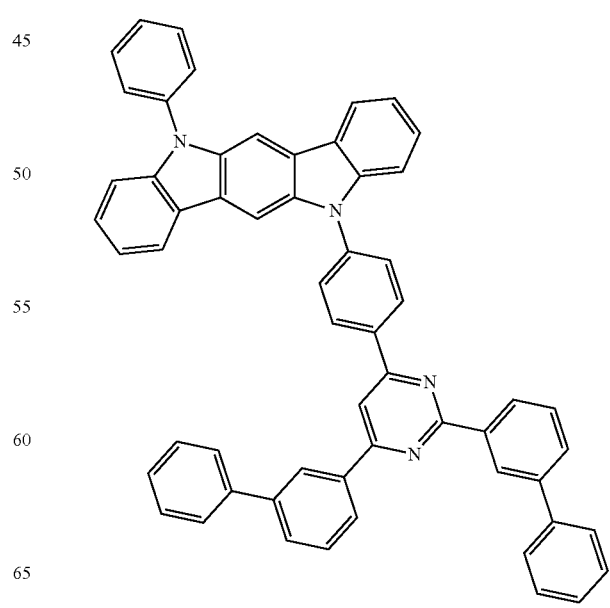

2-104
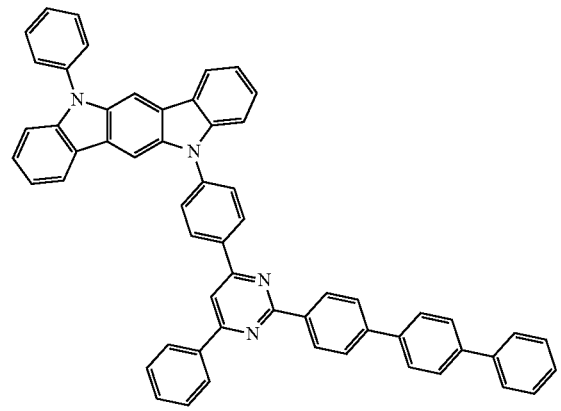
2-105
2-106
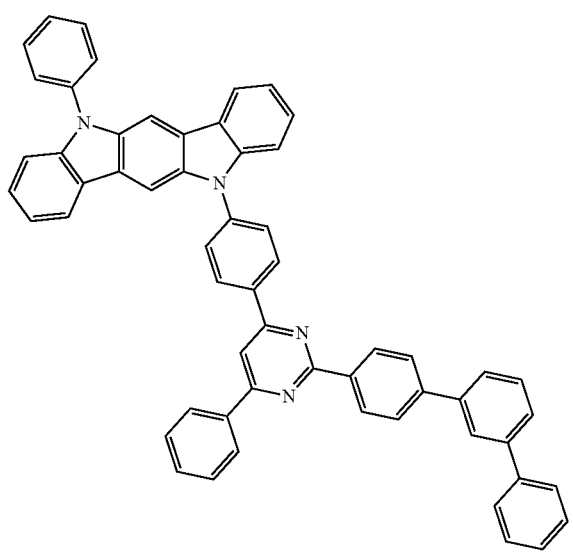
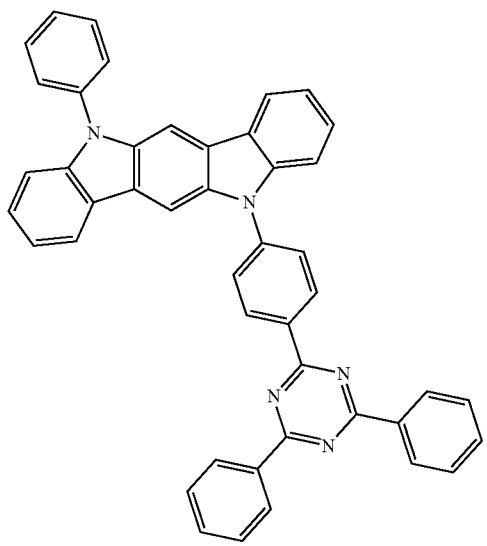
2-107
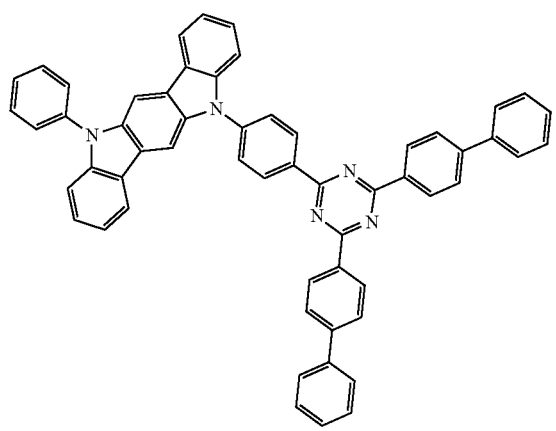
2-108
2-109

2-110
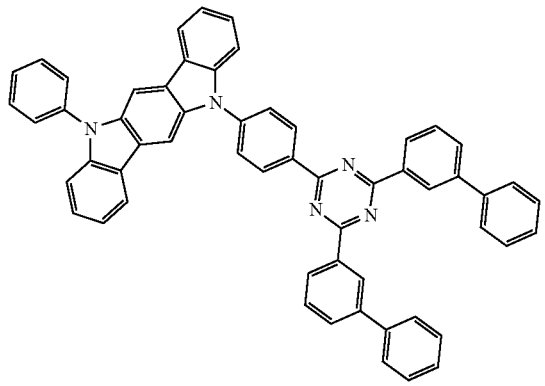
2-111
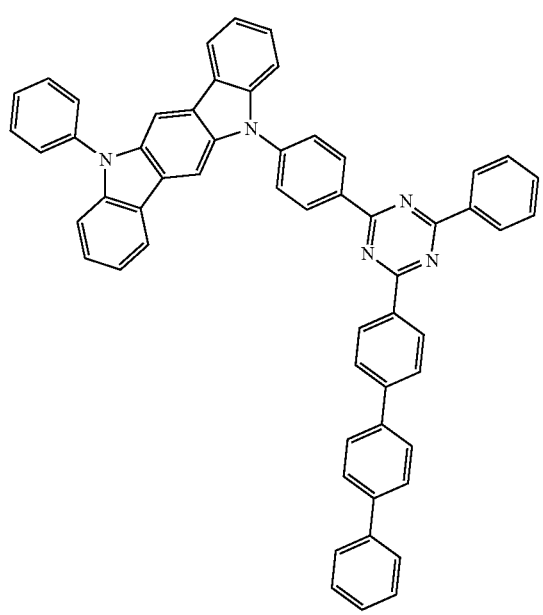
2-112
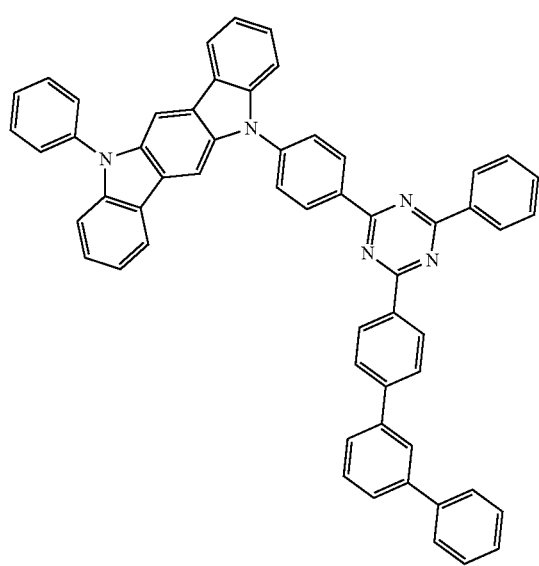
2-113
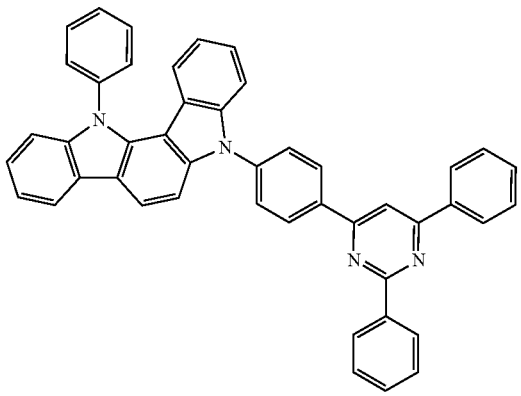
2-114
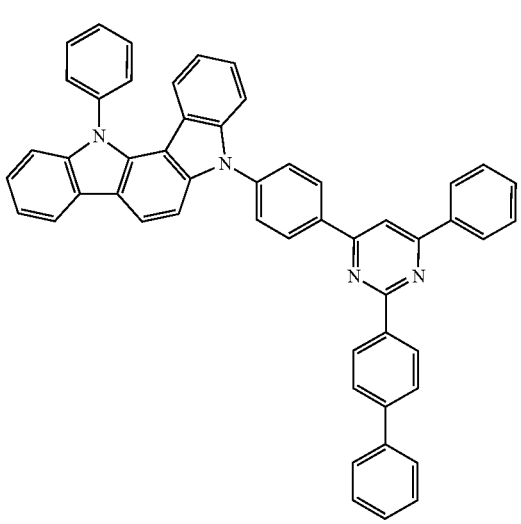
[C39]
2-115
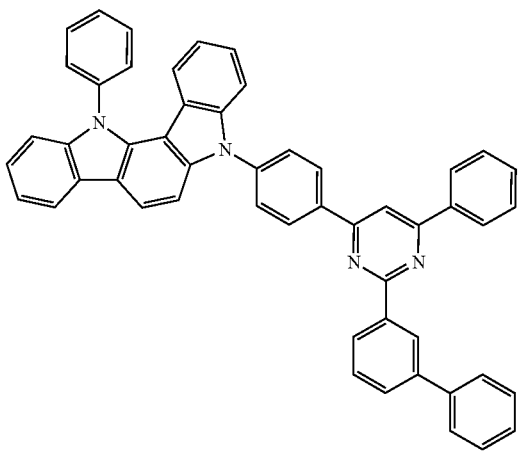

2-116
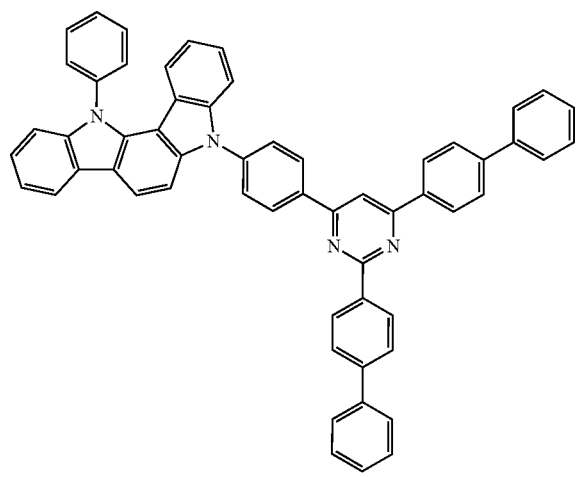
2-117
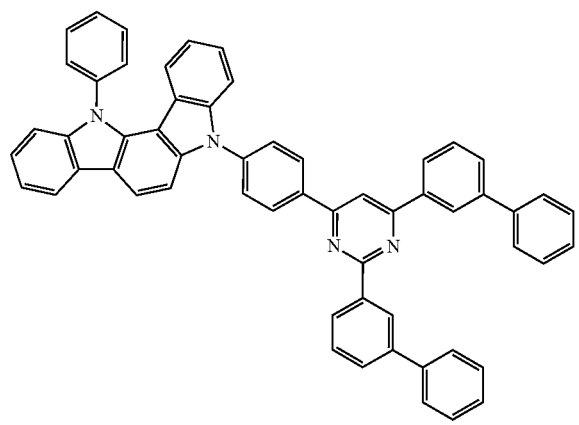
2-118
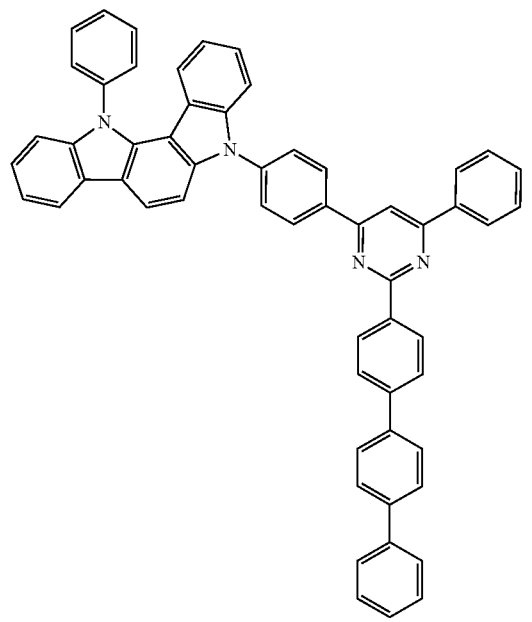
2-119
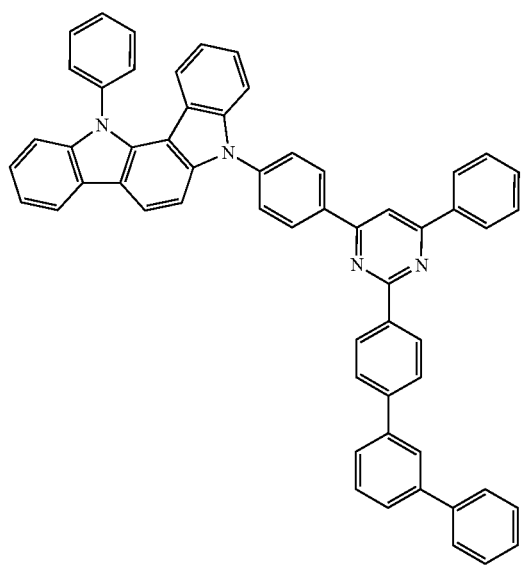
2-120
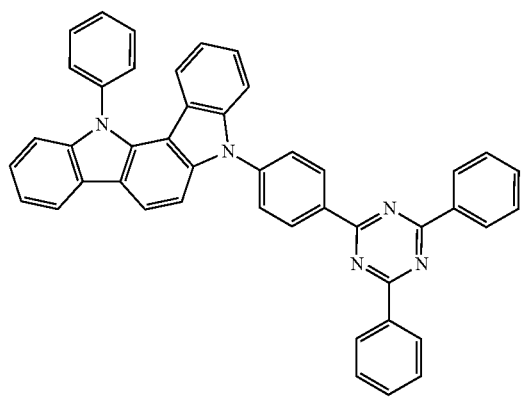
[C40]
2-121
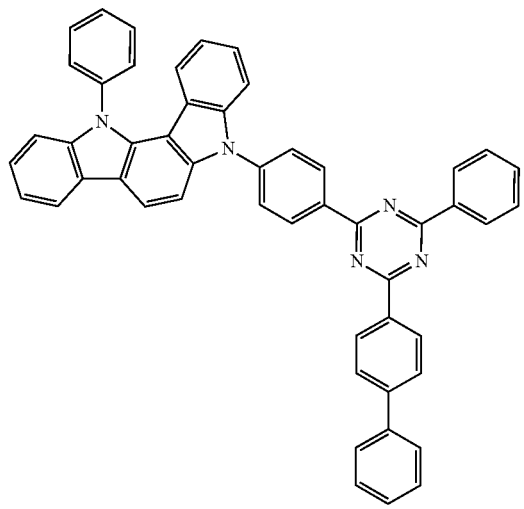

2-122
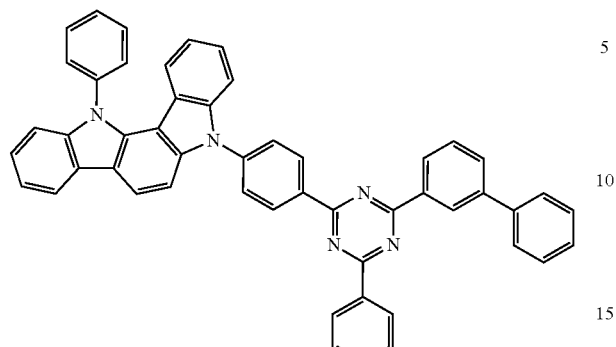
2-123
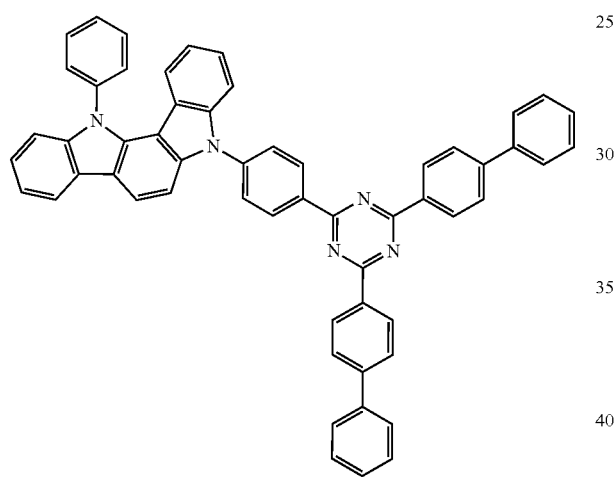
2-124
2-125
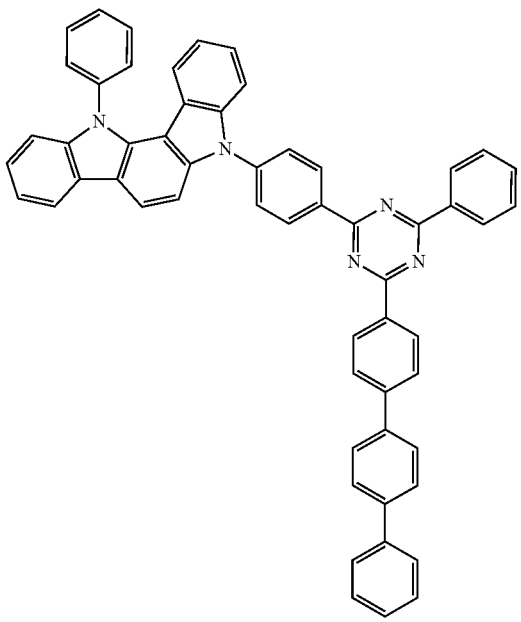
2-126
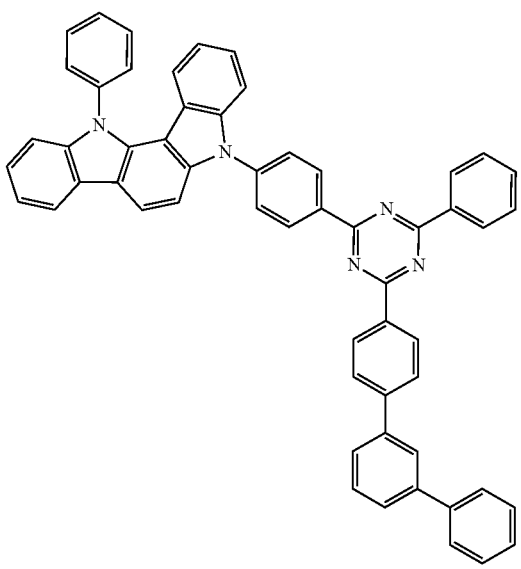

[C41]
2-127
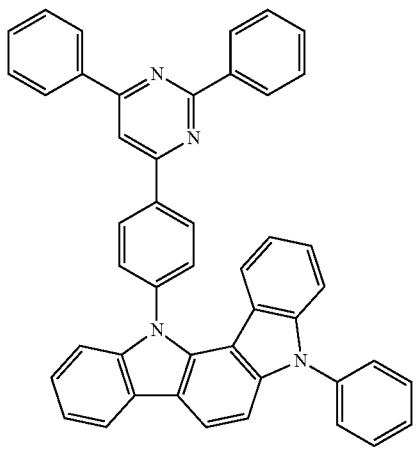
2-128
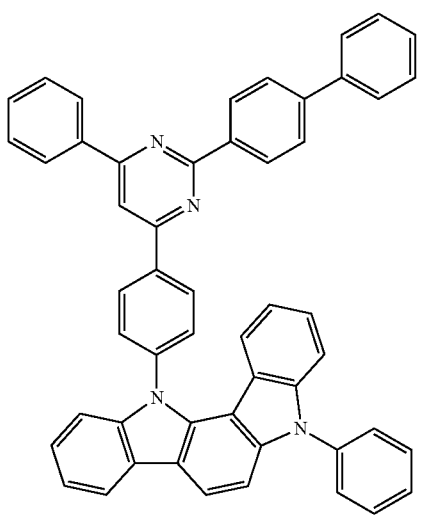
2-129
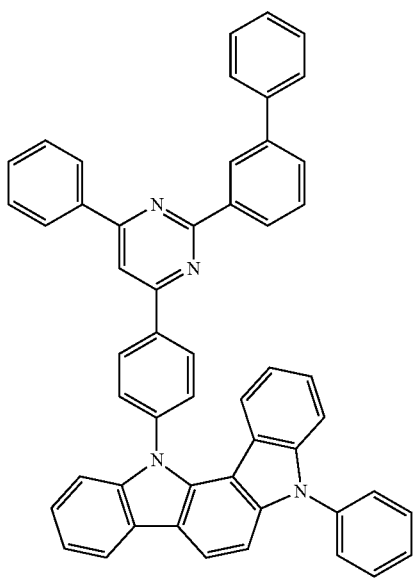
2-130
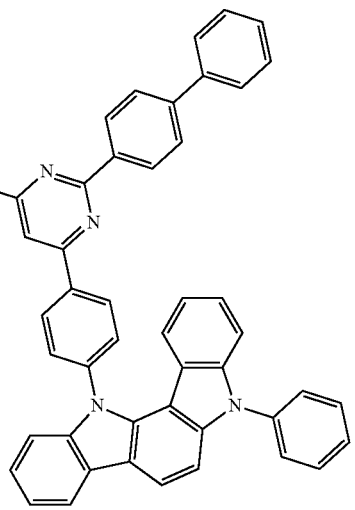
2-131
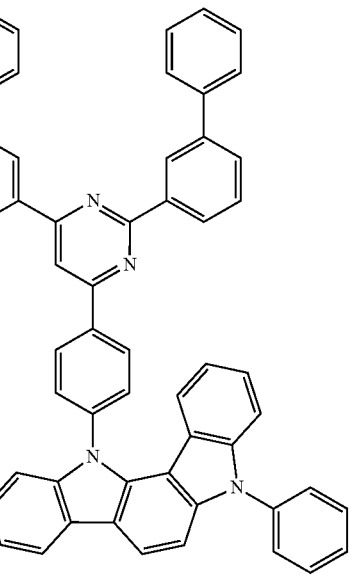

2-132
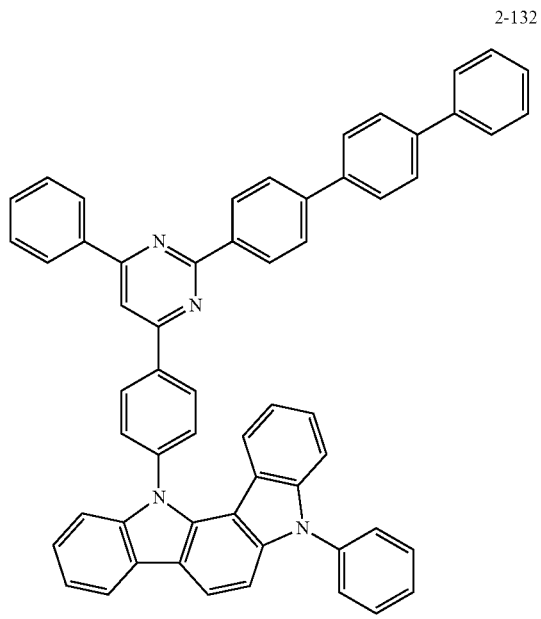
[C42]
2-133
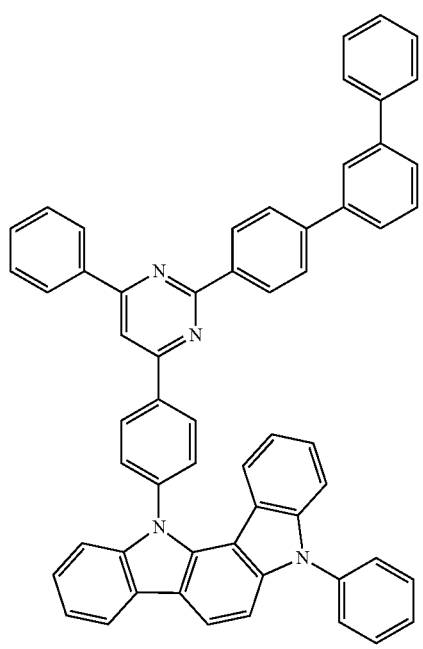
2-134
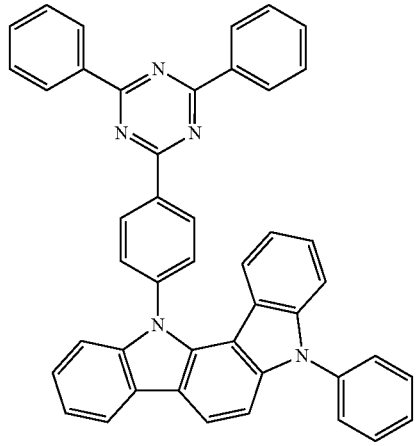
2-135
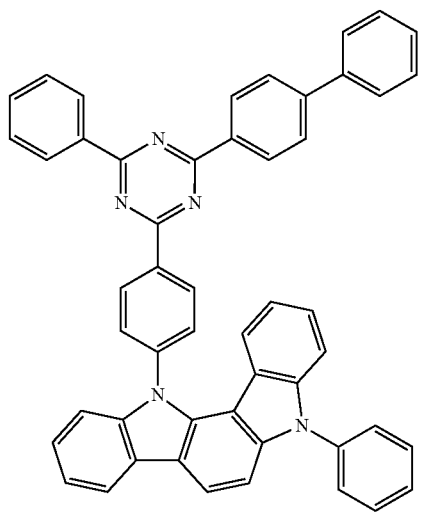
2-136
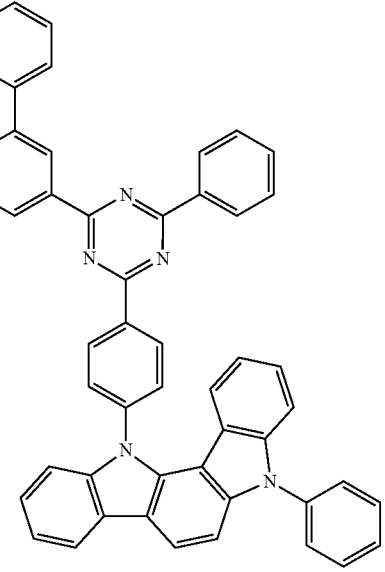

2-137
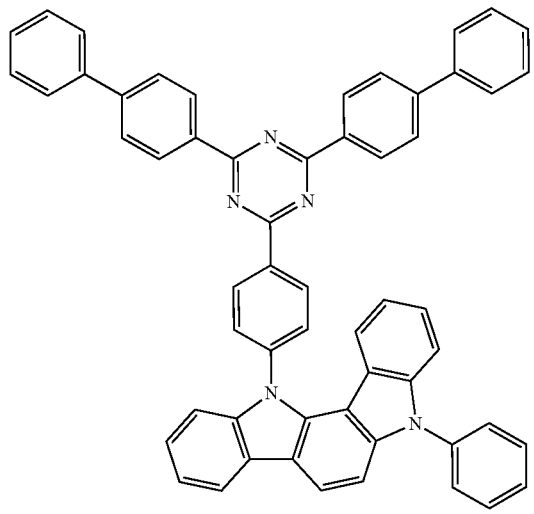
2-138
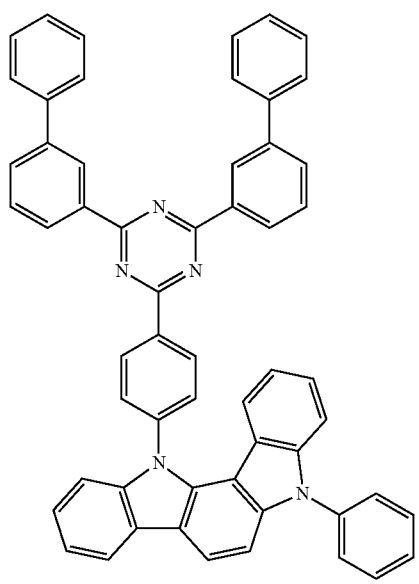
2-139
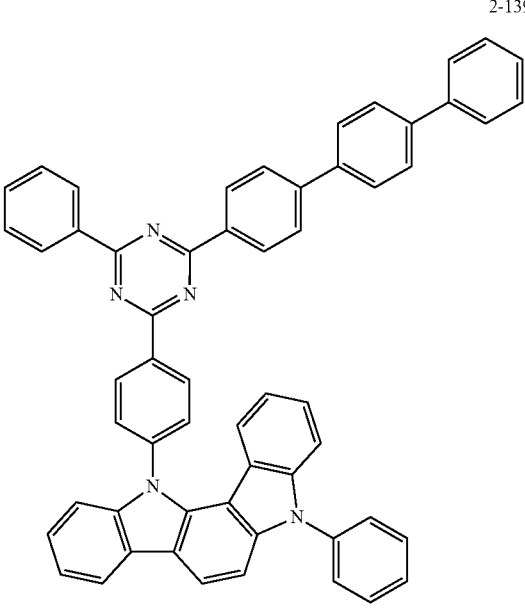
2-140
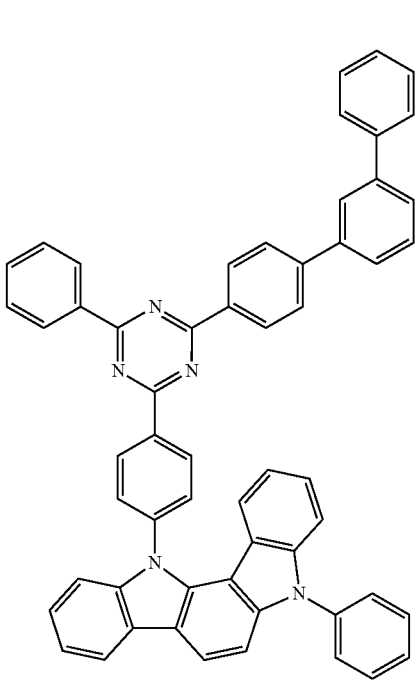

-continued
2-141
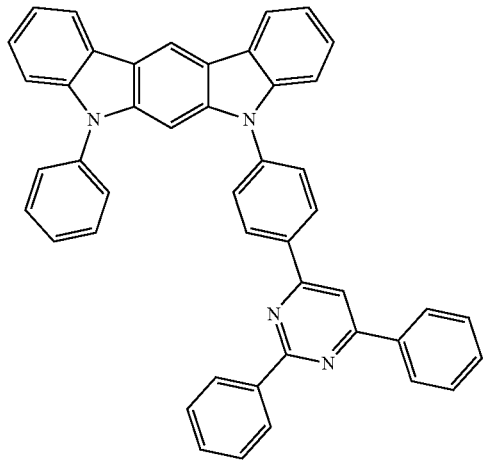
2-142
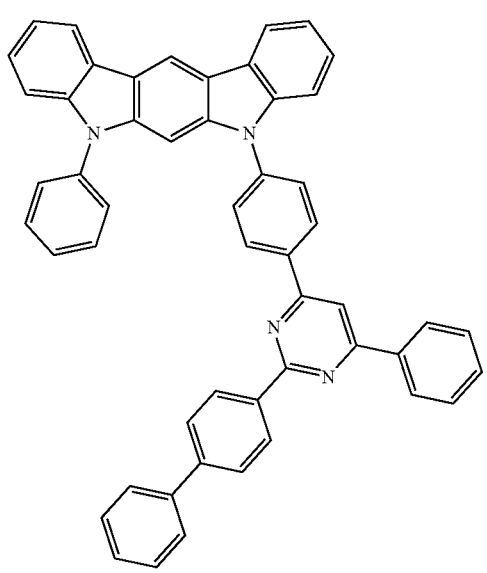
2-143
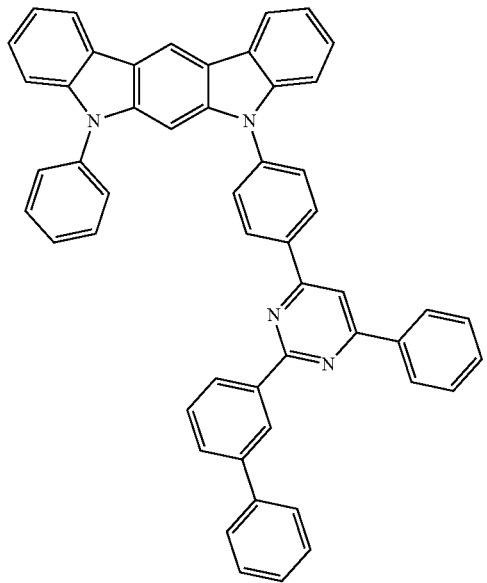
-continued
2-144
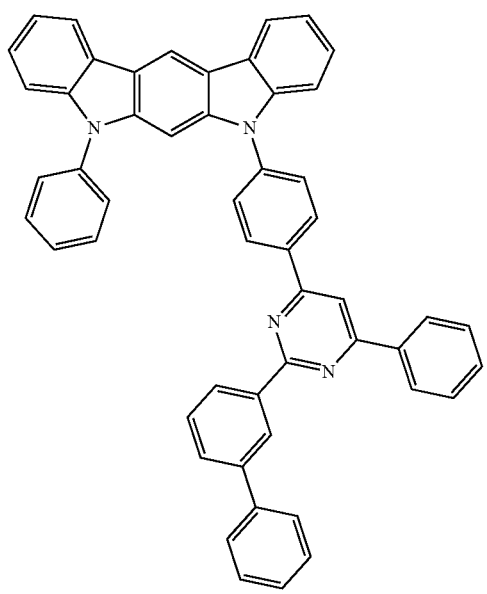
[C44]
2-145
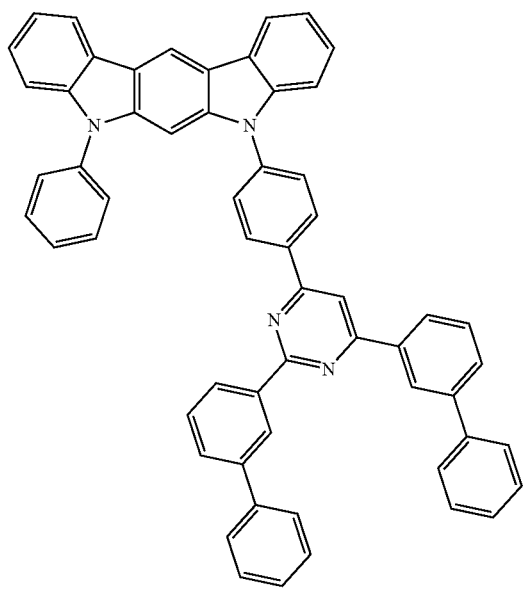
2-146
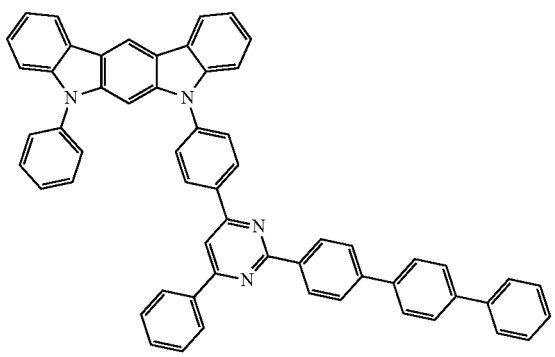

2-147
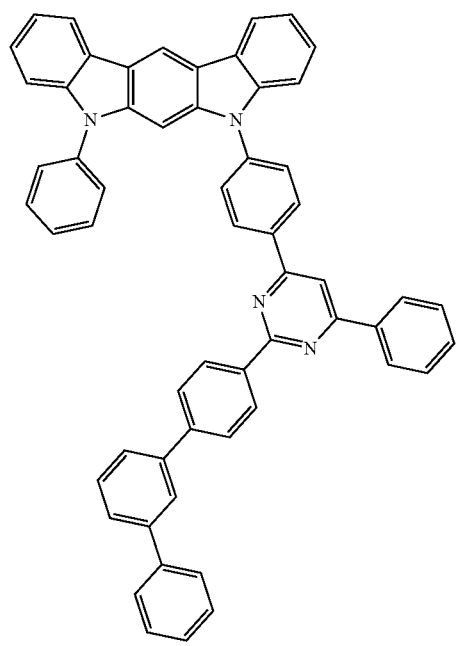
2-149
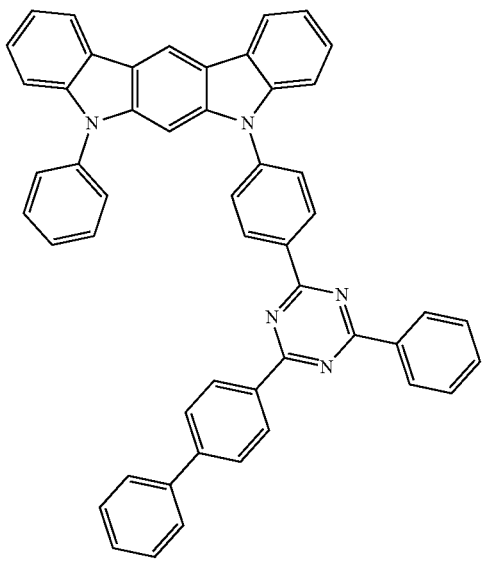
2-148
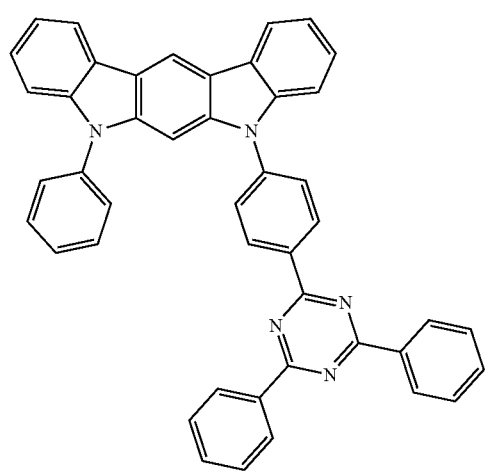
2-150
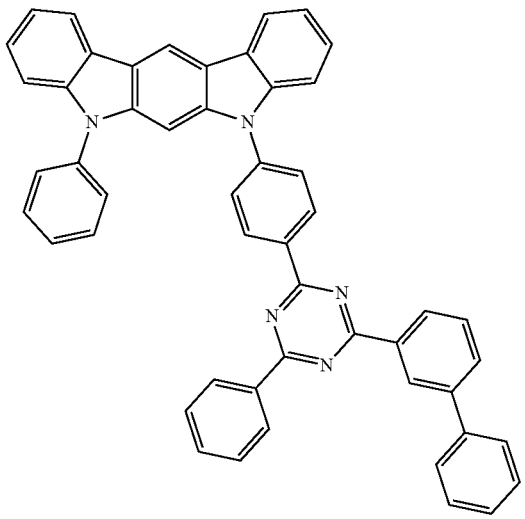

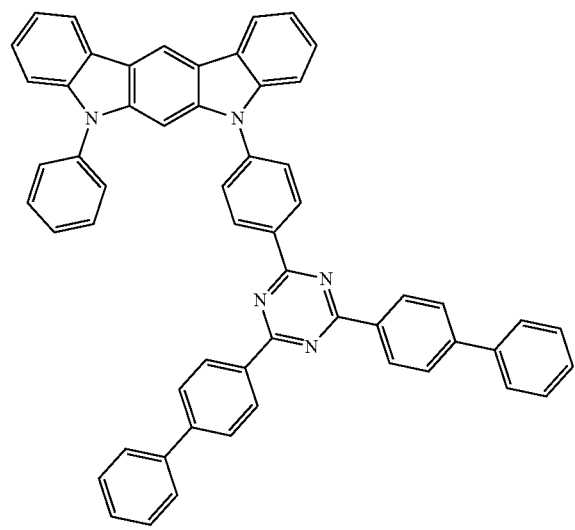
2-151
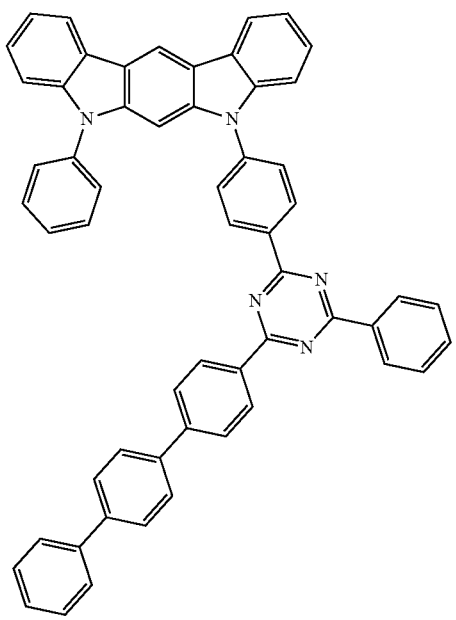
2-153
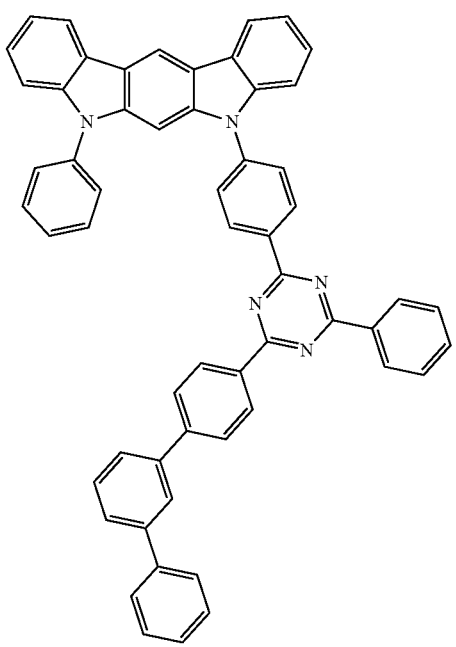
2-154
2-152

2-155
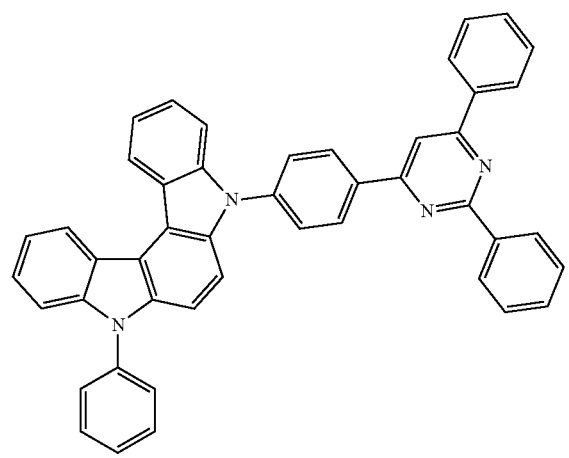
2-158
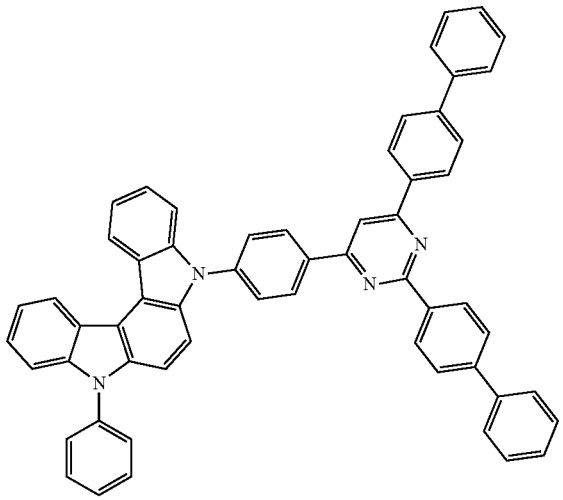
2-156
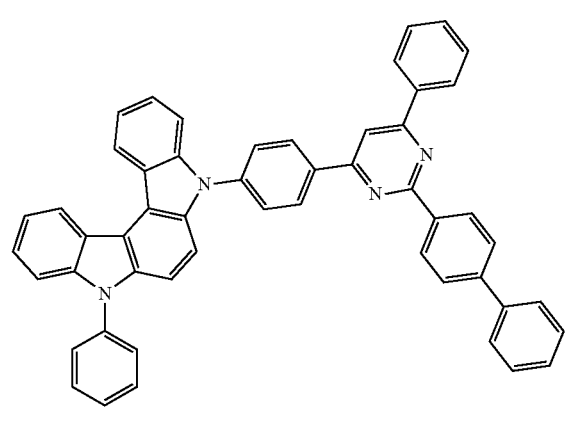
2-159
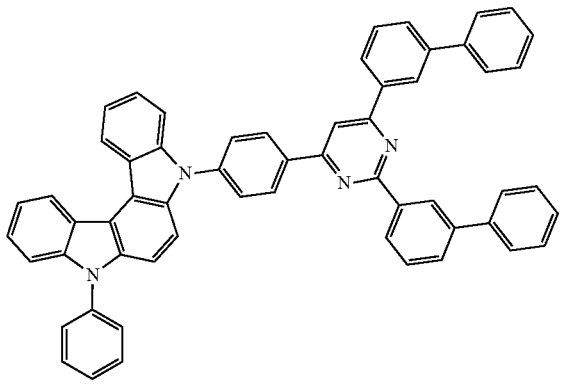
[C46]
2-157
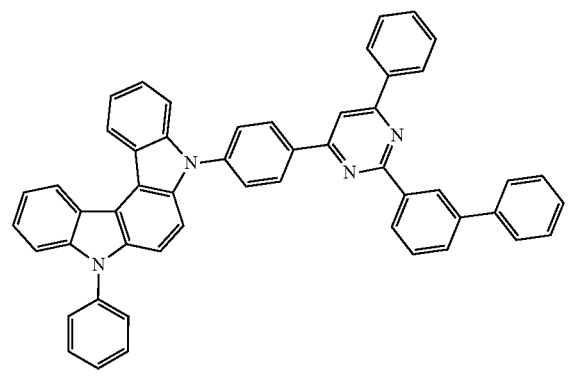
2-160
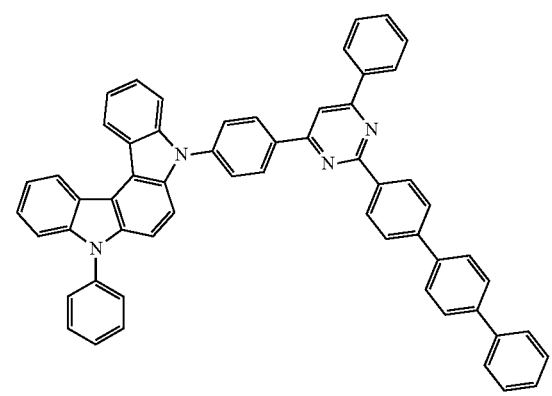

2-161
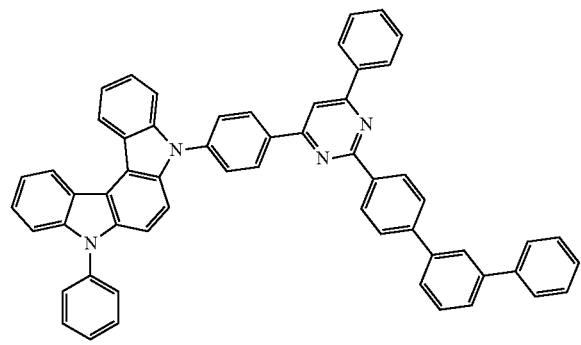
2-162
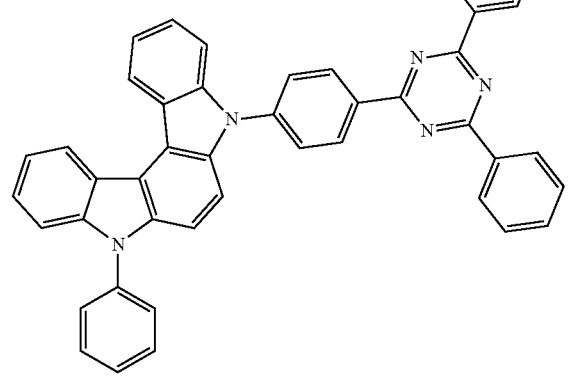
2-163
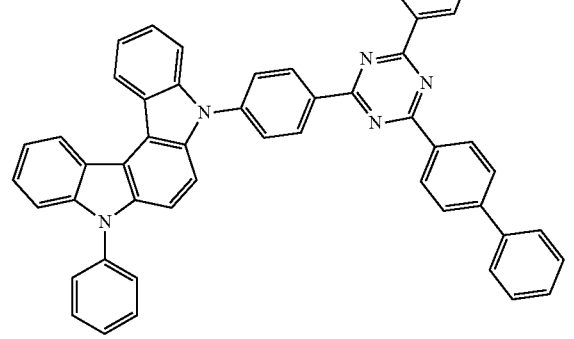
2-164
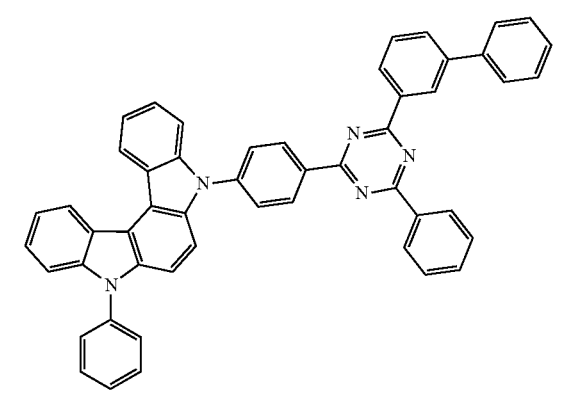
[C47]
2-165
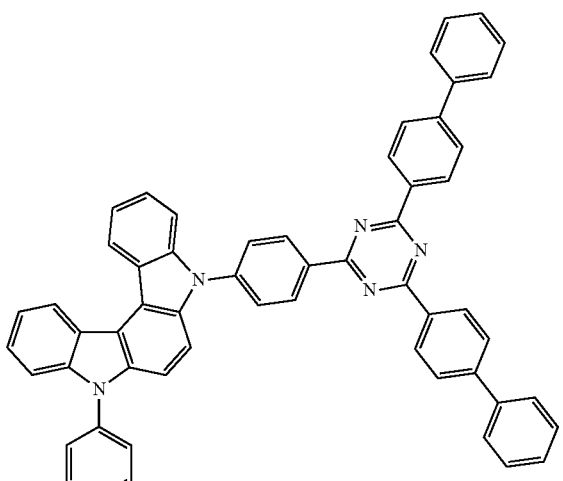
2-166
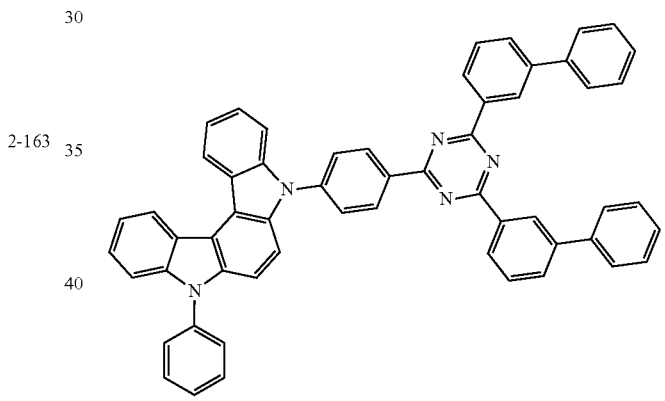
2-167
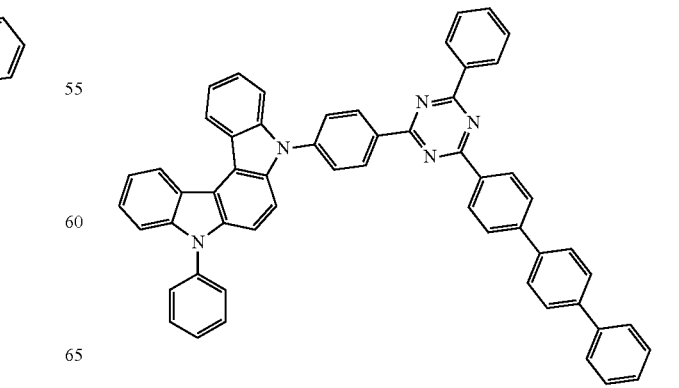

-continued
2-168
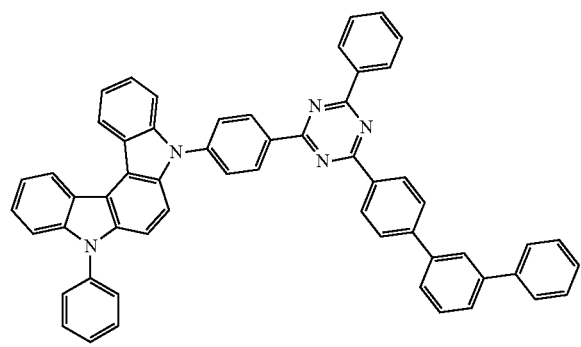
2-169
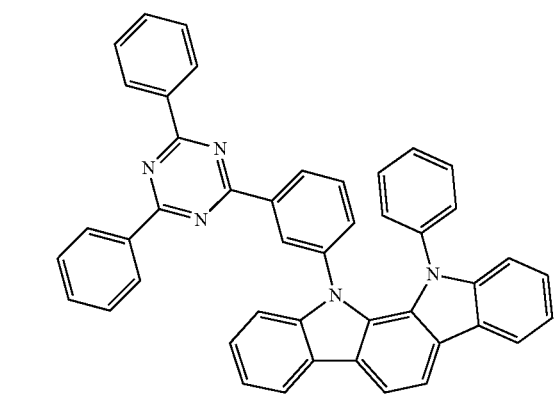
2-170
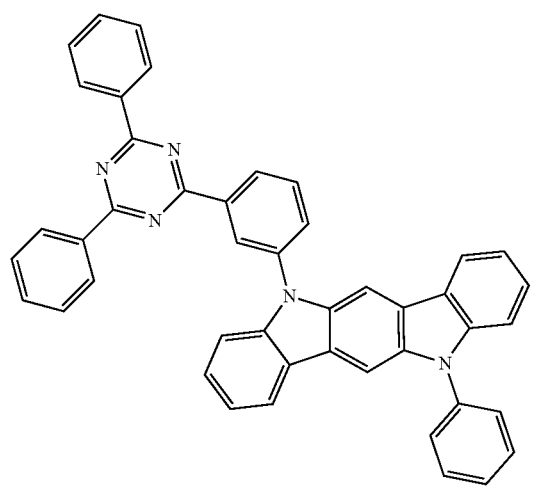
-continued
2-171
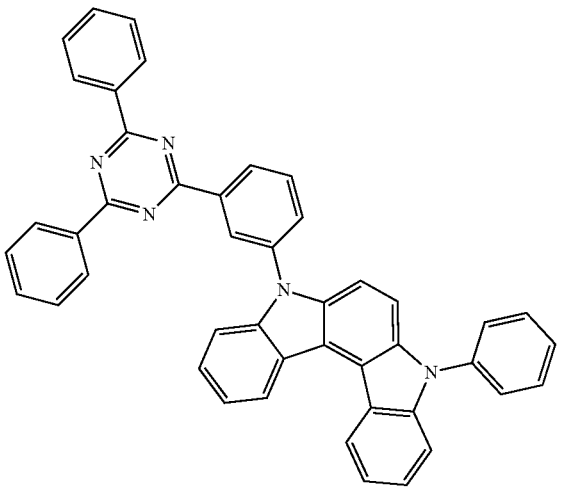
2-172
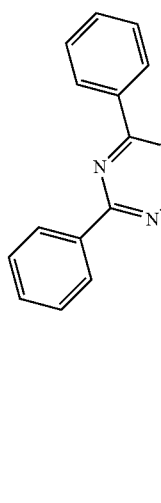
[C48]
2-173
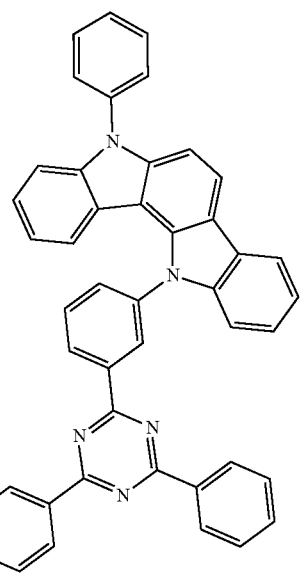

2-174
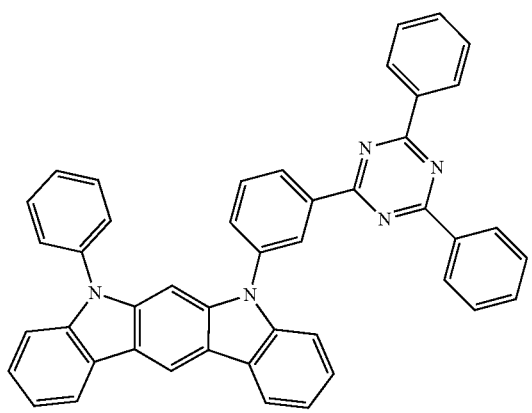
2-175
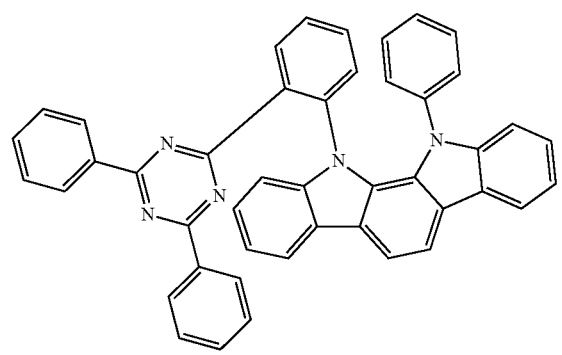
2-176
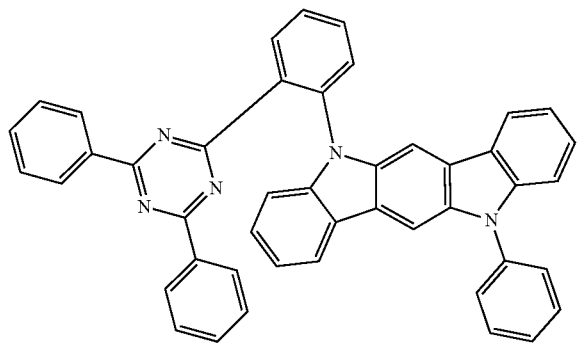
2-177
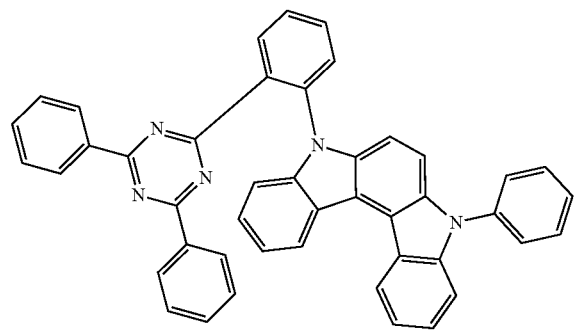
2-178
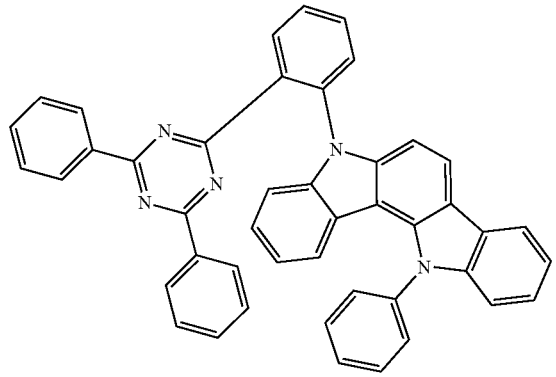
2-179
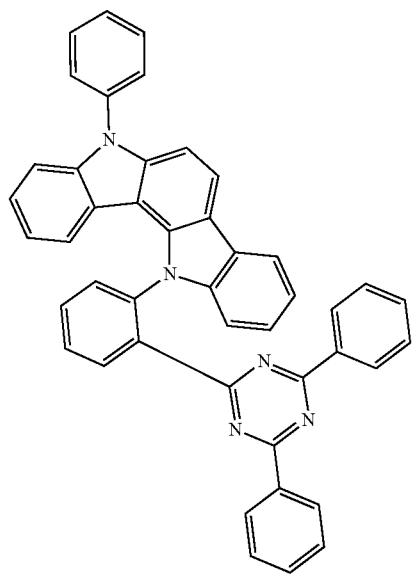
2-180
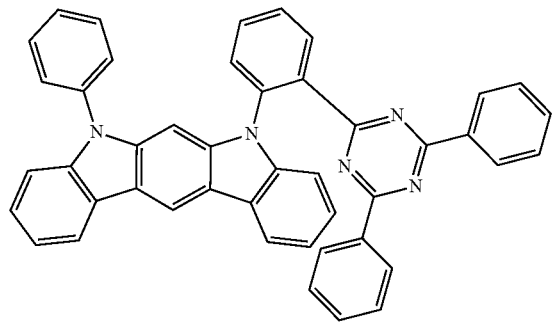

117
-continued
[C49]
2-181
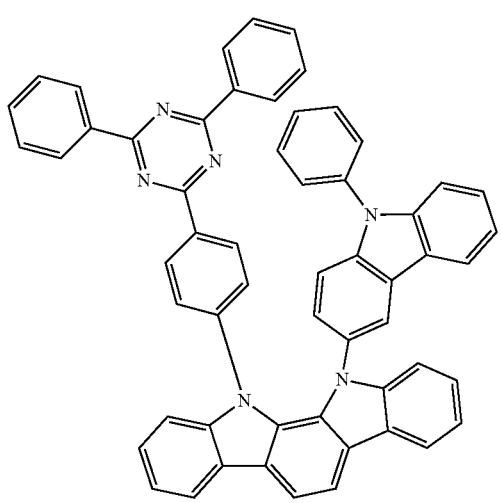
2-182
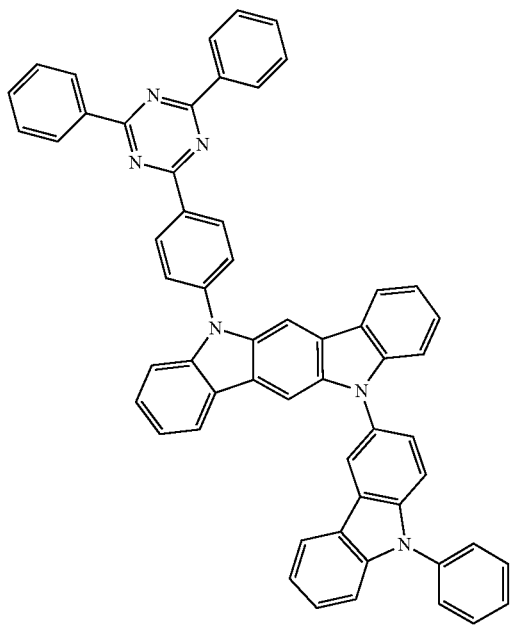
118
-continued
2-183
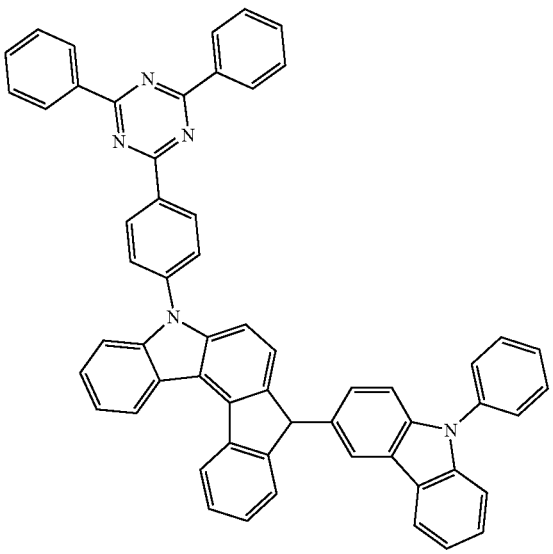
2-184
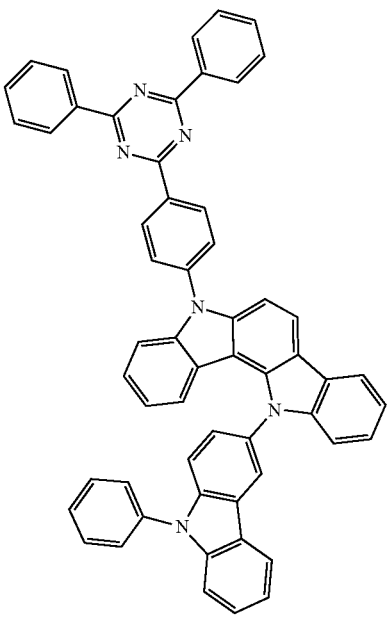

[C50]
2-185
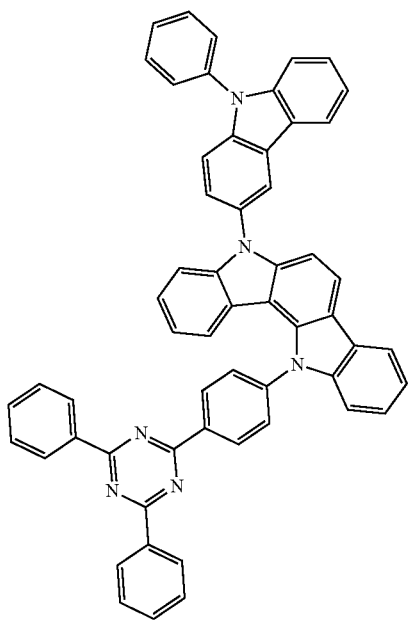
2-186
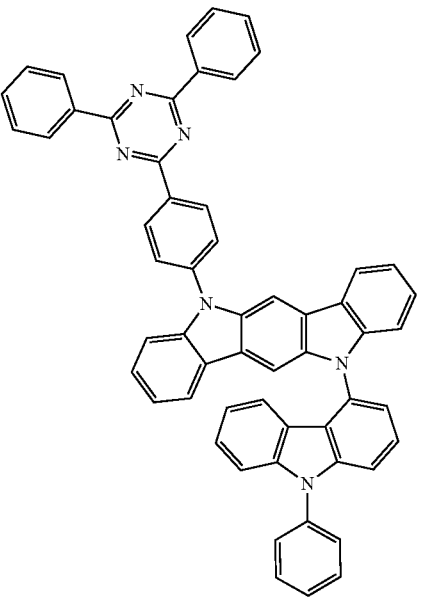
2-187
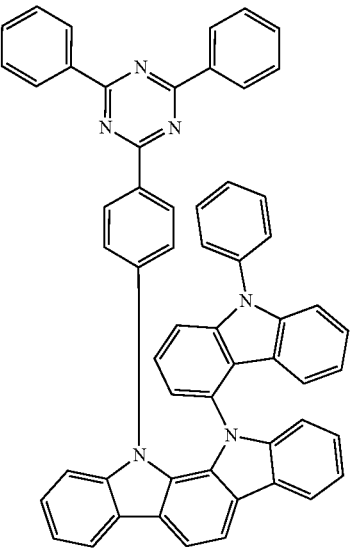
2-188

[C51]
2-189
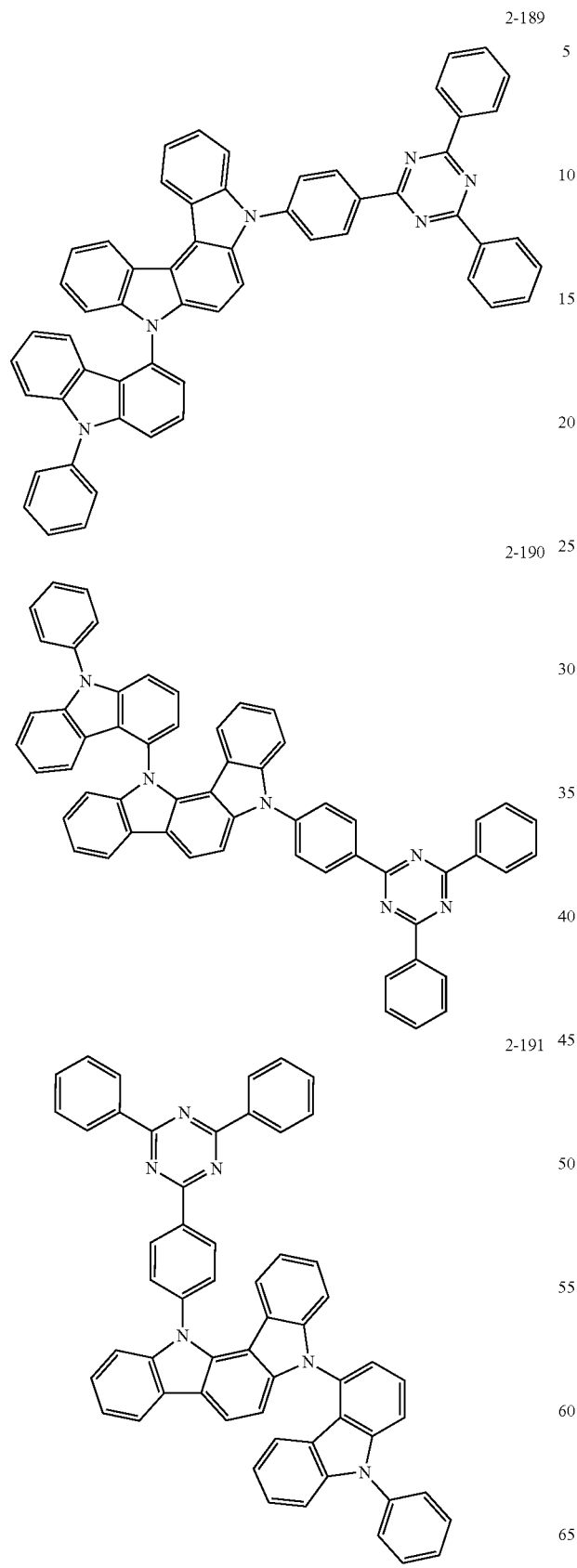
2-190
2-191
2-192
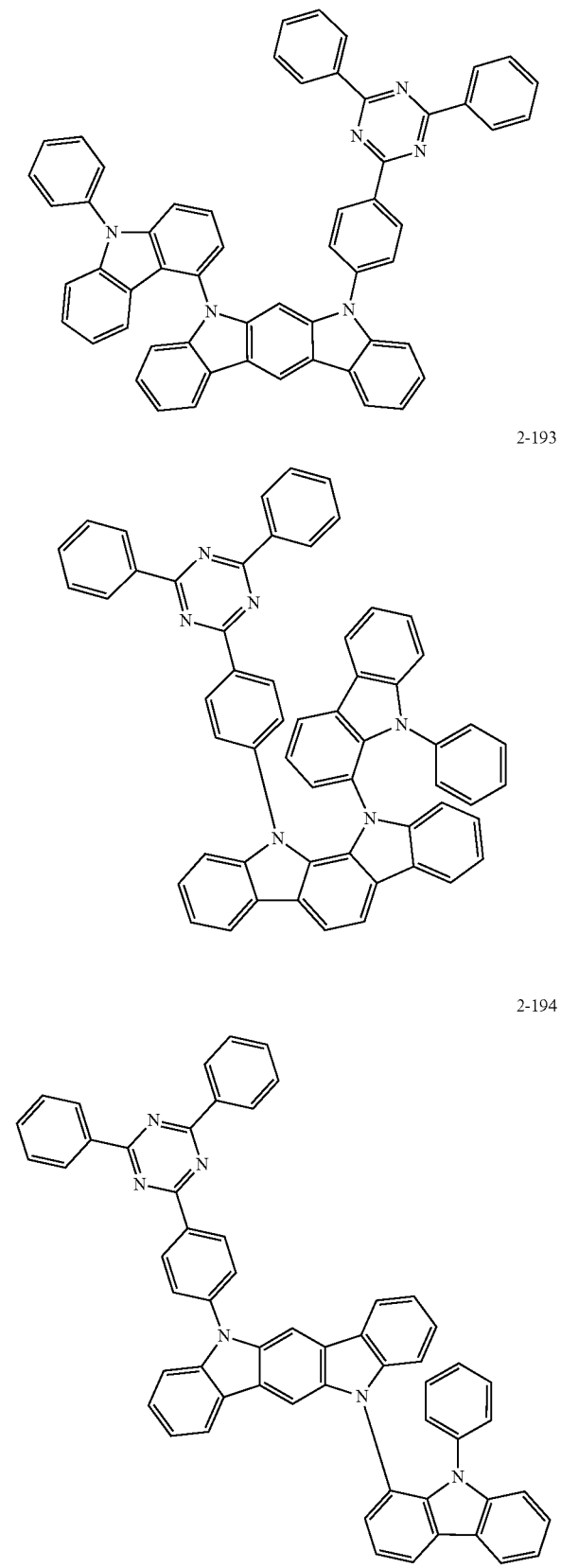
2-193
2-194

[C52]
2-195
2-196
2-197
2-198
2-199
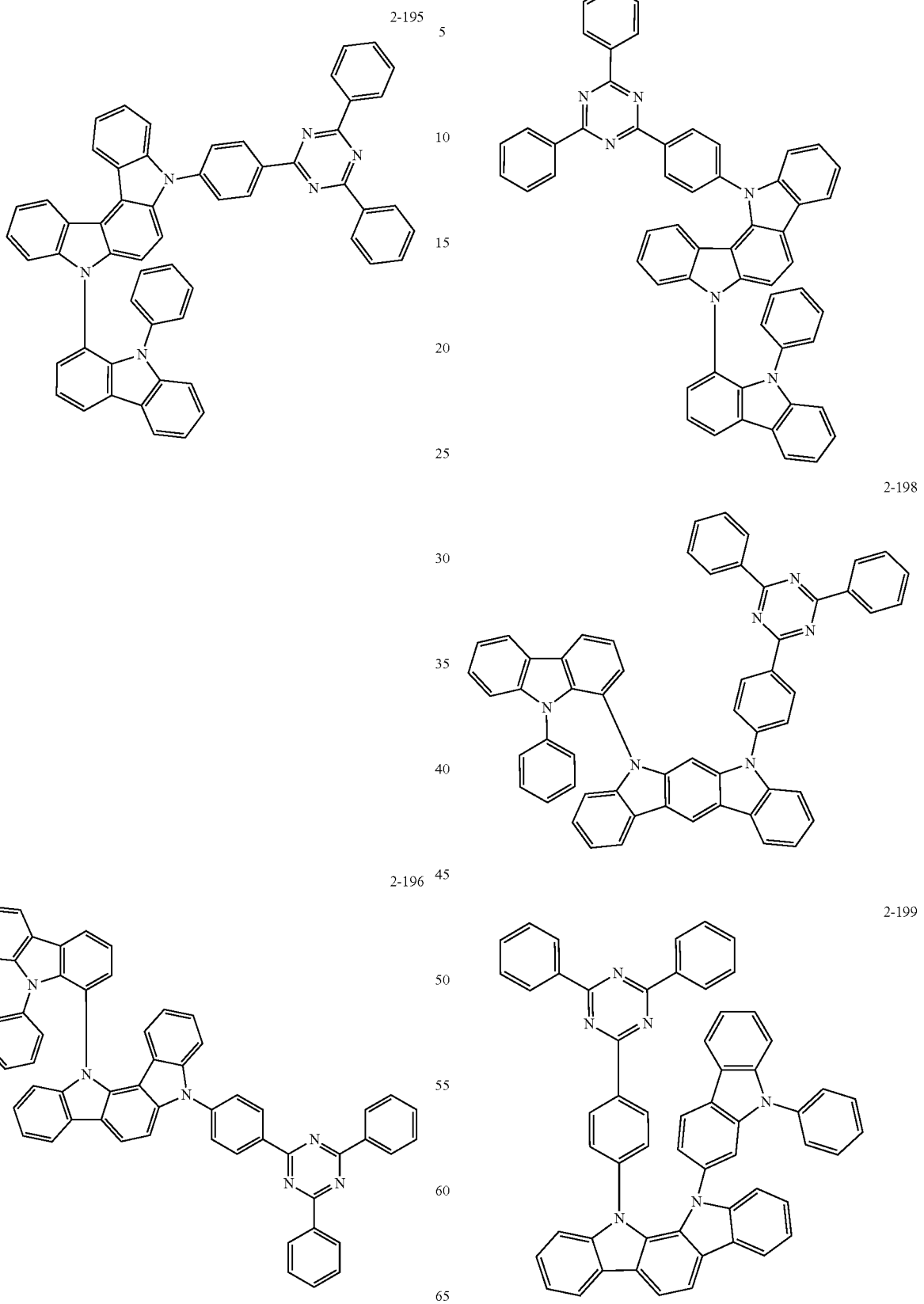

2-200
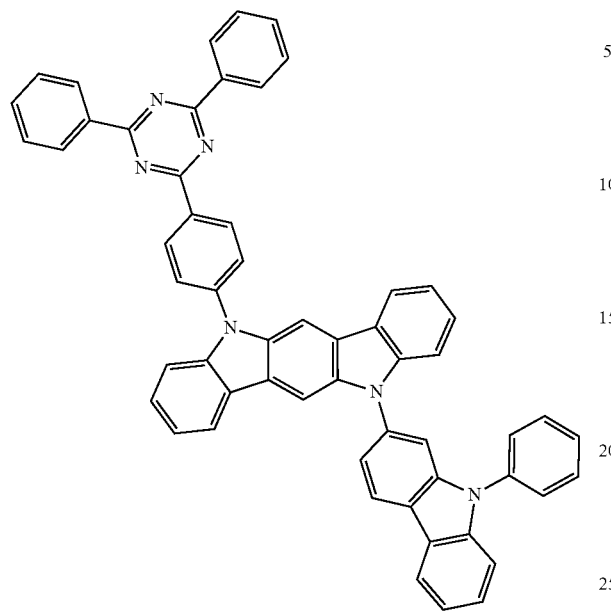
[C53]
2-201
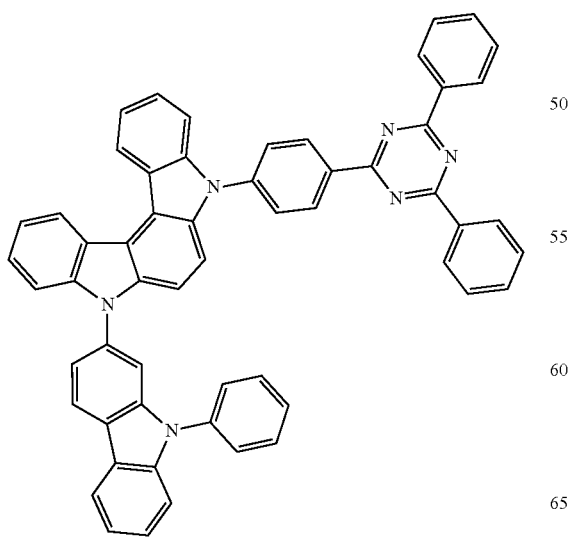
2-202
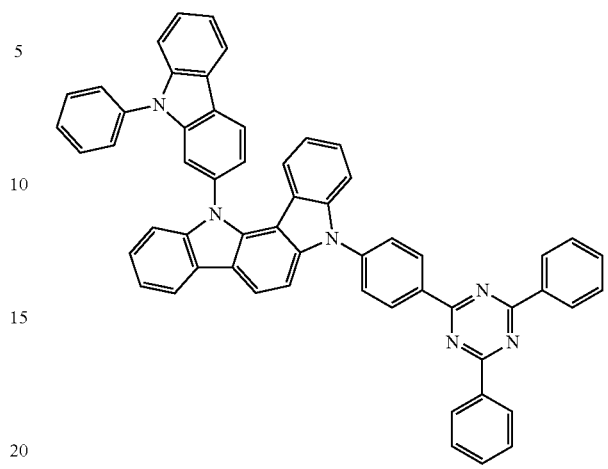
2-203
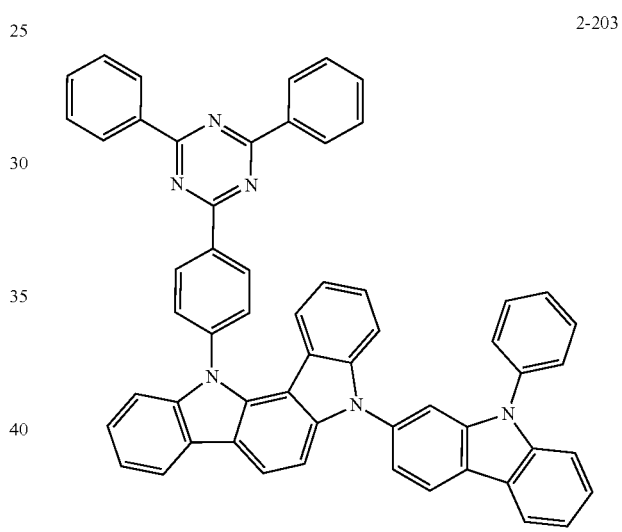
2-204
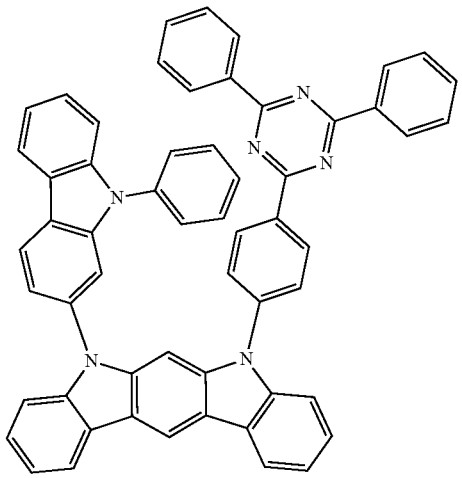

2-205
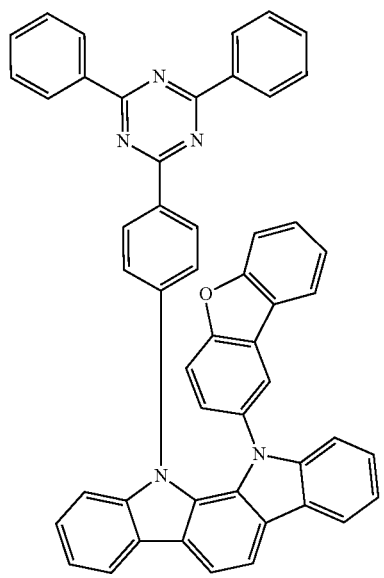
2-206
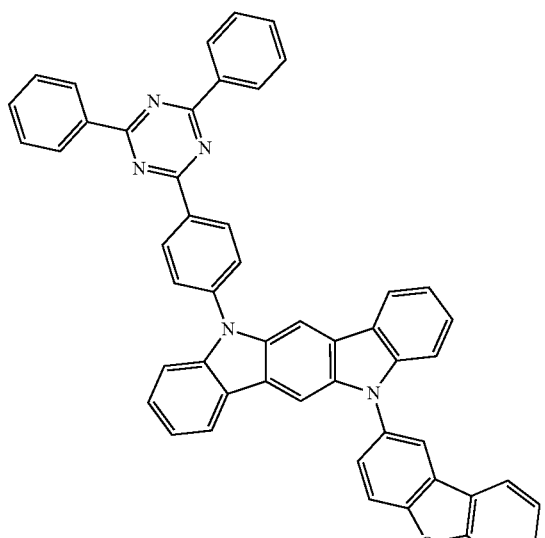
[C54]
2-207
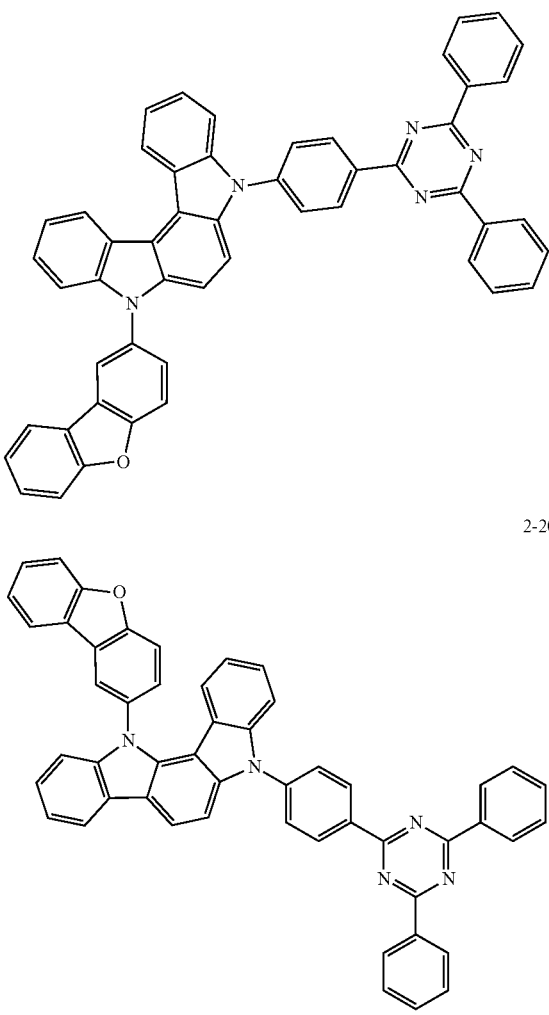
2-208
2-209

-continued
2-210
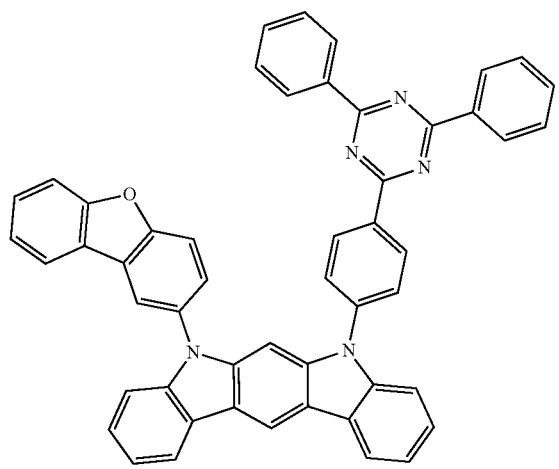
2-211
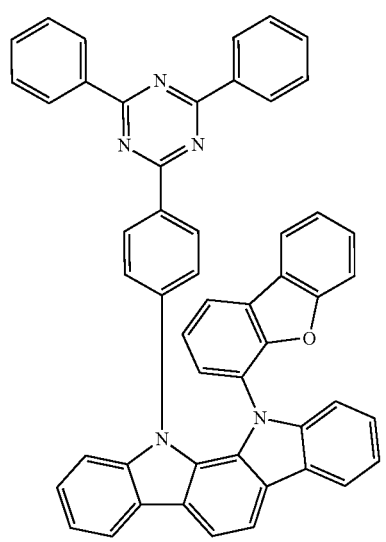
2-212
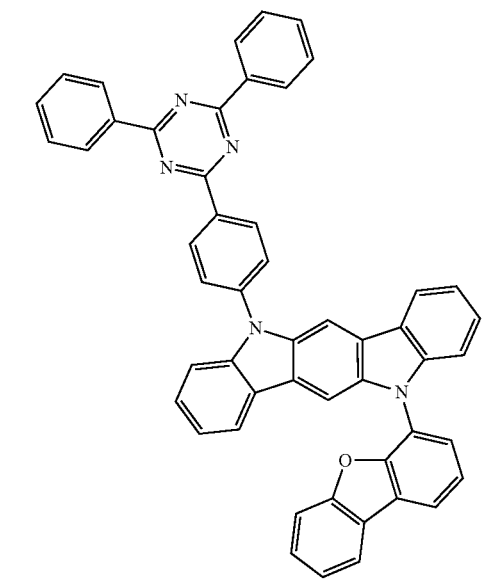
-continued
[C55]
2-213
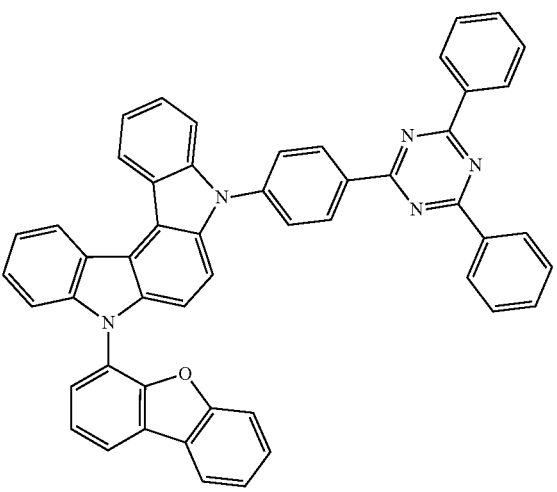
2-214
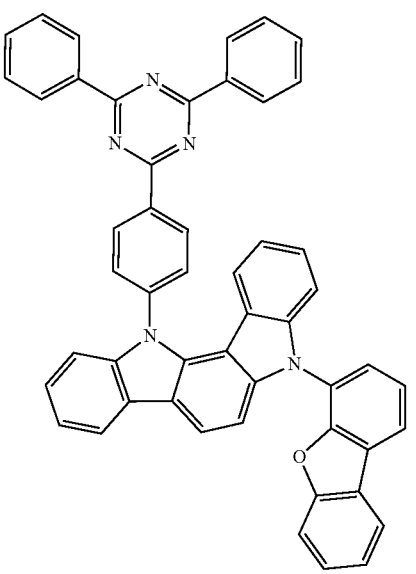
2-215

2-216
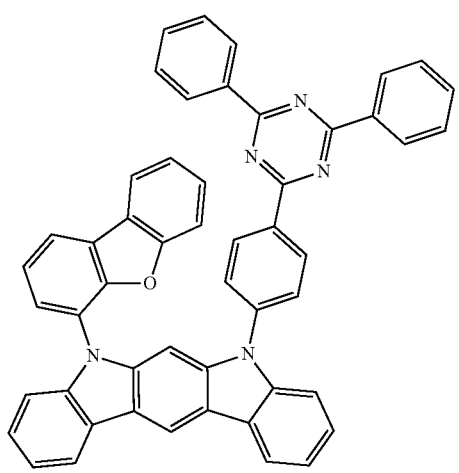
2-217
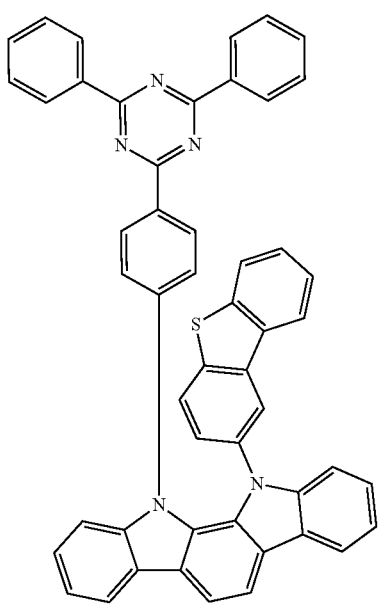
2-218
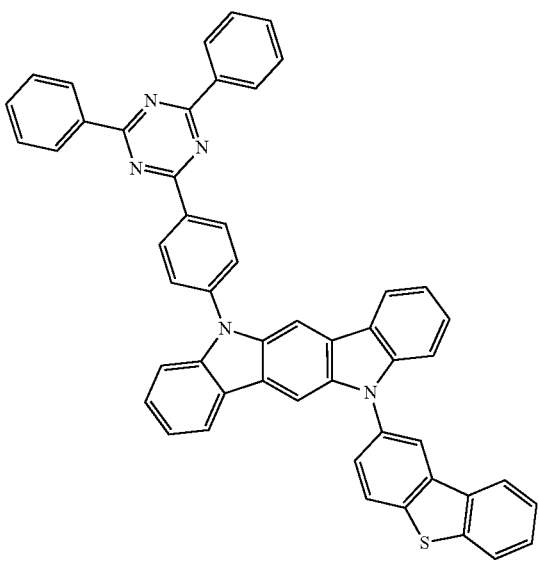
[C56]
2-219
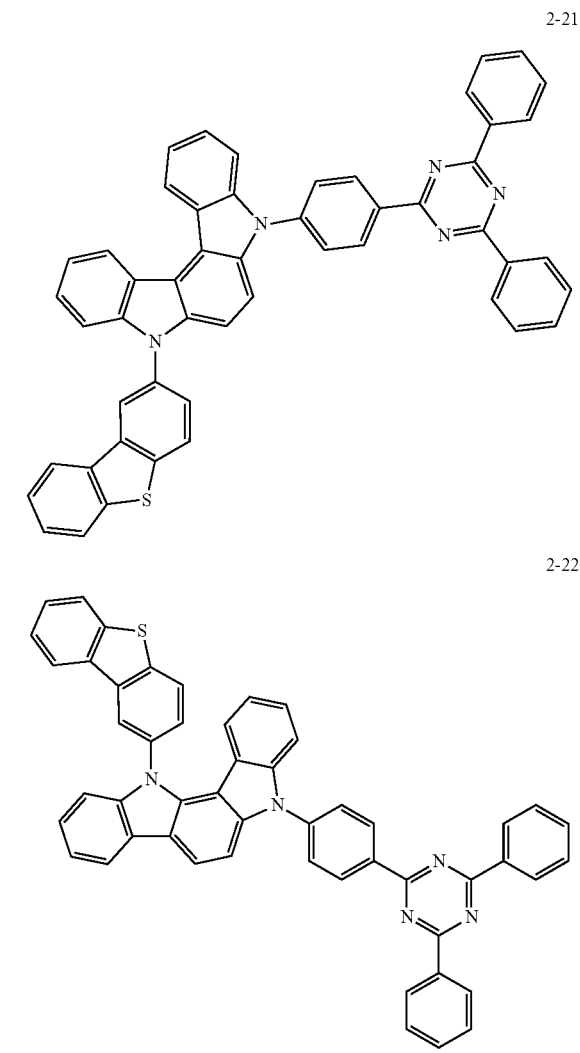
2-220
2-221
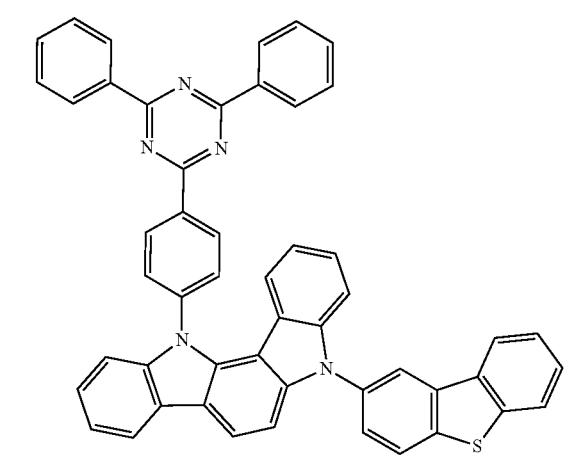

2-222
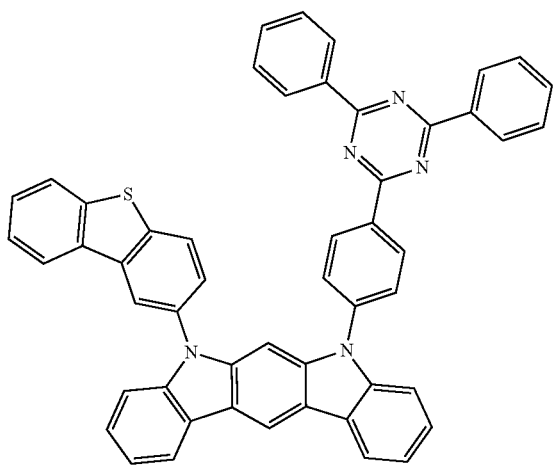
2-223
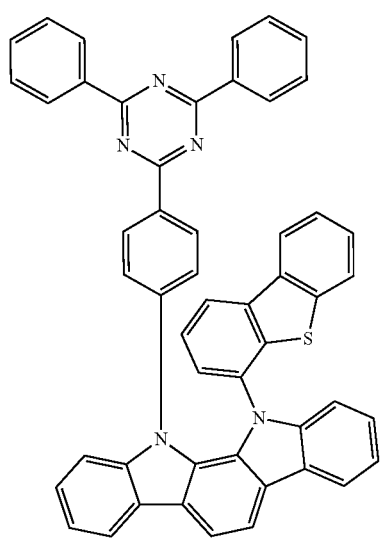
2-224
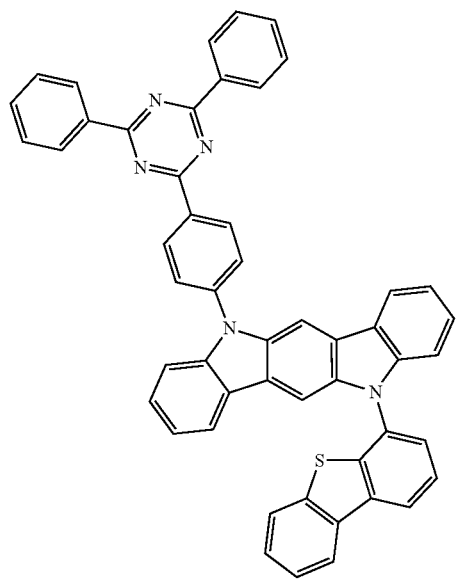
[C57]
2-225
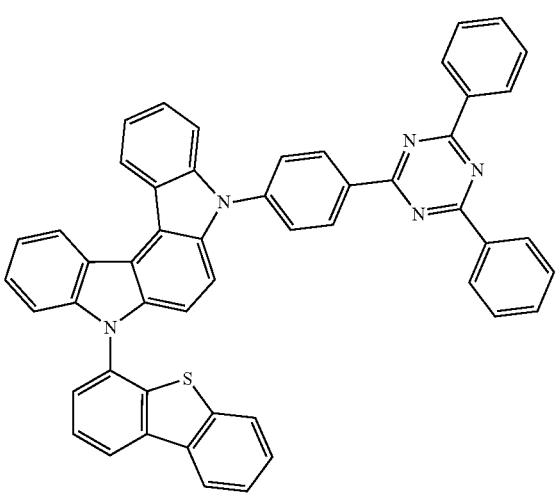
2-226
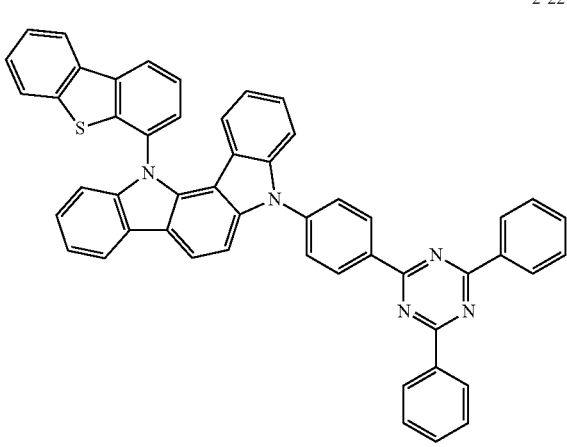
2-227
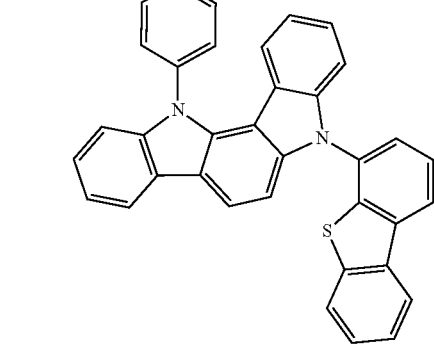

2-228
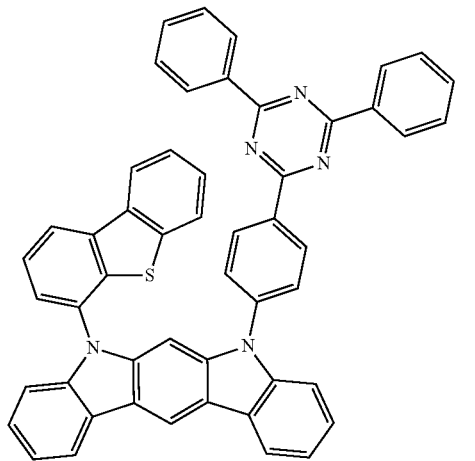
2-231
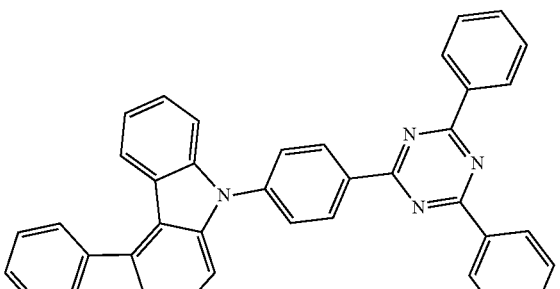
2-229
2-232
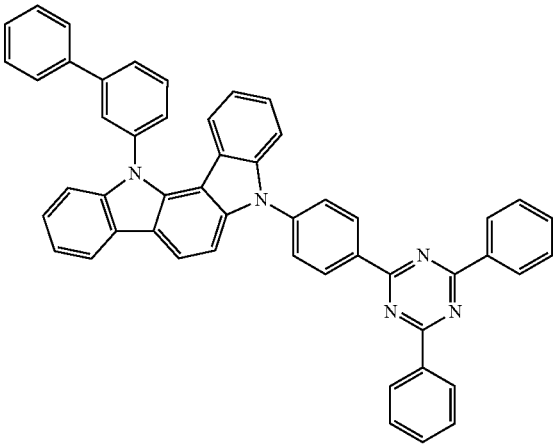
2-230
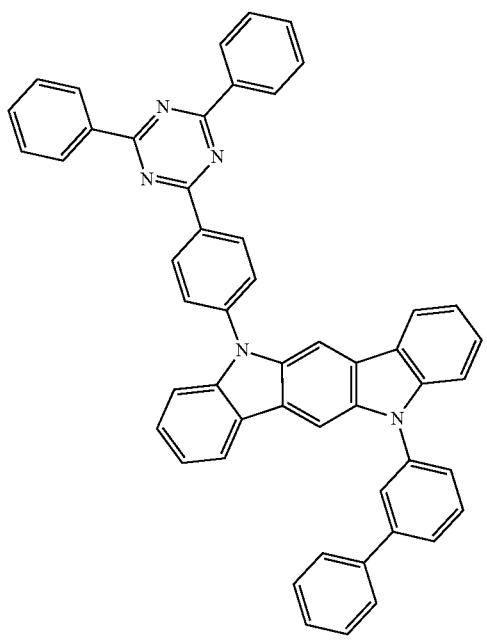
2-233
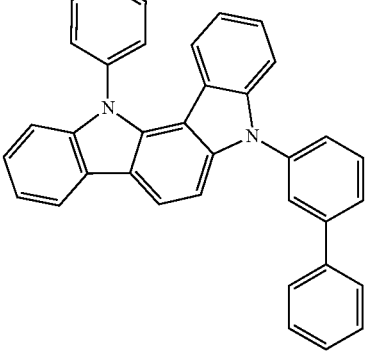

2-234
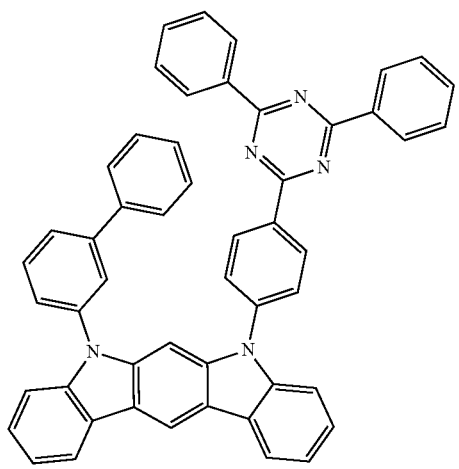
2-236
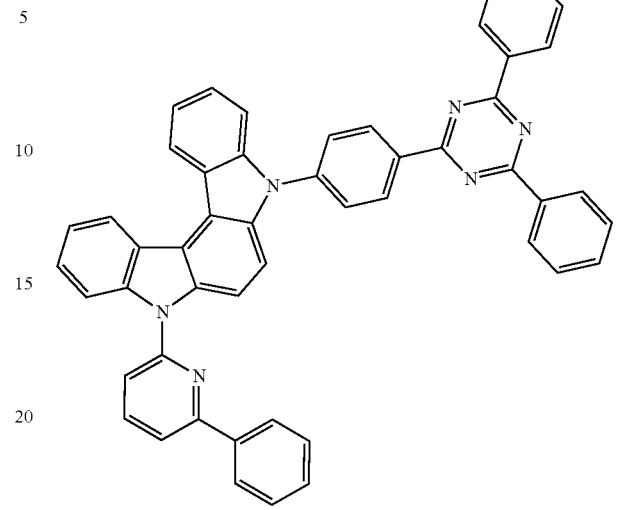
2-237
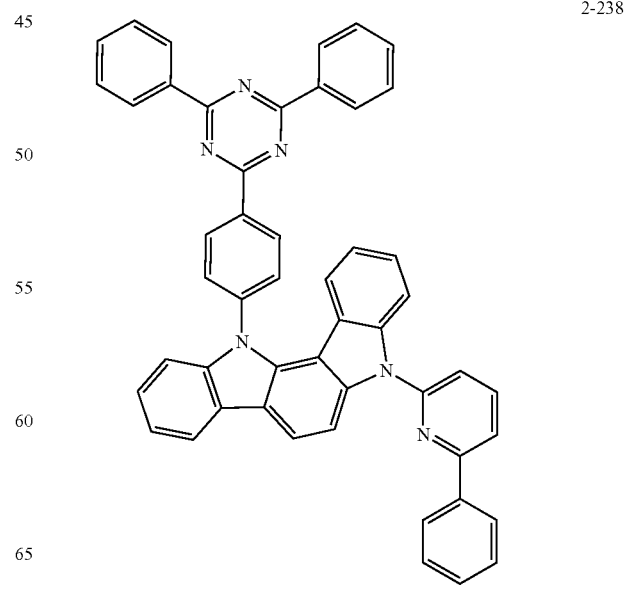
2-235
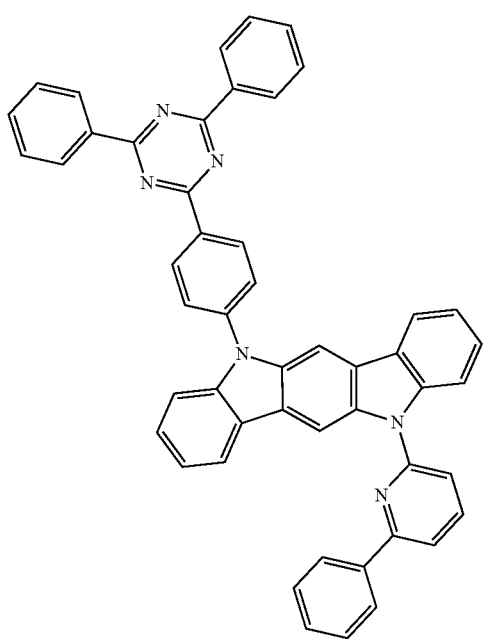
2-238

2-239
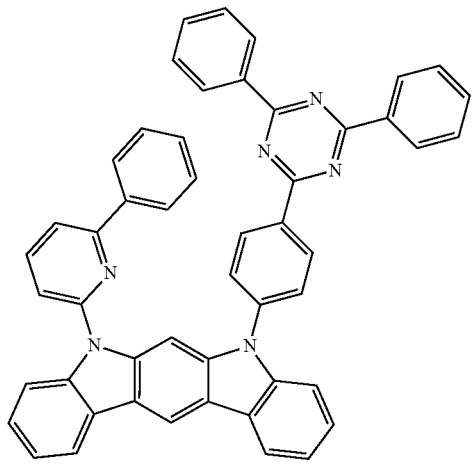
2-240
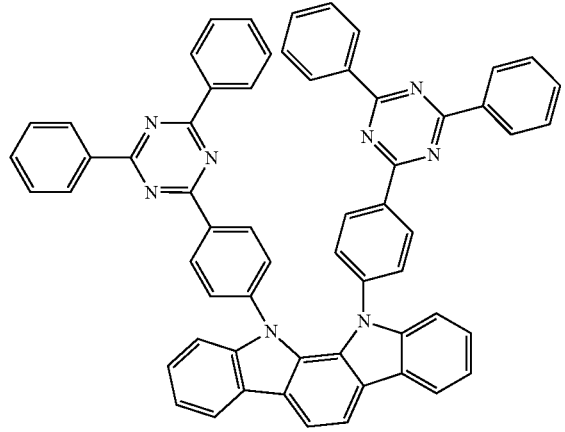
2-241
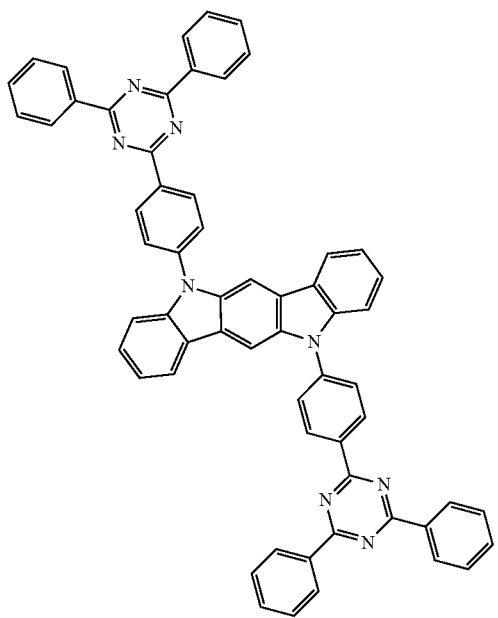
2-242
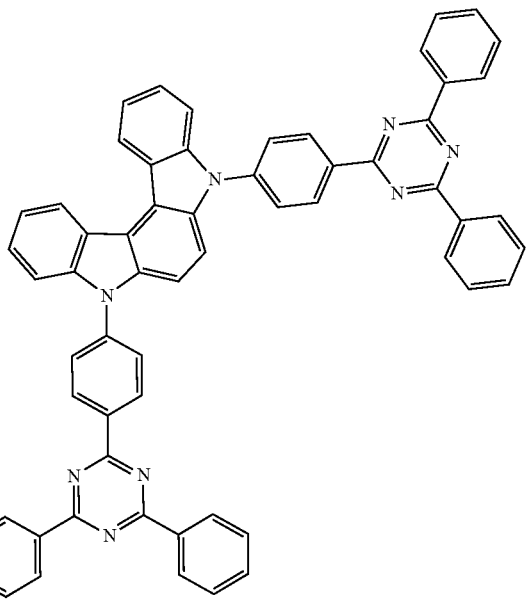
[C60]
2-243
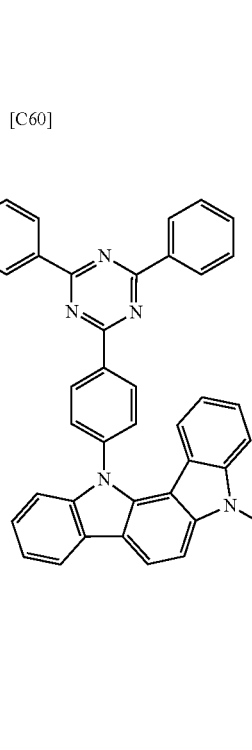

2-244
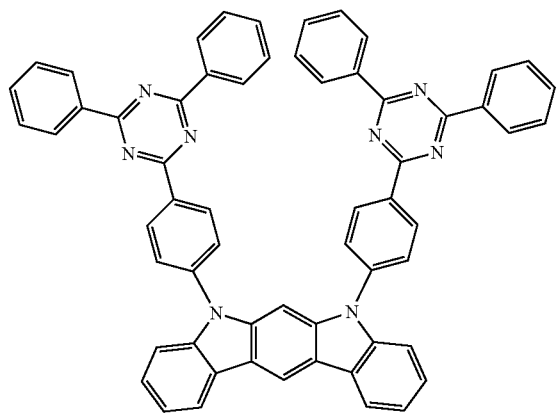
2-245
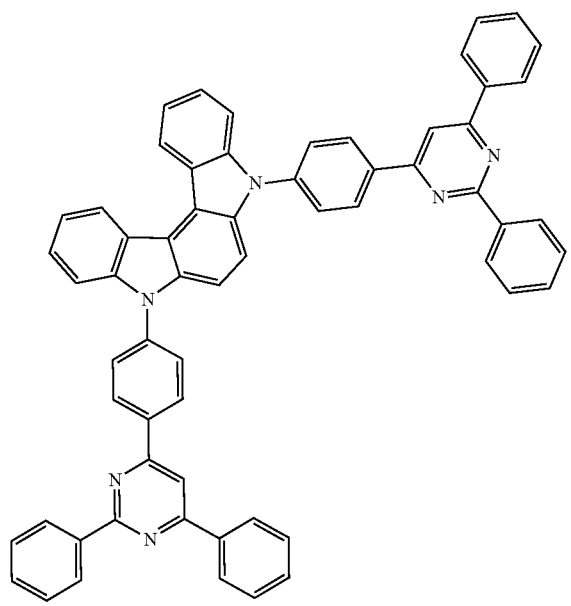
2-246
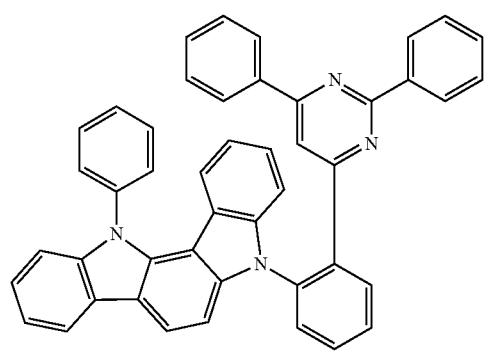
2-247
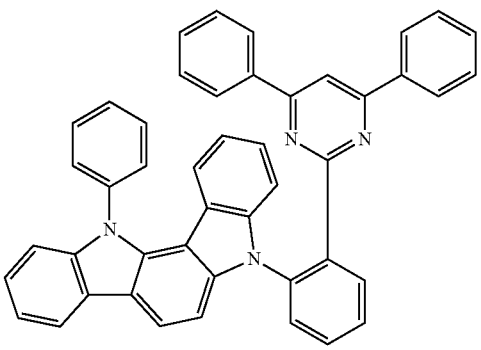
2-248
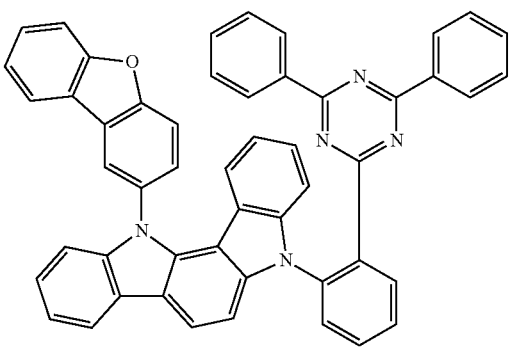
[C61]
2-249
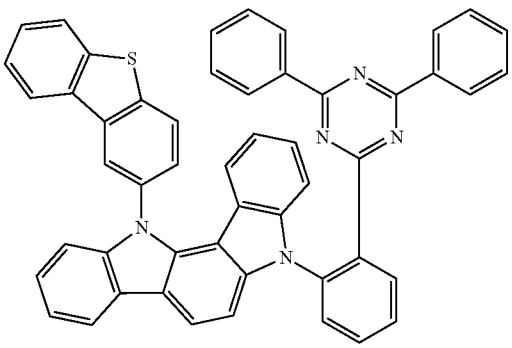
2-250
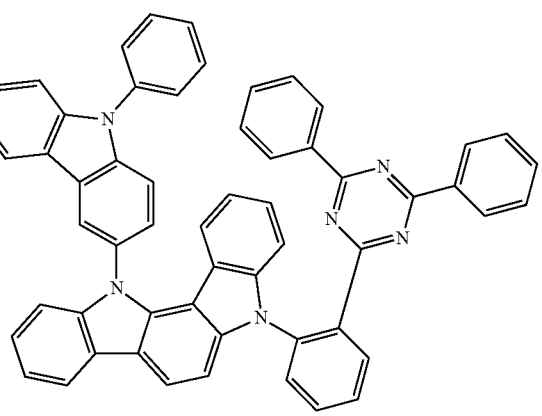

2-251
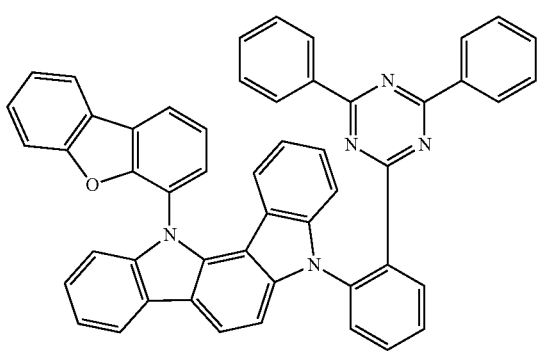
2-252
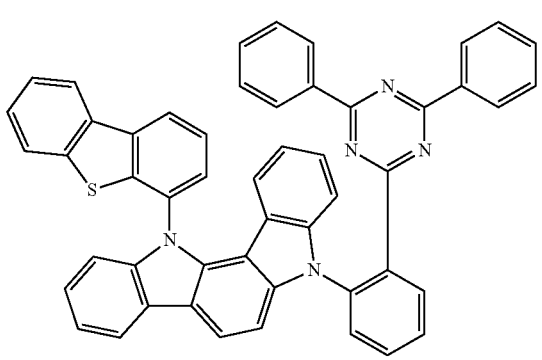
2-253
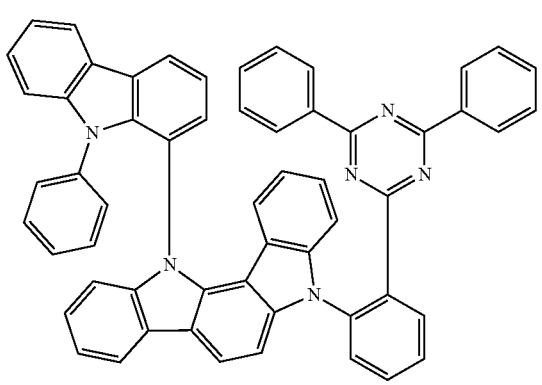
2-254
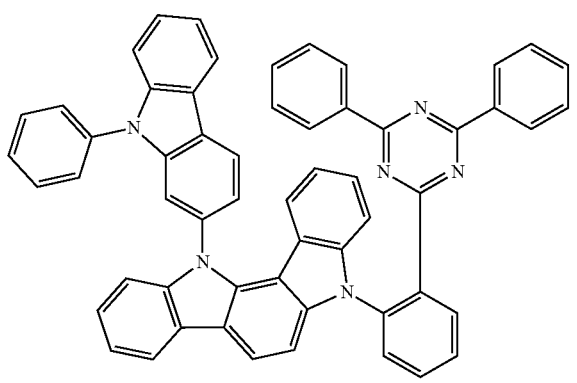
2-255
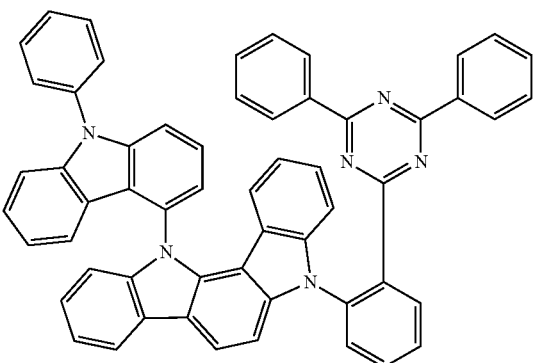
2-256
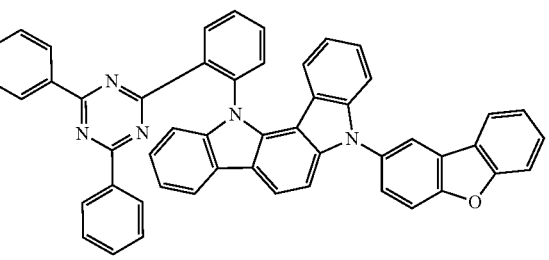
2-257
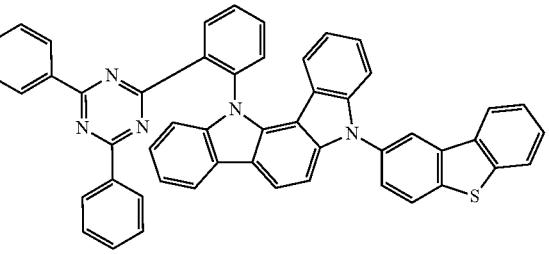
2-258
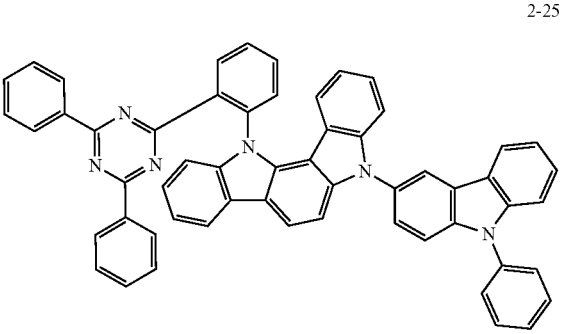

[C62]

2-259
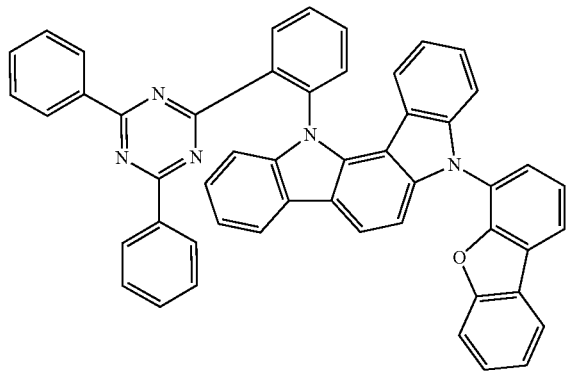

2-260
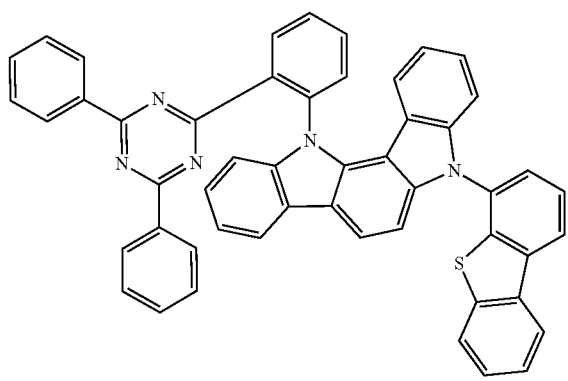

2-261
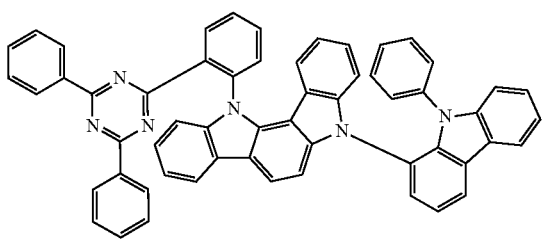

2-262
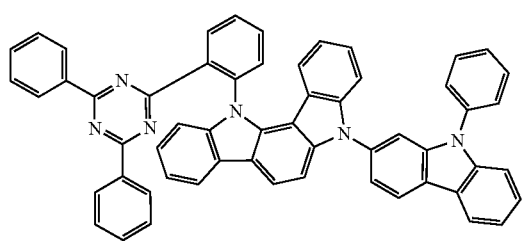

2-263
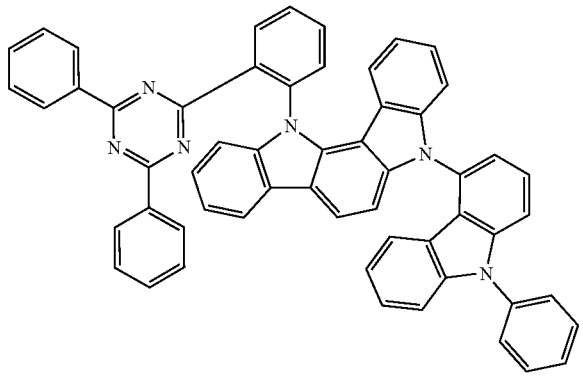

The compound represented by formula (1) is referred to as a host material, and the compound represented by formula (2) is referred to as a thermally activated delayed fluorescence material (TADF material). When such a compound is contained as a host material or a TADF material in the light-emitting layer, it is possible to provide a delayed fluorescence-emitting organic EL element having excellent characteristics.

A difference (ΔE) between an excited singlet energy (S1) and an excited triplet energy (T1) of the TADF material is preferably 0.2 eV or less, and more preferably 0 to 0.15 eV. When the difference is in the above range, it is excellent for a TADF material. When ΔE is as large as 0.3 eV or more, it is difficult for a function as a TADF material to exhibit.

In addition, when an excited triplet energy (T1) of the host material is larger than the excited singlet energy (S1) and the excited triplet energy (T1) of the TADF material, a function as the host is improved.

In addition, when two or more types of host materials are contained, it is possible to improve characteristics of the organic EL element. In this case, at least one host material is the compound represented by formula (1). In addition, a first host is preferably the compound represented by formula (1). A second host is preferably a compound having a larger singlet energy (S1) than the first host. These are both more preferably the compound represented by formula (1).

Here, S1 and T1 are measured as follows.

A sample compound is vapor-deposited on a quartz substrate using a vacuum evaporation method under conditions of a degree of vacuum of $10^{-4}$ Pa or less to form a vapor-deposited film with a thickness of 100 nm. An emission spectrum of the vapor-deposited film is measured, a tangent to the rise on the short wavelength side of the emission spectrum is drawn, and a wavelength value λedge [nm] at the intersection point of the tangent and the horizontal axis is assigned to the formula (i) shown below to calculate S1.

$$S1\ [eV] = 1239.85/\lambda\text{edge} \qquad (i)$$

Regarding T1, a phosphorescence spectrum of a vapor-deposited film is measured, but a phosphorescence spectrum may not be obtained in a thin film of a single compound. In this case, a thin film mixed with an appropriate material having a higher T1 than a sample compound is produced and a phosphorescence spectrum is measured. A tangent to the rise on the short wavelength side of the phosphorescence spectrum is drawn, and a wavelength value λedge [nm] at the intersection point of the tangent and the horizontal axis is assigned to formula (ii) to calculate T1.

$$T1\ [eV] = 1239.85/\lambda\text{edge} \qquad (ii)$$

Next, the structure of the organic EL element of the present invention will be described with reference to the drawing, but the structure of the organic EL element of the present invention is not limited thereto.

FIG. 1 is a cross-sectional view showing a structure example of an organic EL element generally used for the present invention. 1 indicates a substrate, 2 indicates an anode, 3 indicates a hole injection layer, 4 indicates a hole transport layer, 5 indicates a light-emitting layer, 6 indicates an electron transport layer, and 7 indicates a cathode. The organic EL element of the present invention may have an exciton blocking layer adjacent to the light-emitting layer and may have an electron blocking layer between the light-emitting layer and the hole injection layer. The exciton blocking layer can be inserted into either on the side of the cathode or the anode of the light-emitting layer and inserted into both sides at the same time. The organic EL element of the present invention has the anode, the light-emitting layer, and the cathode as essential layers, and may have a hole injection transport layer and an electron injection transport layer in addition to the essential layers, and may have additionally a hole blocking layer between the light-emitting layer and the electron injection transport layer. Here, the hole injection transport layer refers to either or both of the hole injection layer and the hole transport layer, and the electron injection transport layer refers to either or both of the electron injection layer and the electron transport layer.

A structure reverse to that of FIG. 1, that is, a structure in which a cathode 7, an electron transport layer 6, a light-emitting layer 5, a hole transport layer 4, and an anode 2 are laminated on a substrate 1 in this order, can be used, and in this case also, layers can be added or omitted as necessary.

—Substrate—

The organic EL element of the present invention is preferably supported on a substrate. The substrate is not particularly limited, and those used in the organic EL element in the related art may be used, and those made of, for example, glass, a transparent plastic, or quartz, can be used.

—Anode—

Regarding an anode material for an organic EL element, a material of a metal having a large work function (4 eV or more), an alloy, an electrically conductive compound or a mixture thereof is preferably used. Specific examples of such an electrode material include a metal such as Au, and a conductive transparent material such as CuI, indium tin oxide (ITO), $SnO_2$, and ZnO. In addition, an amorphous material such as IDIXO ($In_2O_3$—ZnO) which can form a transparent conductive film may be used. Regarding the anode, such an electrode material is used to form a thin film by a vapor-deposition or sputtering method, and a desired shape pattern may be formed by a photolithographic method, or if the pattern accuracy is not particularly required (about 100 μm or more), a pattern may be formed via a desired shape mask when the electrode material is vapor-deposited or sputtered. Alternatively, when a coatable substance such as the organic conductive compound is used, a wet film formation method such as a printing method and a coating method can be used. When light is emitted from the anode, it is desirable that the transmittance be larger than 10% and sheet resistance for the anode is preferably several hundreds Ω/sq or less. The film thickness depends on the material, and it is generally 10 to 1,000 nm, and preferably selected in a range of 10 to 200 nm.

—Cathode—

On the other hand, regarding a cathode material, a material of a metal having a small work function (4 eV or less) (referred to as an electron injection metal), an alloy, an electrically conductive compound, or a mixture thereof is used. Specific examples of such an electrode material include sodium, a sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, and a rare earth metal. Among these, in consideration of electron injectability and durability with respect to oxidation and the like, a mixture of an electron injection metal and a second metal which is a stable metal having a larger work function value, for example, a magnesium/silver mixture, a magnesium/aluminum mixture, a magnesium/indium mixture, an aluminum/aluminum oxide ($Al_2O_3$) mixture, a lithium/aluminum mixture, aluminum, and the like are suitable. The cathode can be produced by forming a thin film by a method such as vapor-depositing or sputtering of such a cathode material. In addition, sheet resistance for the cathode is preferably several hundreds Ω/sq or less, and the film thickness is generally 10 nm to 5 μm, and preferably selected in a range of 50 to 200 nm. Here, in order to transmit emitted light, if either the anode or the cathode of the organic EL element is transparent or translucent, light emission brightness is improved, which is advantageous.

In addition, after the metal with a film thickness of 1 to 20 nm is formed on the cathode, when a conductive transparent material exemplified in the description of the anode is formed thereon, a transparent or translucent cathode can be produced and by applying this, it is possible to produce an element in which both the anode and the cathode have transparency.

—Light-Emitting Layer—

The light-emitting layer is a layer that emits light after excitons are generated when holes and electrons injected from the anode and the cathode, respectively, are recombined. In the light-emitting layer, the thermally activated delayed fluorescence material represented by formula (2), and the host material represented by formula (1) are used together. In addition, when two or more host materials are contained, it is possible to improve characteristics. When two or more types of host materials are contained, at least one type thereof may be a host material selected from the compounds represented by formula (1).

Only one type of a dopant material may be contained in the light-emitting layer or two or more types thereof may be contained. A content of the organic light-emitting dopant material containing the thermally activated delayed fluorescence material is preferably 0.1 to 50 wt % and more preferably 1 to 30 wt % with respect to the host material.

Since the element of the present invention uses TADF, no phosphorescent dopant material is used.

Regarding the host material in the light-emitting layer, the compound represented by formula (1) is preferably used. In addition, a plurality of types of host materials may be used in combination. When a plurality of types of host materials are used in combination, at least one type of host material is preferably selected from among the compounds represented by formula (1).

Among the host materials represented by formula (1), a compound having a hole transport ability and an electron transport ability and a high glass transition temperature and a higher T1 than S1 and the T1 of the light-emitting dopant material is preferable.

When a plurality of types of host materials are used, respective hosts are vapor-deposited from different deposition sources or premixing is performed before vapor-deposition to obtain a pre-mixture, and thus a plurality of types of hosts can be vapor-deposited from one deposition source at the same time.

—Injection Layer—

The injection layer is a layer that is provided between an electrode and an organic layer in order to lower a driving voltage and improve light emission brightness, and includes a hole injection layer and an electron injection layer, and may be present between the anode and the light-emitting layer or the hole transport layer, and between the cathode and the light-emitting layer or the electron transport layer. The injection layer can be provided as necessary.

—Hole Blocking Layer—

The hole blocking layer has a function of the electron transport layer in a broad sense, and is made of a hole blocking material having a function of transporting electrons and a significantly low ability to transport holes, and can block holes while transporting electrons, and thus can improve a probability of recombining electrons and holes in the light-emitting layer.

For the hole blocking layer, a known hole blocking layer material can be used.

—Electron Blocking Layer—

The electron blocking layer has a function of a hole transport layer in a broad sense and blocks electrons while transporting holes, and thus can improve a probability of recombining electrons and holes in the light-emitting layer.

Regarding the material of the electron blocking layer, a known electron blocking layer material can be used and a material of the hole transport layer to be described below can be used as necessary. The film thickness of the electron blocking layer is preferably 3 to 100 nm, and more preferably 5 to 30 nm. In addition, the compound represented by formula (1) can be used.

—Exciton Blocking Layer—

The exciton blocking layer is a layer for blocking diffusion of excitons generated when holes and electrons are recombined in the light-emitting layer in a charge transport layer, and when this layer is inserted, excitons can be efficiently confined in the light-emitting layer, and the luminous efficiency of the element can be improved. The exciton blocking layer can be inserted between two adjacent light-emitting layers in an element in which two or more light-emitting layers are adjacent to each other.

Regarding the material of the exciton blocking layer, a known exciton blocking layer material can be used. Examples thereof include 1,3-dicarbazolyl benzene (mCP) and bis(2-methyl-8-quinolinolato)-4-phenylphenolato aluminum(III) (BAlq).

—Hole Transport Layer—

The hole transport layer is made of a hole transport material having a function of transporting holes, and a single hole transport layer or a plurality of hole transport layers can be provided.

The hole transport material has either hole injection or transport properties or electron barrier properties, and may be an organic material or an inorganic material. For the hole transport layer, any one selected from among conventionally known compounds can be used. Examples of such a hole transport material include porphyrin derivatives, arylamine derivatives, triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styryl anthracene derivatives, fluorenone derivatives, hydrazone derivatives, stilbene derivatives, silazane derivatives, an aniline copolymer, and a conductive polymer oligomer, and particularly a thiophene oligomer. Porphyrin derivatives, arylamine derivatives, or styrylamine derivatives are preferably used. An arylamine compound is more preferably used.

—Electron Transport Layer—

The electron transport layer is made of a material having a function of transporting electrons, and a single electron transport layer or a plurality of electron transport layers can be provided.

The electron transport material (which may also be a hole blocking material) may have a function of transferring electrons injected from the cathode to the light-emitting layer. For the electron transport layer, any one selected from among conventionally known compounds can be used, and examples thereof include polycyclic aromatic derivatives such as naphthalene, anthracene, and phenanthroline, tris(8-quinolinolato)aluminum(III) derivatives, phosphine oxide derivatives, nitro-substituted fluorene derivatives, diphenylquinone derivatives, thiopyrandioxide derivatives, carbodiimide, freorenylidene methane derivatives, anthraquinodimethane and anthrone derivatives, bipyridine derivatives, quinoline derivatives, oxadiazole derivatives, benzimidazole derivatives, benzothiazole derivatives, and indolocarbazole derivatives. In addition, a polymer material in which such a material is introduced into a polymer chain or such a material is used for a main chain of a polymer can be used.

A film forming method of respective layers when an organic EL element of the present invention is produced is not particularly limited, and either a dry process or a wet process may be used for production.

EXAMPLES

While the present invention will be described below in more detail with reference to examples, the present invention is not limited to these examples.

Compounds used in the examples are shown below. 1-10, 1-28, 1-42, 1-65, 2-50, 2-91, 2-120, and 2-178 are the compounds described above.

[C63]

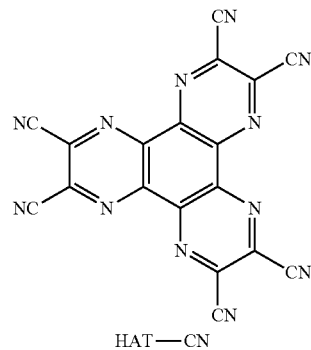

HAT—CN

-continued

HT-1

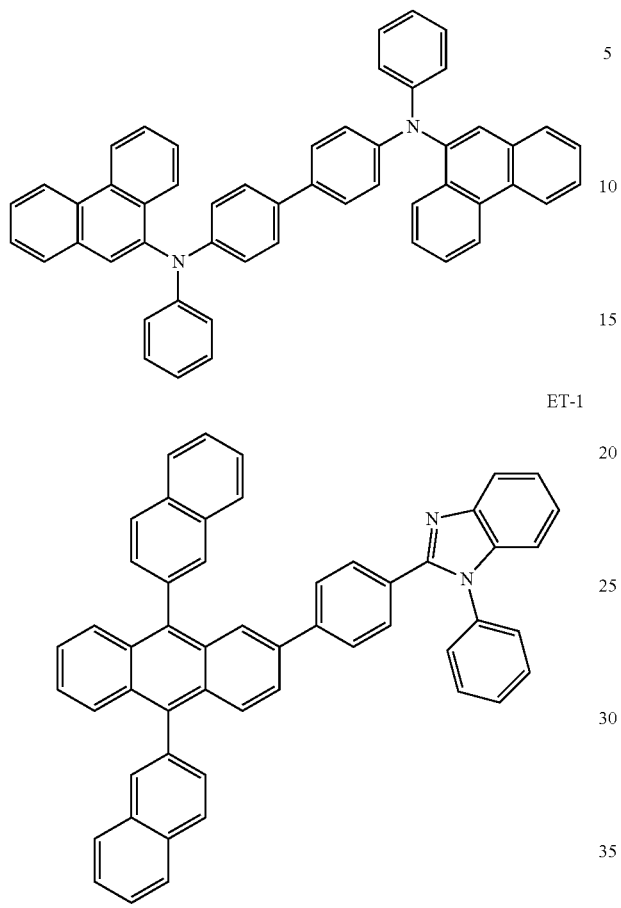

ET-1

ET-2

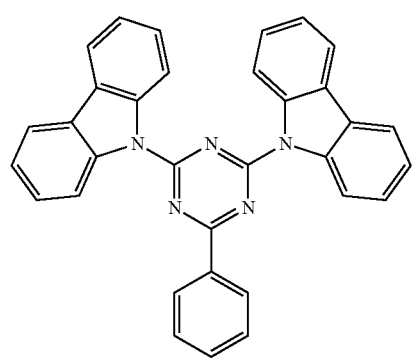

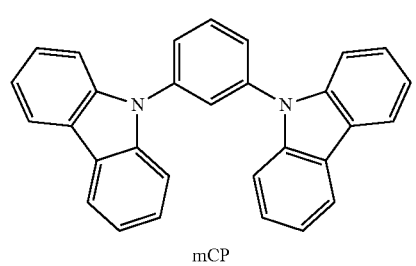

mCP

-continued

D-1

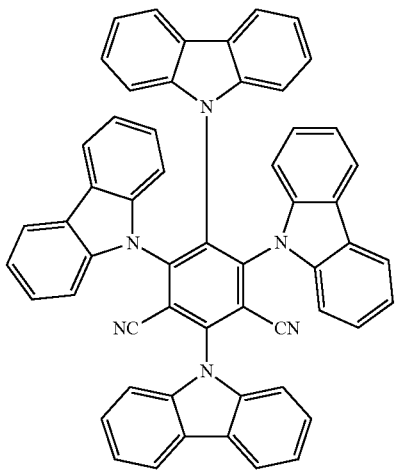

S1, T1, and S1-T1 (ΔE) of the compounds used in the examples are shown in Table 1.

TABLE 1

| Compound | S1 (eV) | T1 (eV) | ΔE (eV) |
|---|---|---|---|
| 1-10 | 3.5 | 3.1 | 0.4 |
| 1-28 | 3.5 | 3.1 | 0.4 |
| 1-42 | 3.5 | 3.1 | 0.4 |
| 1-65 | 3.6 | 3.1 | 0.5 |
| 2-50 | 2.9 | 2.9 | 0.0 |
| 2-91 | 2.8 | 2.7 | 0.1 |
| 2-120 | 2.9 | 2.7 | 0.2 |
| 2-178 | 2.7 | 2.7 | 0.0 |
| D-1 | 2.8 | 2.7 | 0.1 |
| mCP | 3.6 | 3.1 | 0.5 |

Experimental Example 1

A fluorescence lifespan of Compound 2-120 was measured. Compound 2-120 and Compound 1-10 were vapor-deposited on a quartz substrate from different deposition sources under conditions of a degree of vacuum of $10^{-4}$ Pa or less using a vacuum evaporation method. A co-vapor-deposited film with a concentration of Compound 2-120 of 15 wt % was formed with a thickness of 100 nm. An emission spectrum of the thin film was measured, and light emission with a peak of 483 nm was confirmed. In addition, a luminous lifespan was measured using a small fluorescence lifespan measurement device (Quantaurus-tau commercially available from Hamamatsu Photonics K.K.) under a nitrogen atmosphere. A fluorescence with an excitation lifespan of 12 ns and a delayed fluorescence with an excitation lifespan of 13 μs were observed, and it was confirmed that Compound 2-120 was a compound exhibiting delayed fluorescence-emission.

When fluorescence lifespans of Compounds 2-50, 2-91, and 2-178 were measured in the same manner as described above, delayed fluorescence was observed, and it was confirmed that the compounds were materials exhibiting delayed fluorescence-emission.

Example 1

On a glass substrate on which an anode made of ITO with a film thickness of 70 nm was formed, respective thin films were laminated using a vacuum evaporation method at a degree of vacuum $4.0 \times 10^{-5}$ Pa. First, HAT-CN was formed with a thickness of 10 nm as a hole injection layer on ITO, and next a compound (HT-1) was formed with a thickness of 25 nm as a hole transport layer. Next, a compound (1-117) was formed with a thickness of 5 nm as an electron blocking layer. Then, a compound (1-28) as a host and a compound (2-50) as a dopant were co-vapor-deposited from different deposition sources to form a light-emitting layer with a thickness of 30 nm. In this case, co-vapor-deposition was performed under vapor-deposition conditions such that the concentration of the compound (2-50) was 15 wt %. Next, a compound (ET-2) was formed with a thickness of 5 nm as a hole blocking layer. Next, ET-1 was formed with a thickness of 40 nm as an electron transport layer. In addition, lithium fluoride (LiF) was formed with a thickness of 1 nm as an electron injection layer on the electron transport layer. Finally, aluminum (Al) was formed with a thickness of 70 nm as a cathode on the electron injection layer to produce an organic EL element.

Examples 2 to 10, Examples 12 to 14, and Comparative Examples 1 to 3

Organic EL elements were produced in the same manner as in Example 1 except that the host and dopant in Example 1 were changed to compounds shown in Table 2.

Example 11

On a glass substrate on which an anode made of ITO with a film thickness of 70 nm was formed, respective thin films were laminated using a vacuum evaporation method at a degree of vacuum $4.0 \times 10^{-5}$ Pa. First, HAT-CN was formed with a thickness of 10 nm as a hole injection layer on ITO, and next a compound (HT-1) was formed with a thickness of 25 nm as a hole transport layer. Next, a compound (1-117) was formed with a thickness of 5 nm as an electron blocking layer. Next, a compound (1-10) as a host, a compound (1-42) as a second host, and a compound (2-120) as a dopant were co-vapor-deposited from different deposition sources to form a light-emitting layer with a thickness of 30 nm. In this case, co-vapor-deposition was performed under vapor-deposition conditions such that the concentration of the compound (2-120) was 15 wt % and the weight ratio between the host and the second host was 50:50. Next, a compound (ET-2) was formed with a thickness of 5 nm as a hole blocking layer. Next, ET-1 was formed with a thickness of 40 nm as an electron transport layer. In addition, lithium fluoride (LiF) was formed with a thickness of 1 nm as an electron injection layer on the electron transport layer. Finally, aluminum (Al) was formed with a thickness of 70 nm as a cathode on the electron injection layer to produce an organic EL element.

Compounds used in Examples 1 to 14 and Comparative Examples 1 to 3 are shown in Table 2.

TABLE 2

| | Dopant | Host | Second host |
|---|---|---|---|
| Example 1 | 2-50 | 1-28 | — |
| Example 2 | 2-50 | 1-10 | — |
| Example 3 | 2-50 | 1-65 | — |
| Example 4 | 2-120 | 1-28 | — |
| Example 5 | 2-120 | 1-42 | — |
| Example 6 | 2-120 | 1-10 | — |
| Example 7 | 2-120 | 1-65 | — |
| Example 8 | 2-91 | 1-28 | — |
| Example 9 | 2-91 | 1-10 | — |
| Example 10 | 2-91 | 1-65 | — |
| Example 11 | 2-120 | 1-10 | 1-42 |
| Example 12 | 2-178 | 1-28 | — |
| Example 13 | 2-178 | 1-10 | — |
| Example 14 | 2-178 | 1-65 | — |
| Comparative Example 1 | 2-50 | mCP | — |
| Comparative Example 2 | 2-120 | mCP | — |
| Comparative Example 3 | D-1 | 1-28 | — |

The emission spectrum maximal wavelength, external quantum efficiency (EQE), voltage, and element lifespan of the produced organic EL elements are shown in Table 3. The maximal wavelength, EQE, and voltage were values when the drive current density was 2.5 mA/cm$^2$, and were initial characteristics. The lifespan was a time until the brightness attenuated to 95% of the initial brightness at a constant current density of 2.5 mA/cm$^2$.

TABLE 3

| | Maximum emission wavelength (nm) | EQE (%) | Voltage (V) | Lifespan (h) |
|---|---|---|---|---|
| Example 1 | 505 | 8.0 | 3.9 | 57 |
| Example 2 | 505 | 9.1 | 4.2 | 75 |
| Example 3 | 505 | 9.3 | 4.4 | 80 |
| Example 4 | 470 | 12.0 | 3.7 | 101 |
| Example 5 | 470 | 13.2 | 3.9 | 99 |
| Example 6 | 470 | 14.8 | 4.0 | 130 |
| Example 7 | 470 | 13.0 | 4.1 | 135 |
| Example 8 | 485 | 11.9 | 3.9 | 85 |
| Example 9 | 485 | 14.0 | 4.0 | 123 |
| Example 10 | 485 | 13.1 | 4.1 | 110 |
| Example 11 | 470 | 14.9 | 4.1 | 151 |
| Example 12 | 500 | 16.0 | 4.0 | 105 |
| Example 13 | 500 | 19.9 | 4.1 | 144 |
| Example 14 | 500 | 19.2 | 4.3 | 139 |
| Comparative Example 1 | 505 | 6.0 | 5.5 | 12 |
| Comparative Example 2 | 470 | 8.4 | 5.2 | 20 |
| Comparative Example 3 | 525 | 11.4 | 4.8 | 35 |

Based on Table 3, it can be understood that Examples 1 to 14 in which the host represented by formula (1) and the dopant represented by formula (2) were used for the light-emitting layer had higher luminous efficiency and more excellent lifespan characteristics than Comparative Examples 1 and 2 in which mCP generally used as a host was used. In addition, it can be understood that Examples 1 to 14 in which the host represented by formula (1) and the dopant represented by formula (2) were used for the light-emitting layer had more excellent lifespan characteristics than Comparative Example 3 in which a cyanobenzene compound was used for a dopant.

INDUSTRIAL APPLICABILITY

The organic EL element of the present invention is an organic EL element having high luminous efficiency and a prolonged lifespan.

REFERENCE SIGNS LIST

1 Substrate
2 Anode
3 Hole injection layer
4 Hole transport layer
5 Light-emitting layer
6 Electron transport layer
7 Cathode

The invention claimed is:

1. An organic electroluminescent element comprising:
an anode, a cathode, the anode and the cathode facing each other, and one or more light-emitting layers disposed between the anode and the cathode, wherein
at least one light-emitting layer contains a host material represented by formula (1) and a thermally activated delayed fluorescence material represented by formula (2):

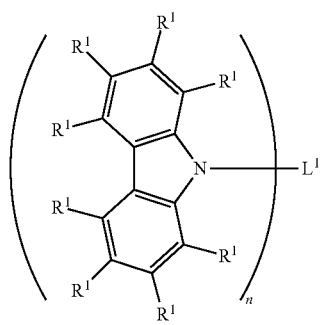

(1)

wherein, $L^1$ represents a substituted or unsubstituted aromatic hydrocarbon group having 6 to 30 carbon atoms, a substituted or unsubstituted aromatic heterocyclic group having 3 to 36 carbon atoms, a substituted or unsubstituted carborane group, or a linked ring group formed by linking any 2 to 6 rings selected from among rings of such an aromatic hydrocarbon group, aromatic heterocyclic group, and carborane group; $R^1$'s each independently represent a hydrogen atom, an aliphatic hydrocarbon group having 1 to 8 carbon atoms, a substituted or unsubstituted aromatic hydrocarbon group having 6 to 30 carbon atoms, a substituted or unsubstituted aromatic heterocyclic group having 3 to 36 carbon atoms, a substituted or unsubstituted carborane group, or a linked ring group formed by linking 2 or 3 rings of such an aromatic hydrocarbon group, aromatic heterocyclic group, or carborane group, and at least one $R^1$ is a substituted or unsubstituted carbazolyl group; and n represents an integer of 1 to 2:

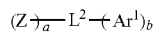

(2)

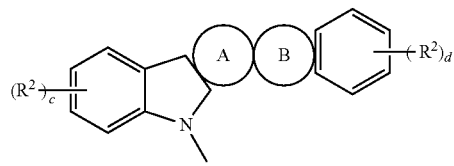

(2a)

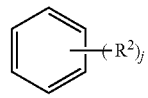

(2b)

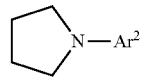

(2c)

wherein, Z is a group represented by formula (2a), and in formula (2a), the ring A is an aromatic hydrocarbon ring represented by formula (2b), the ring B is a heterocycle represented by formula (2c), and the ring A and the ring B are each fused to an adjacent ring at any position; $L^2$ represents an aromatic hydrocarbon group having 6 to 30 carbon atoms or an aromatic heterocyclic group having 3 to 18 carbon atoms, and when a+b is 2, $L^2$ may be a single bond; $Ar^1$ and $Ar^2$ each independently represent a substituted or unsubstituted aromatic hydrocarbon group having 6 to 30 carbon atoms, a substituted or unsubstituted aromatic heterocyclic group having 3 to 18 carbon atoms, or a linked aromatic group formed by linking 2 to 6 aromatic rings of aromatic groups selected from among the aromatic hydrocarbon group and the aromatic heterocyclic group; $R^2$'s independently represent an aliphatic hydrocarbon group having 1 to 10 carbon atoms, a substituted or unsubstituted aromatic hydrocarbon group having 6 to 18 carbon atoms, a substituted or unsubstituted aromatic heterocyclic group having 3 to 18 carbon atoms, or a linked aromatic group formed by linking 2 or 3 aromatic rings of aromatic groups selected from among the aromatic hydrocarbon group and the aromatic heterocyclic group; and a represents an integer of 1 to 3, b represents an integer of 0 to 3, c and d independently represent an integer of 0 to 4, and j represents an integer of 0 to 2.

2. The organic electroluminescent element according to claim 1,
wherein, in formula (1), n=1.

3. The organic electroluminescent element according to claim 1,
wherein, in formula (1), $L^1$ is substituted or unsubstituted benzene, triazine, carbazole, dibenzofuran, dibenzothiophene, or carborane, or a group generated from a linked ring compound in which 2 or 3 of these are linked.

4. The organic electroluminescent element according to claim 1,
wherein formula (1) is represented by formula (3a) or (3b):

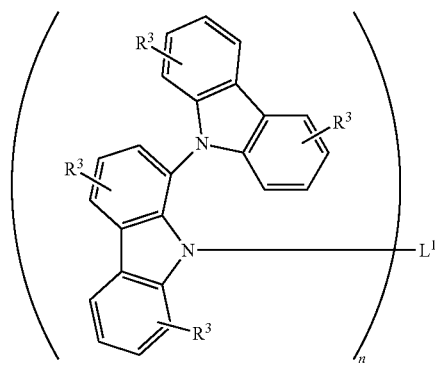

(3a)

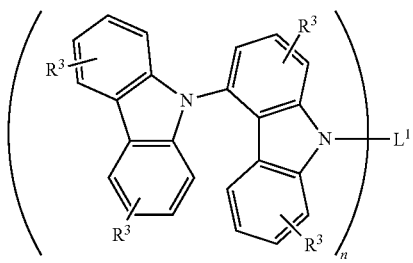

where $L^1$ and n are the same as those defined for formula (1), $R^3$ represents a hydrogen atom, a substituted or unsubstituted aromatic hydrocarbon group having 6 to 18 carbon atoms, or a substituted or unsubstituted aromatic heterocyclic group having 3 to 18 carbon atoms.

5. The organic electroluminescent element according to claim 4,
wherein a difference between an excited singlet energy (S1) and an excited triplet energy (T1) of a thermally activated delayed fluorescence material represented by formula (2) is 0.2 eV or less, and an excited triplet energy (T1) of the host material represented by formula (1) is larger than the excited singlet energy (S1) and the excited triplet energy (T1) of the thermally activated delayed fluorescence material represented by formula (2).

6. The organic electroluminescent element according to claim 1,
wherein, in formula (2), $L^2$ represents an aromatic hydrocarbon group having 6 carbon atoms.

7. The organic electroluminescent element according to claim 1,
wherein at least two kinds of host materials each represented by formula (1) are contained in the light-emitting layer.

8. The organic electroluminescent element according to claim 1,
wherein a difference between an excited singlet energy (S1) and an excited triplet energy (T1) of a thermally activated delayed fluorescence material represented by formula (2) is 0.2 eV or less, and an excited triplet energy (T1) of the host material represented by formula (1) is larger than the excited singlet energy (S1) and the excited triplet energy (T1) of the thermally activated delayed fluorescence material represented by formula (2).

* * * * *